United States Patent [19]
Watanabe et al.

[11] Patent Number: 5,548,252
[45] Date of Patent: Aug. 20, 1996

[54] DIGITAL TEMPERATURE COMPENSATED CRYSTAL OSCILLATOR

[75] Inventors: Takao Watanabe; Mutsuo Hayashi; Kazunari Matsumoto, all of Tokyo; Chikara Tsuchiya; Takashi Matsui, both of Kawasaki; Masaru Matsubayashi, Tokyo, all of Japan

[73] Assignees: Kabushiki Kaisha Meidensha, Tokyo; Fujitsu Limited, Kawasaki, both of Japan

[21] Appl. No.: 350,965

[22] Filed: Dec. 7, 1994

[30] Foreign Application Priority Data

| Dec. 7, 1993 | [JP] | Japan | 5-306166 |
| Dec. 7, 1993 | [JP] | Japan | 5-306168 |
| Dec. 8, 1993 | [JP] | Japan | 5-306925 |
| Jun. 10, 1994 | [JP] | Japan | 6-128412 |

[51] Int. Cl.[6] .............. H03B 5/04; H03B 5/06; H03B 5/36; H03L 1/02
[52] U.S. Cl. ............... 331/176; 331/36 C; 331/116 FE; 331/158; 331/173; 331/177 V
[58] Field of Search ................ 331/1 A, 8, 17, 331/18, 25, 36 C, 66, 69, 116 R, 116 FE, 158, 173, 176, 177 V; 310/315

[56] References Cited

U.S. PATENT DOCUMENTS

| 4,196,404 | 4/1980 | Ebihara | 331/116 FE |
| 4,218,661 | 8/1980 | Imamura | 331/116 FE |
| 4,282,496 | 8/1981 | Heuner | 331/116 FE |
| 4,378,534 | 3/1983 | Goedken et al. | 331/177 V X |
| 4,387,350 | 6/1983 | Bessolo et al. | 331/116 FE |
| 4,550,293 | 10/1985 | Driscoll | 331/177 V X |
| 4,611,181 | 9/1986 | Fukumura et al. | 331/66 |
| 4,746,879 | 5/1988 | Ma et al. | 331/116 FE X |
| 4,814,640 | 3/1989 | Miyake | 331/116 FE X |
| 4,827,226 | 5/1989 | Connell | 331/116 FE |
| 4,851,792 | 7/1989 | Ochiai et al. | 331/66 X |
| 4,864,255 | 9/1989 | Yoshida | 331/116 FE X |
| 4,956,618 | 9/1990 | Ulmer | 331/116 FE |
| 5,126,699 | 6/1992 | Kabler | 331/66 X |
| 5,170,136 | 12/1992 | Yamakawa et al. | 331/176 |

FOREIGN PATENT DOCUMENTS

| 2469823 | 5/1981 | France . |
| WO-A-9016113 | 12/1990 | WIPO . |

OTHER PUBLICATIONS

Patent Abstracts of Japan, vol. 016, No. 326, (E–1235), Jul. 16, 1992.

*Primary Examiner*—David Mis
*Attorney, Agent, or Firm*—Foley & Lardner

[57] ABSTRACT

A digital control system such as a digital temperature compensated crystal oscillator (DTCXO) system is arranged to offer superior oscillating performance with reduced size and cost. For example, to reduce the memory capacity, a memory 31 receives upper 6 bits of temperature data, and a decoder 32 calculates temperature compensation data from lower 4 bits and output data from the memory (FIGS. 1–11). For a one-chip configuration and low power consumption, a MOS type Colpitts oscillator (FIG. 16) is provided with a circuit for adjusting the source resistance of the MOS. For size reduction and fine frequency adjustment, a DTCXO is provided with sections such as an adder 341, an up-down counter 342 and an auxiliary frequency control section (AFC) 332 (FIGS. 20, 21, 24 and 25). An adding section 415 is provided between a D/A converting section 414 and a capacitance varying section 416 to obtain superior linearity with respect to a control voltage and quality of offset.

45 Claims, 33 Drawing Sheets

CHARACTERISTIC
BEFORE COMPENSATION

FIG.9A
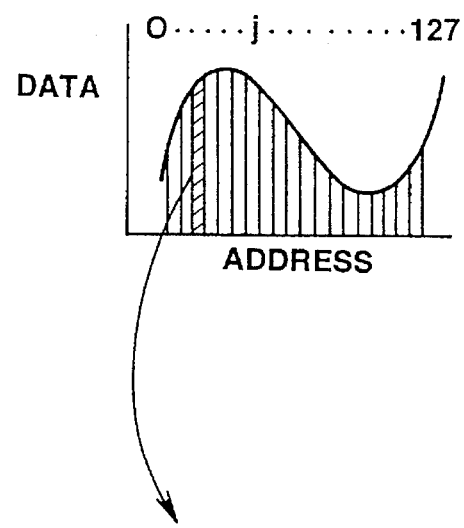
FIG.9B
FIG.12
TABLE I-3
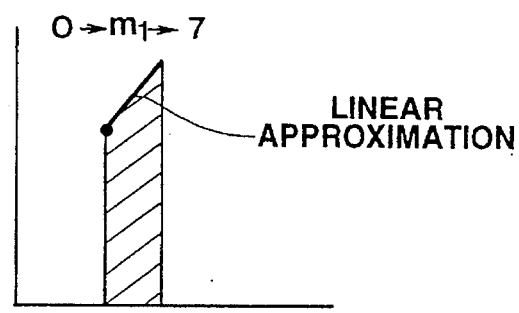
| j | $A_1(j)$ |
|---|---|
| 00 | 001100 |
| 01 | 001011 |
| 02 | 001011 |
| 03 | |
| ⌇ | |
| 3C | 000100 |
| 3D | 000111 |
| 3E | 000111 |
| 3F | 000111 |

FIG. 10

TABLE I - 1 V TABLE OF ORIGINAL TEMPERATURE COMPENSATION DATA

| ↓j \ →k | +0 | +1 | +2 | +3 | +4 | +5 | +6 | +7 | +8 | +9 | +A | +B | +C | +D | +E | +F |
|---|---|---|---|---|---|---|---|---|---|---|---|---|---|---|---|---|
| 00 | 01B | 022 | 028 | 02E | 034 | 03B | 041 | 047 | 04D | 053 | 05A | 060 | 066 | 06C | 072 | 078 |
| 01 | 07E | 084 | 08A | 08F | 095 | 09B | 0A1 | 0A7 | 0AC | 0B2 | 0B8 | 0BD | 0C3 | 0C9 | 0CE | 0D4 |
| 02 | 0D9 | 0DF | 0E4 | 0EA | 0EF | 0F4 | 0FA | 0FF | 104 | 10A | 10F | 114 | 119 | 11E | 123 | 129 |
| 03 | 12E | 133 | 138 | 13D | 142 | 147 | 14C | 150 | 155 | 15A | 15F | 164 | 169 | 16D | 172 | 177 |
| 04 | 17B | 180 | 185 | 189 | 18E | 192 | 197 | 19B | 1A0 | 1A4 | 1A9 | 1AD | 1B1 | 1B6 | 1BA | 1BE |
| 05 | 1C3 | 1C7 | 1CB | 1CF | 1D3 | 1D8 | 1DC | 1E0 | 1E4 | 1E8 | 1EC | 1F0 | 1F4 | 1F8 | 1FC | 200 |
| 06 | 204 | 207 | 20B | 20F | 213 | 217 | 21A | 21E | 222 | 225 | 229 | 22D | 230 | 234 | 237 | 23B |
| 07 | 23E | 242 | 245 | 249 | 24C | 250 | 253 | 256 | 25A | 25D | 260 | 263 | 267 | 26A | 26D | 270 |
| 39 | 19D | 19E | 1A0 | 1A2 | 1A3 | 1A5 | 1A7 | 1A9 | 1AA | 1AC | 1AE | 1B0 | 1B2 | 1B3 | 1B5 | 1B7 |
| 3A | 1B9 | 1BB | 1BD | ABF | 1C1 | 1C3 | 1C5 | 1C7 | 1C9 | 1CB | 1CD | 1CF | 1D1 | 1D4 | 1D6 | 1D8 |
| 3B | 1DA | 1DC | 1DF | AE1 | 1E3 | 1E6 | 1E8 | 1EA | 1ED | 1EF | 1F1 | 1F4 | 1F6 | 1F9 | 1FB | 1FE |
| 3C | 200 | 203 | 206 | 208 | 20B | 20D | 210 | 213 | 215 | 218 | 21B | 21E | 221 | 223 | 226 | 229 |
| 3D | 22C | 22F | 232 | 235 | 238 | 23B | 23E | 241 | 244 | 247 | 24A | 24D | 250 | 253 | 257 | 25A |
| 3E | 25D | 260 | 264 | 267 | 26A | 26E | 271 | 274 | 278 | 27B | 27F | 282 | 286 | 289 | 28D | 290 |
| 3F | 294 | 297 | 29B | 29F | 2A2 | 2A6 | 2AA | 2AE | 2B1 | 2B5 | 2B9 | 2BD | 2C1 | 2C5 | 2C9 | 2CD |

FIG.11

TABLE I-2  CONVERSION TO ROM DATA

| | | HEXADECIMAL REPRESENTATION | | ROM DATA BINARY REPRESENTATION | | | |
|---|---|---|---|---|---|---|---|
| j | DT(j) | U(j,k) | | DT(j) | S(j) | A(j) | B(j,k) |
| 0 | : 01B | +7+6+6+6+7+6+6+6+6+6+6+6 | → | 0000011011 | 0 | 000110 | 1000100001000000 |
| 1 | : 07E | +6+6+5+6+6+6+5+6+6+6+5+6 | → | 0001111110 | 0 | 000101 | 1101110110101101 |
| 2 | : 0D9 | +6+5+6+5+6+5+5+6+5+5+5+6 | → | 0011011001 | 0 | 000101 | 1010010010000001 |
| 3 | : 12E | +5+5+5+5+5+4+5+5+5+4+5+5 | → | 0100101110 | 0 | 000100 | 1111110111111011 |
| 4 | : 17B | +5+5+4+5+4+5+4+4+5+4+4+4 | → | 0101111011 | 0 | 000100 | 1101010101100100 |
| 5 | : 1C3 | +4+4+4+4+5+4+4+4+4+4+4+4 | → | 0111000011 | 0 | 000100 | 0001000000000000 |
| 6 | : 204 | +3+4+4+4+4+4+3+4+4+4+3+4 | → | 1000000100 | 0 | 000011 | 0111011011010101 |
| 7 | : 23E | +4+3+4+3+4+3+3+4+3+3+3+3 | → | 1000111110 | 0 | 000011 | 1010100010001000 |
| ... | | | ⌒ | | | | |
| 39 | : 19D | +1+2+2+1+2+2+2+2+2+1+2+2 | → | 0110011101 | 0 | 000001 | 0110111011111011 |
| 3A | : 1B9 | +2+2+2+2+2+2+2+2+2+3+2+2 | → | 0110111001 | 0 | 000010 | 0000000000000100 |
| 3B | : 1DA | +2+3+2+2+3+2+2+3+2+3+2+3 | → | 0111011010 | 0 | 000010 | 0100010010010101 |
| 3C | : 20D | +3+3+3+2+3+3+3+3+2+3+3+3 | → | 1000000000 | 0 | 000010 | 1101011011111011 |
| 3D | : 22C | +3+3+3+3+3+3+3+3+3+4+3+3 | → | 1000101100 | 0 | 000011 | 0000000000000010 |
| 3E | : 25D | +3+4+3+4+3+4+4+3+4+3+4+3 | → | 1001011101 | 0 | 000011 | 0100100101010110 |
| 3F | : 294 | +3+4+4+4+4+4+4+4+3+4+4+4 | → | 1010010100 | 0 | 000011 | 0110111011111111 |

CHARACTERISTIC OF MOS

FIG.30

| | DURING DAC | COMPLETION OF DAC | IMMEDIATELY BEFORE DAC | AFC (FREQUENCY UP) | AFC (FREQUENCY DOWN) |
|---|---|---|---|---|---|
| SW1 | ON/OFF | ON | ON | ON/OFF | ON/OFF |
| SW2 | OFF/ON | OFF | OFF | OFF/ON | OFF/ON |
| SW3 | OFF | OFF | ON | OFF | OFF |
| SW4 | OFF | ON | OFF | ON | ON |
| SW5 | ON | ON | ON | OFF | ON |
| SW6 | OFF | OFF | OFF | ON | OFF |

INCREMENT ←     DECREMENT ←

FIG.42

TABLE IV - 1

| $\Delta f / f$ | | $V_i$ |
|---|---|---|
| − | −3ppm | $V_1$=0.85volt |
| 0 | 0 | $V_0$=1.85volt |
| + | +3ppm | $V_2$=2.85volt |

DIGITAL TEMPERATURE COMPENSATED CRYSTAL OSCILLATOR

BACKGROUND OF THE INVENTION

The present invention relates to a digital control system and a digital temperature compensated crystal oscillator (DTCXO).

Recent advances in IC technology promote size reduction and cost reduction in equipment for mobile communication such as devices or telephone sets for portable, mobile and cordless 0 telephone systems. This progress increases the number of subscribers and users of the radio communication systems, and the carrier frequency spacing (12.5 KHz, for example) and the modulation band width (5 KHz, for example) are decreased. Therefore, a source of oscillation frequency is required to fulfill a severe requirement of the frequency stability. For example, the frequency stability must be equal to or lower than 1 ppm; $|\Delta f/f| \leq 1$ ppm.

In a conventional TCXO (temperature compensated crystal oscillator), a temperature compensating network having a thermistor, a resistor and a capacitor is connected in series to a crystal unit, and designed to hold the output frequency approximately constant notwithstanding changes in the temperature of the environment by controlling the impedance of the circuit. This oscillator can be constituted by uncostly analog component parts, but its production process is not easy when a unit to unit variation of each component is taken into account. Specifically when the demand for the frequency stability is changing from a conventional level of ±2.5 ppm to a recent level of ±1.0 ppm with the recent trend toward a narrower radio frequency channel spacing, it is becoming more difficult to meet the requirement of a high precision level with the conventional analog type TCXO design.

On the other hand, there is known a digital temperature compensated crystal oscillator (DTCXO) composed of a temperature sensor, an A/D converter, a memory section, a D/A converter and a voltage controlled crystal oscillator (VCXO). Data for temperature compensation fitted to the frequency-temperature characteristic of the VCXO is preliminarily stored (or programmed) in the memory such as a ROM. A control voltage is determined from the stored data in accordance with the sensed temperature of the surroundings, and applied to the VCXO to hold the output frequency constant. Without the need for complicated combination of component parts as in the analog type TCXO, the DTCXO is suitable for large scale integration (LSI) and automatic production, and promising for size reduction and cost reduction.

SUMMARY OF THE INVENTION

It is an object of the present invention to improve a digital control system or circuit which is usable for a digital temperature compensated crystal oscillator (DTCXO) system and which is advantageous in size reduction, cost reduction and precision.

It is another object of the present invention to provide a digital control system (or circuit) or digital temperature compensated crystal oscillator system (or circuit) which is advantageous specifically in memory capacity for storing data such as temperature compensation data.

It is still another object of the present invention to provide o a digital temperature compensated crystal oscillator system (or circuit) which is advantageous in power consumption and which is suitable for one-chip configuration.

It is still another object of the present invention to provide a digital temperature compensated crystal oscillator system (or circuit) which is advantageous in size reduction and cost reduction and which enables fine frequency adjustment.

It is still another object of the present invention to provide a digital temperature compensated crystal oscillator system (or circuit) which is advantageous in linearity in characteristic with respect to a control voltage, and quality of offset, and which is capable of permitting continuation of the temperature compensation.

According to a first aspect of the present invention, a digital control system (or circuit) comprises;

an analog-to-digital converting means for converting an analog input signal into a digital input signal;

a data supplying means for storing information items, receiving said digital input signal and producing a digital output information signal representing a selected information item selected in accordance with said digital input signal; and a digital-to-analog converting means for converting said digital output information signal into an analog output information signal;

wherein said digital input signal supplied from said analog-to-digital converting means to said data supplying means is divided into a first signal portion and a second signal portion;

wherein said data supplying means comprises a storage device which stores a plurality of data sets each of which is identified by said first signal portion of said digital input signal, which receives said first signal portion, as an address input signal, from said analog-to-digital converting means, and provides a selected data set specified by said signal portion; and wherein said data supplying means further comprises a decoding means for receiving said selected data set from said storage device, further receiving said second signal portion of said digital input signal, and producing said information output signal in accordance with said selected data item and said second signal portion of said digital input signal.

According to a second aspect of the present invention, a digital temperature compensated crystal oscillator circuit (or system) comprises:

a Colpitts oscillator circuit comprising an active device such as a transistor (a MOS, for example), and a first resistor, such as a source resistor, which is connected with said active device (and which may be connected between said active device and a ground);

a temperature compensating means for varying a feedback capacitance of said oscillator circuit;

a first series circuit which is connected in parallel to said first resistor and which comprises a second resistor and a first switching element (or first semiconductor switch); and a current control means for turning on said switching element when electric power is supplied, and for turning off said switching element at the end of a predetermined time interval.

According to a third aspect of the present invention, a DTCXO system (or circuit) comprises:

a digital temperature compensation data generating means for generating a digital temperature compensation data signal representing a magnitude of a temperature compensation quantity which is a function of a sensed temperature; and a digital-to-analog converting means for converting said digital temperature compensation data signal to an analog temperature compensation data voltage signal; and a voltage controlled crystal oscillator for producing an output frequency which is varied in accordance with the analog temperature compensation data voltage signal.

The DTCXO system further comprises a temperature compensation data registering means for storing the magnitude of the digital temperature compensation data signal, an offset data registering means for storing a magnitude of an offset data signal, and an adding means for causing said digital-to-analog converting means to producing said analog compensation data voltage signal corresponding to a sum of said compensation data signal and said offset data signal.

The adding means may comprise a means for producing an input signal to said digital-to-analog converting means so that the input signal represents the sum of the compensation data signal and the offset data signal, or may comprise a means for controlling said digital-to-analog converting means so that the output signal of said digital-to-analog converting means represents the sum of the compensation data signal and the offset data signal. The offset data registering means may comprise an up/down counter or a register.

The DTCXO system according to the third aspect of the present invention may further comprises an auxiliary frequency controlling means for increasing and decreasing the magnitude of the offset signal.

According to a fourth aspect of the present invention, a digital temperature compensated crystal oscillator system (or circuit) comprises:

an oscillating means which is connected with a crystal unit and which provides an output voltage of a constant output frequency;

a digital temperature compensation data generating means for sensing an ambient temperature of said crystal unit, and producing a digital compensation data signal in accordance with the temperature;

a digital-to-analog converting means for converting said digital compensation data signal to an analog compensation data voltage signal Vc; and a capacitance varying means for varying a capacitance in accordance with said analog temperature compensation data voltage signal to hold said output frequency of said crystal oscillating section constant independent of changes in the ambient temperature;

wherein said temperature compensated crystal oscillator system further comprises an adding means for receiving said analog compensation data voltage signal from said digital-to-analog converting means, and an additional voltage signal, and producing a sum voltage signal by adding said compensation data voltage signal and said additional voltage signal, and supplying said sum voltage signal to said capacitance varying section as a control voltage for varying the capacitance.

BRIEF DESCRIPTION OF THE DRAWINGS

FIG. 9A is a graph showing a characteristic of temperature compensation data which is divided into a plurality of sections (or blocks) in the third embodiment.

FIG. 9B is a graph showing one of the sections shown in FIG. 9A in the third embodiment.

FIG. 10 shows a table I-1 showing a collection of original temperature compensation data.

FIG. 11 shows a table I-2 showing a collection of temperature compensation data which is obtained by conversion from the original data and which can be used in the first embodiment.

FIG. 12 shows a table I-3 showing a collection of intermediate data A(j) which can be used in the second embodiment.

FIG. 30 is a table (III-1) showing on/off states of semiconductor switches shown in FIG. 29.

FIG. 42 is a table of a numerical example of the characteristic shown in FIG. 41.

DETAILED DESCRIPTION OF THE INVENTION

[I-i] First Embodiment shown in FIGS. 1–5, 10 and 11

Figure 8:
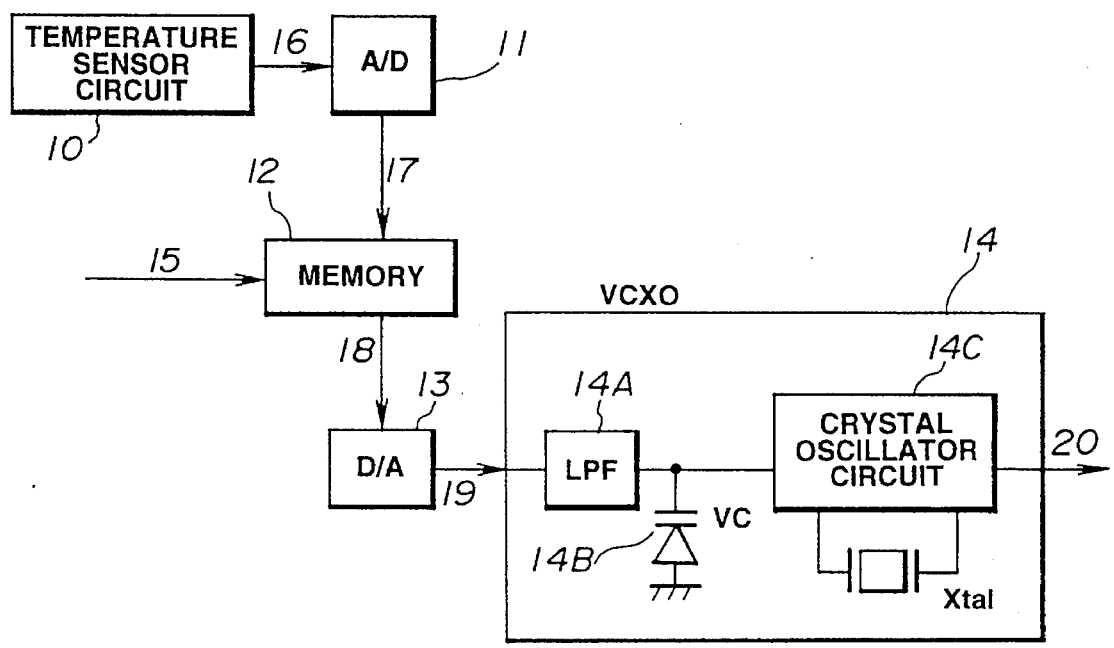
FIG. 8 is a block diagram showing a conventional system.

FIG. 8 shows a conventional digital temperature compensated crystal oscillator (DTCXO). This DTCXO system includes a temperature sensor circuit 10, an A/D converter 11, a memory section 12, a D/A converter 13, and a voltage controlled crystal oscillator (VCXO) 14. The temperature sensor circuit 10 senses an ambient temperature of a quartz crystal unit (Xtal) of the VCXO 14, and provides temperature information (analog voltage or current) 16. The A/D converter 11 converts the temperature information 16 into digital information 17. The memory section 12 is composed of a memory (ROM) such as $E^2$PROM, and the digital information 17 is supplied, as address, to the memory section 11. The memory section 12 stores control information (called temperature compensation data) corresponding to the frequency-temperature characteristic of the VCXO. The temperature compensation data 15 is preliminarily write into the memory section 12 at the time of production. Table I-1 shown in FIG. 10 is one example of the temperature compensation data (the contents of the memory). In Table I-1, 1024 data items {hexadecimal digits (hex)} are arranged in a j by k matrix with j columns and k rows, for the purpose of explanation. This collection of data items is represented graphically in FIG. 2 in the form of;

Address 10 bits Decimal 1024 (Hex 3FF)

Data 10 bits Decimal 1024 (Hex 3FF)

There are 1024 addresses, and each address location contains 10 bit data item.

The D/A converter 13 receives digital temperature compensation data 18 from the memory 12, and produces an analog voltage 19 at an output. The analog voltage 19 is supplied to the VCXO 14. The VCXO 14 is composed of a LPF 14A for smoothing the analog voltage 19, a varactor diode 14B for voltage-to-capacitance conversion, and a crystal oscillator circuit 14C.

In this DTCXO, the D/A converter 13 applies, to the VCXO 14, the voltage corresponding to the ambient temperature, and the VCXO 14 provides an output 20 of a constant frequency independent of the ambient temperature. The thus-constructed DTCXO does not require a complicated combination of components, and accordingly, the DTCXO is suitable for large-scale integration and automatic production process. As a result, the DTCXO is advantageous in size reduction and cost reduction.

However, there arise the following problems when the temperature compensation of Xtal is performed widely (30 ppm, for example) in a wide temperature range (−40° C.–85° C.) with the stability of a high precision level (±0.3 ppm, for example). (i) The sensitivity of the temperature sensor circuit 10 must be increased (about several times as high as the bit sensitivity of the A/D converter 11). (ii) The resolution of the A/D converter 11 must be increased (more than 10 bits to obtain 0.12° C./LSB, for example). (iii) The number of input bits of the D/A converter 13 must be increased (more than 10 bits to reach 0.03 ppm/LSB, for example). (iv) The capacity of the memory 12 must be increases For example, 10,240 bits {address (1024)×data (10 bits)=10,240 bits} are required, and when the data is treated with a unit of byte, about 2K bytes are required (1024×2= 2,048 bytes). (v) The amount of the memory data 15 (2K bytes) to be transferred and written into the memory is increased for production time. This problem imposes many restrictions on size reduction and cost reduction.

Figure 1:
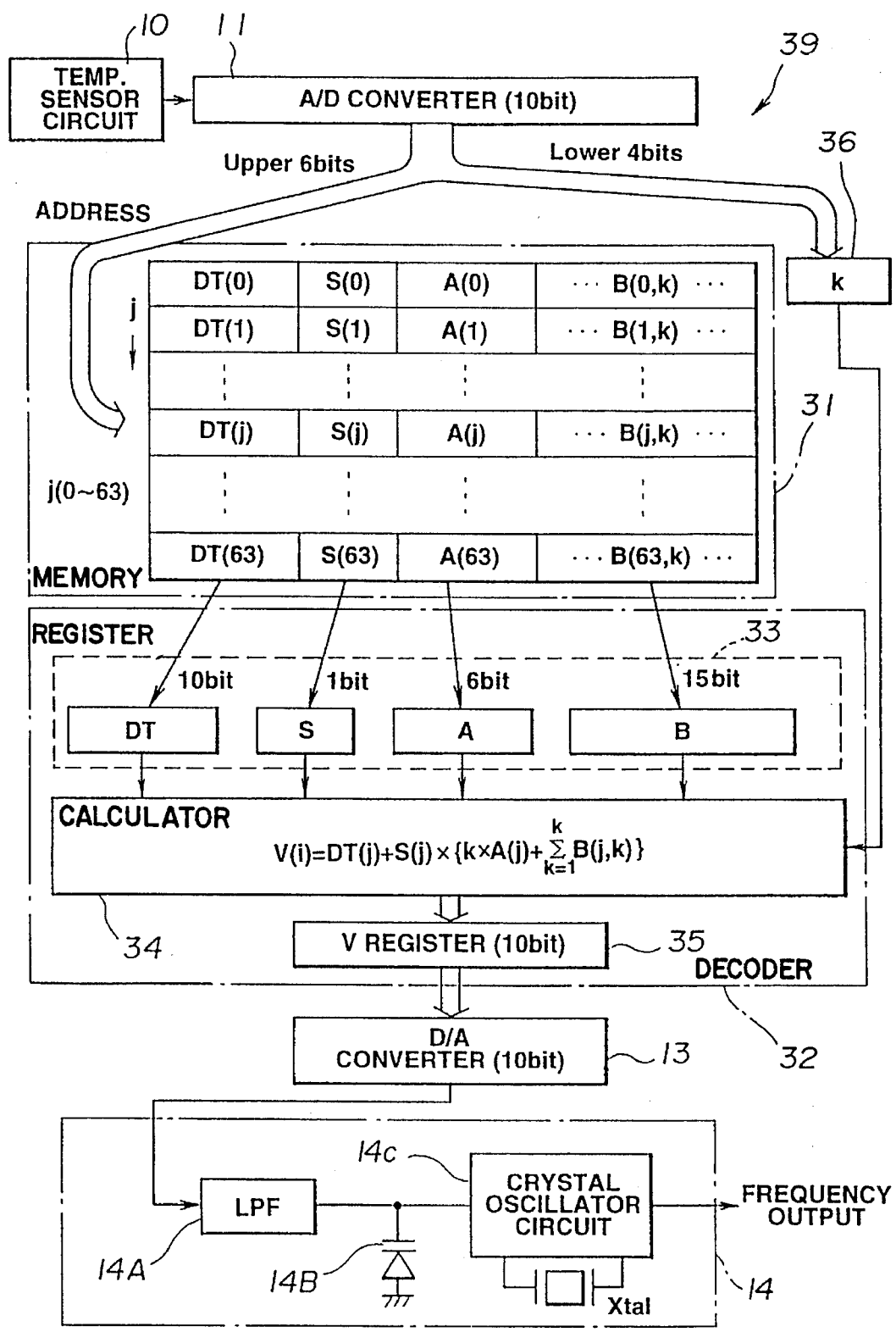
FIG. 1 is a schematic view showing a digital temperature compensated crystal oscillator system according to a first embodiment of the present invention.
Figure 2:
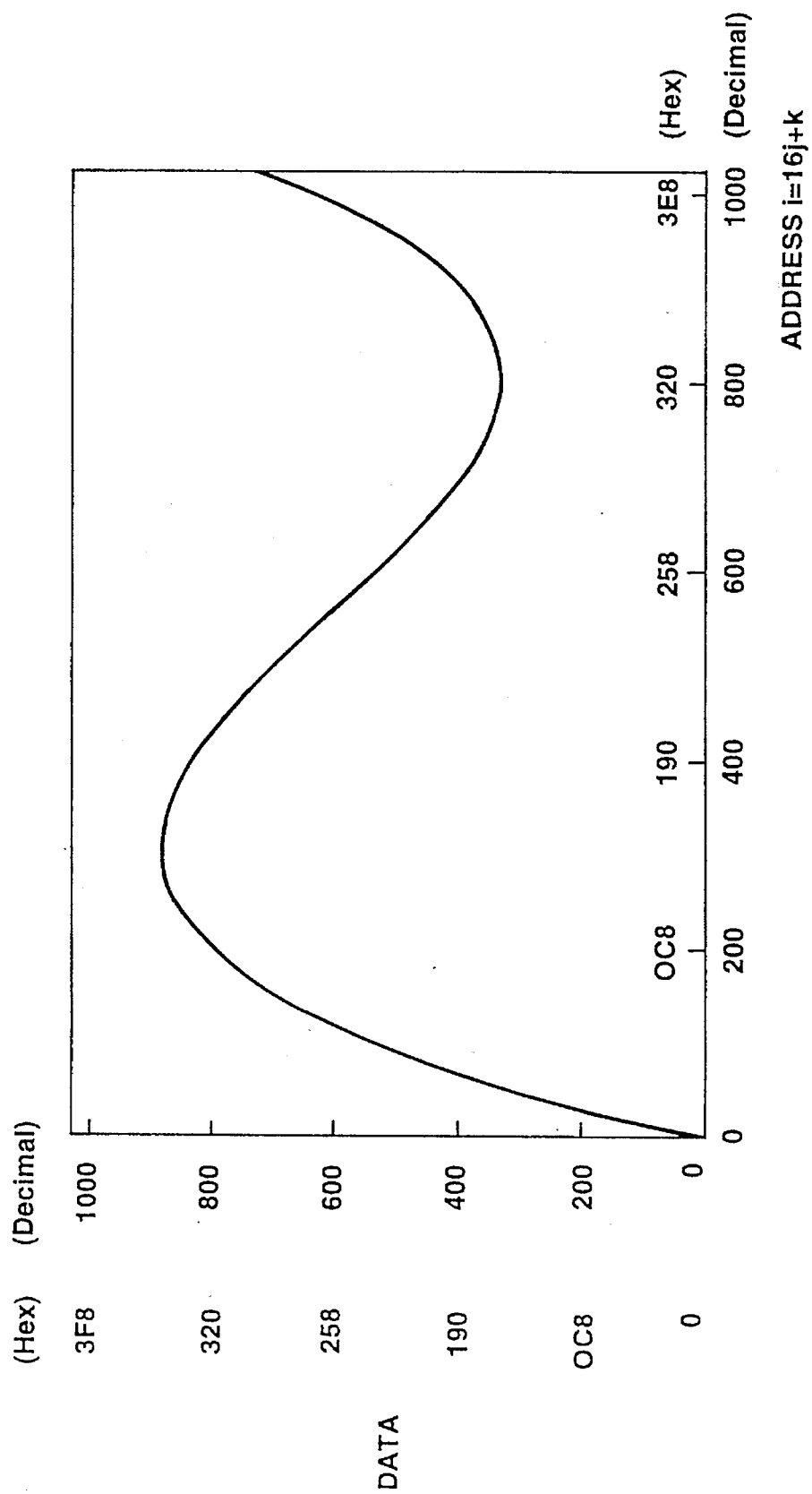
FIG. 2 is a graph showing a characteristic of temperature compensation data.

FIG. 1 shows a digital temperature compensated crystal oscillator system (or circuit) according to a first embodiment of the present invention. This oscillator system comprises a temperature sensor circuit 10, an analog-to-digital (A/D) converter 11, a memory section 31, a digital-to-analog (D/A) converter 13, and a voltage controlled crystal oscillator (VCXO) 14 as in the conventional system shown in FIG. 8. The system shown in FIG. 1 further comprise a decoder 32 interposed between the memory section 31 and the D/A converter 13, and a k register 36 (which can be also called an input data register or a parameter register). The decoder 32 of this example includes at least a register section 33, a calculating (arithmetic) section 34, and a V data register (or output data register) 35. The register section 33 of this example consists of a DT data register, an S data register, an A data register and a B data register. In this example, the memory section 31, the k register 36 and the decoder 32 constitute a digital temperature compensation data supplying section 39 which is connected between the A/D converter 11 and the D/A converter 13. The digital data supplying section 39 receives a digital input signal from the A/D converter 11 and, delivers a digital output signal to the D/A converter 13.

The temperature sensor circuit 10 senses an ambient temperature of a crystal unit (Xtal) of the oscillator 14, and sends analog temperature information (an analog voltage or current) to the A/D converter 11 which, in this example, is a 10 bit A/D converter. The A/D converter 11 delivers p bit digital temperature information to the digital data supplying section 39. In this example, p is equal to 10, and the p bit digital temperature information is in the form of a string of 10 bits. The p bit information is divided into upper (higher order) q bits, and remaining lower (lower order) r bits. Each of p, q and r is the number of one or more bits, q is smaller than p, and r is equal to the difference (p–q) resulting from subtraction of q from p. In this example, the 10 bit temperature information is divided into upper six bits (q=6), and lower four bits (r=4). The upper q bits are supplied to the memory section 31 as an address signal. The lower r bits are sent, as a count (or parameter), to the k register 36 for retaining the count (or parameter) k.

Figure 3:
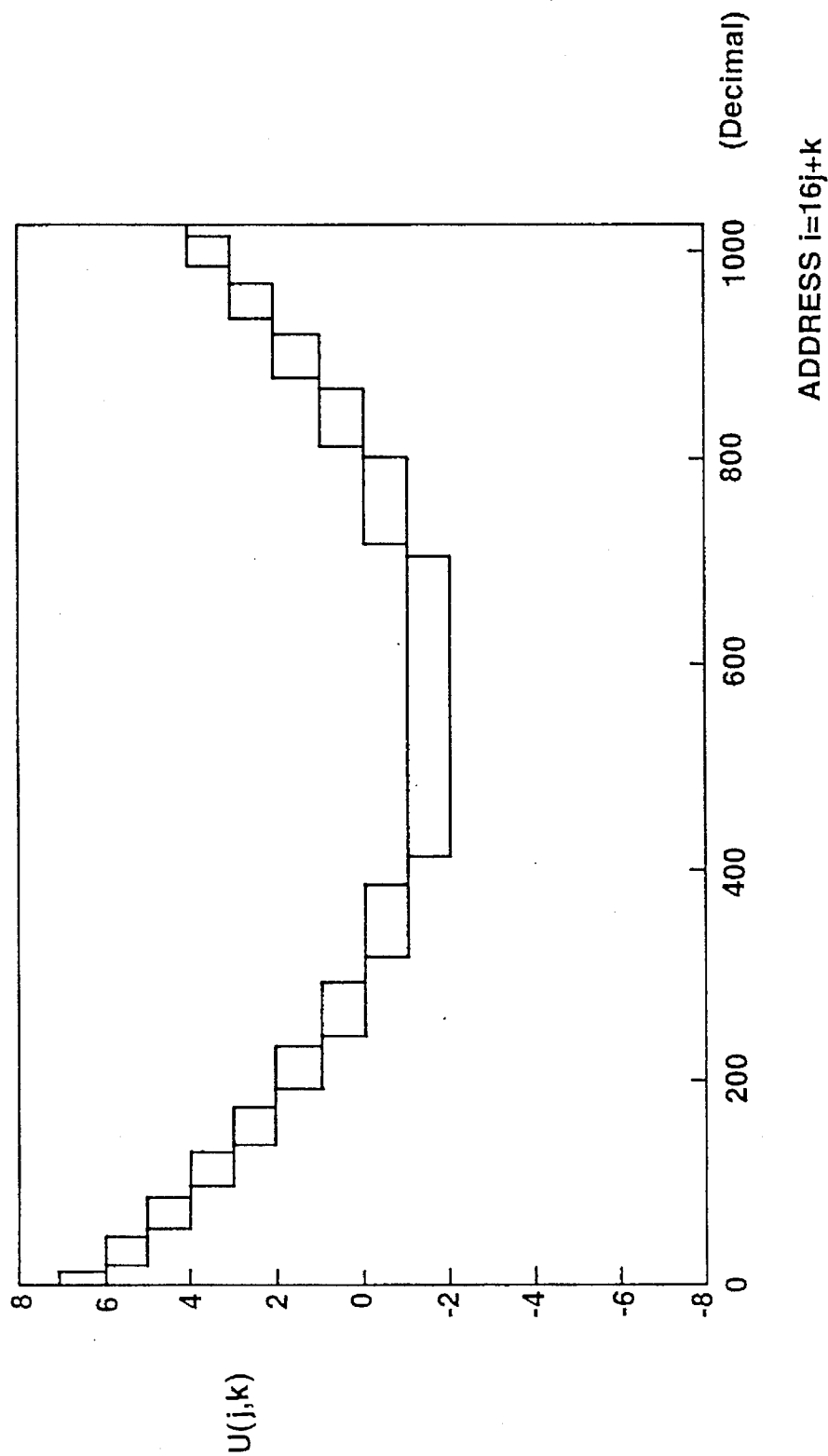
FIG. 3 is a graph showing a characteristic of difference data.

The memory section 31 of this example comprises a ROM which stores ROM data (or memory data) obtained by data conversion from Table I-1. The ROM data is obtained by calculating a difference U in a j block of a data matrix V(j, k) of Table I-1, with respect to k by using the following equation;

$$V(j, k)-V(j, k-1)=U(j, k),$$

provided that $k=1\sim15$. The calculation according to this equation yields numerical examples of U(j, k) as shown by the hexadecimal representation in Table I-2 of FIG. 11. In the left part of Table I-2, j is an address input for specifying one of data blocks, and DT(j) is a first (or leading) numerical value of the j block. FIG. 3 is a graphical representation of this U(j, k) data collection. In the example shown in Table 1-2 of FIG. 11, the first order difference data U(j, k) is shown in the form of a 64 by 15 matrix, and each column consists of 15 numerical elements each of which is equal to either of two numerical values which are different from each other or which are equal to each other. For example, each element in the first column of U(j, k) where j=0 is equal to either 6 or 7 (because the temperature range is divided into small sections, and a frequency change from one section to next is relatively small). This means that a second order difference is zero or one. Therefore, it is not necessary to cover a system in which the second order difference is equal to or greater than two, and the applicability is not limited.

Of the two numerical values of each column of U(j, k), the smaller one having the smaller absolute value is denoted by A(j), which is called slope (or gradient) data. The sign of the other one $\{\tilde{A}(j)\}$ which is not selected for A(j) is used for determining sign data S(j). The sign data S(j) is zero when the sign of $\tilde{A}(j)$ is plus, and one when the sign of $\tilde{A}(j)$ is minus. Furthermore, slope (or gradient) correction data B(j, k) is an absolute value of a second order difference of U(j, k), and is defined by the following equation;

$$B(j, k)=|U(j, k)-A(j)|,$$

provided that $k=1\sim15$. Since S(i) is used in common for both of A(j) and B(j, k) as in a later-mentioned equation (I-1), the sign data S(j) is used for the sign $\tilde{A}(j)$.

In this way, the original temperature compensation data is converted for data compression into the ROM data shown in Table I-2. The thus-obtained ROM data shown in a binary representation section of the right side of Table I-2 is stored in the ROM.

In this DTCXO system, there is further provided a control section, and the control procedure of the temperature compensation is performed periodically with a cycle of 1~10 sec, for example, under the command of the control section. When the control section produces a command signal, the A/D converter 11 is operated, and its output (10 bit temperature data) is determined. The lower 4 bits are inputted to the k register 36 and determines the k value (0~15). On the other hand, the upper 6 bits are supplied to the ROM as the address (j=0~63), and the data of the specified address is read out from the ROM.

In this example, the address input j in the form of the string of the upper 6 bits assumes one of 64 different values (0~63), and is used to select one of 64 addresses in the memory 31. Thus, one of the j blocks is specified by the string of the upper six bits of the 10 bit digital signal supplied from the A/D converter 11. The count (or parameter) k represented by the string of the lower 4 bits assumes one of 16 different values (0~15), and the value of k is temporarily stored in the k register 36.

In the j block specified by the address j of the upper 6 bits, the 10 bit reference data DT is supplied to, and temporarily stored in, the DT register of the register section 33 of the decoder 32. Similarly, the S register retains the 1 bit S data of the selected j block, the A register retains the 6 bit A data, and the B register retains the 15 bit B data.

The calculating (or arithmetic) section 34 receives the data of these intermediate data registers of the register section 33, and the value of the count (or parameter) k of the k (input) register 36. By using these input information signals, the calculating section 34 determines decoded temperature compensation data V(i) according to the following equation (I-1).

$$V(i) = DT(j) + S(j) \times \left\{ k \times A(j) + \sum_{k=1}^{k} B(j, k) \right\} \quad (I-1)$$

$$i = 16 \times j + k, j = 0\text{~}63, k = 0\text{~}15$$

In this way, the decoder 32 performs an operation of reverse conversion, and by so doing, decodes the data read out from the ROM in accordance with the upper q (=6) bits, by taking account of the k value of the lower r (=4) bits.

The result of the calculation is temporarily stored in the V register 35, and supplied to the D/A converter 13 which, in this example, a 10 bit converter.

Figure 4:
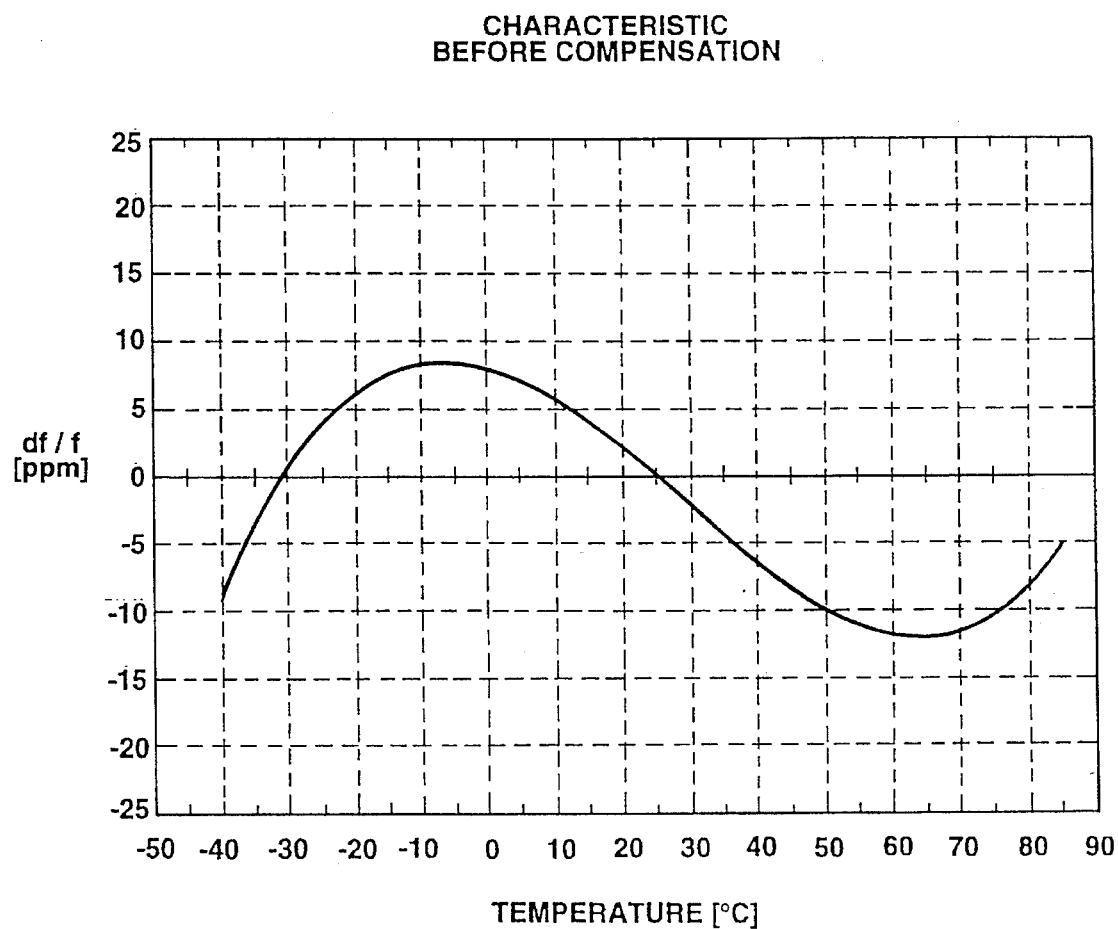
FIG. 4 is a graph showing a characteristic before compensation.
Figure 5:
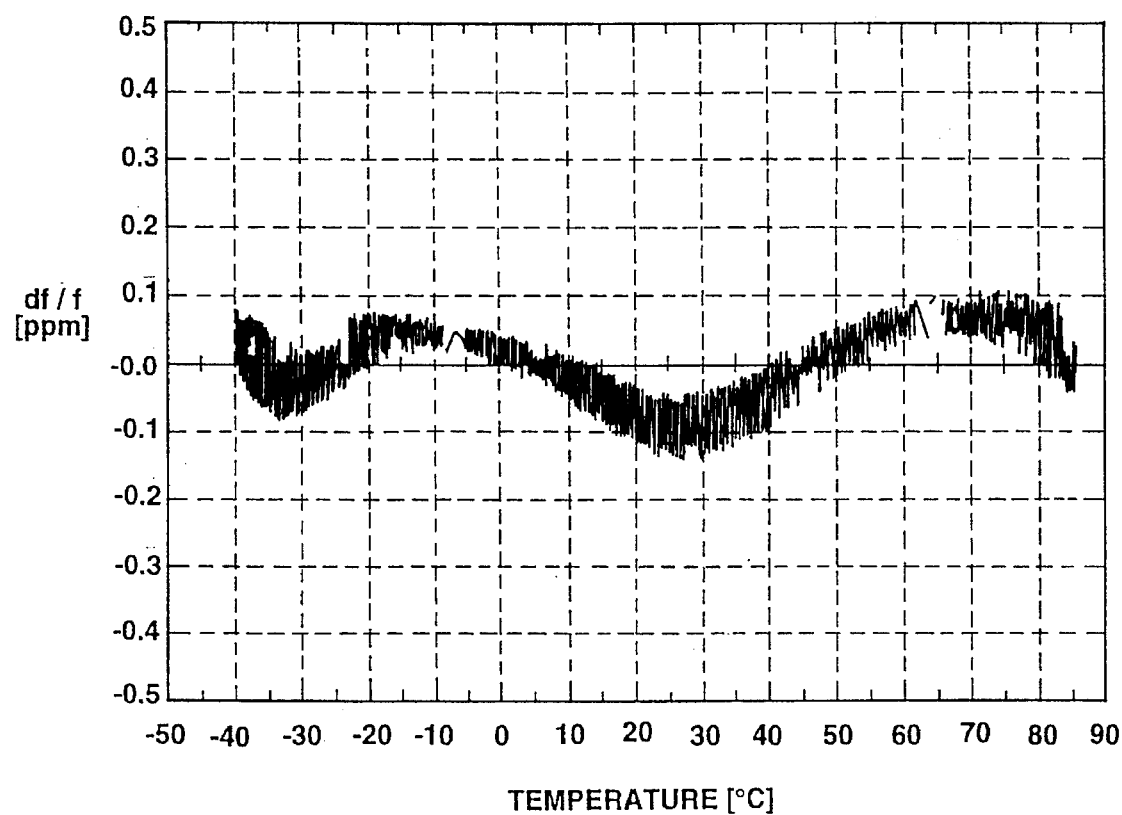
FIG. 5 is a graph showing a characteristic after compensation.

The decoder 32 may be a combination of a microcomputer and one or more registers, or may be a combination of one or more shift registers, one or more adder-subtractors and one or more registers. FIGS. 4 and 5 show simulation results of the decode data obtained by the decoder 32. FIG. 4 shows a characteristic before the compensation, and FIG. 5 shows a characteristic after the compensation (+0.1 ppm~ 0.13 ppm). This result is sufficiently better than the target level of ±0.3 ppm.

In this example, 6 bits are nominated for A(j). Practically, A(j) requires only four bits, and the upper two bits can be considered to be void. The data arrangement of the memory 31 of this example is illustrative, and it is optional to choose various other data arrangements.

In the case of 10 bit A/D and D/A converters, in general, a required memory capacity is 1024×1.25 bytes=1.28K bytes or more. In contrast to this the system according to the first embodiment of the invention requires a memory capacity of 64×4 bytes=256 bytes since it suffices to store 4 byte (32 bit) data for 64 j blocks when DT(j) is 10 bits, S(j) is one bit, A(j) is 6 bits and B(j, k) is 15 bits. The system of the first embodiment can reduce the required capacity to one fifth. Accordingly, the time required for introducing the data into the ROM is reduced to ⅕, and it is possible to reduce the time of the fabricating process. When, for example, the data transfer rate is 2400 bps, the system of the first embodiment can provide a rate of 256×(8/2400)=0.85 sec/piece whereas the rate of the conventional system is 1280×(8/2400)=4.27 sec/piece.

Figure 6:
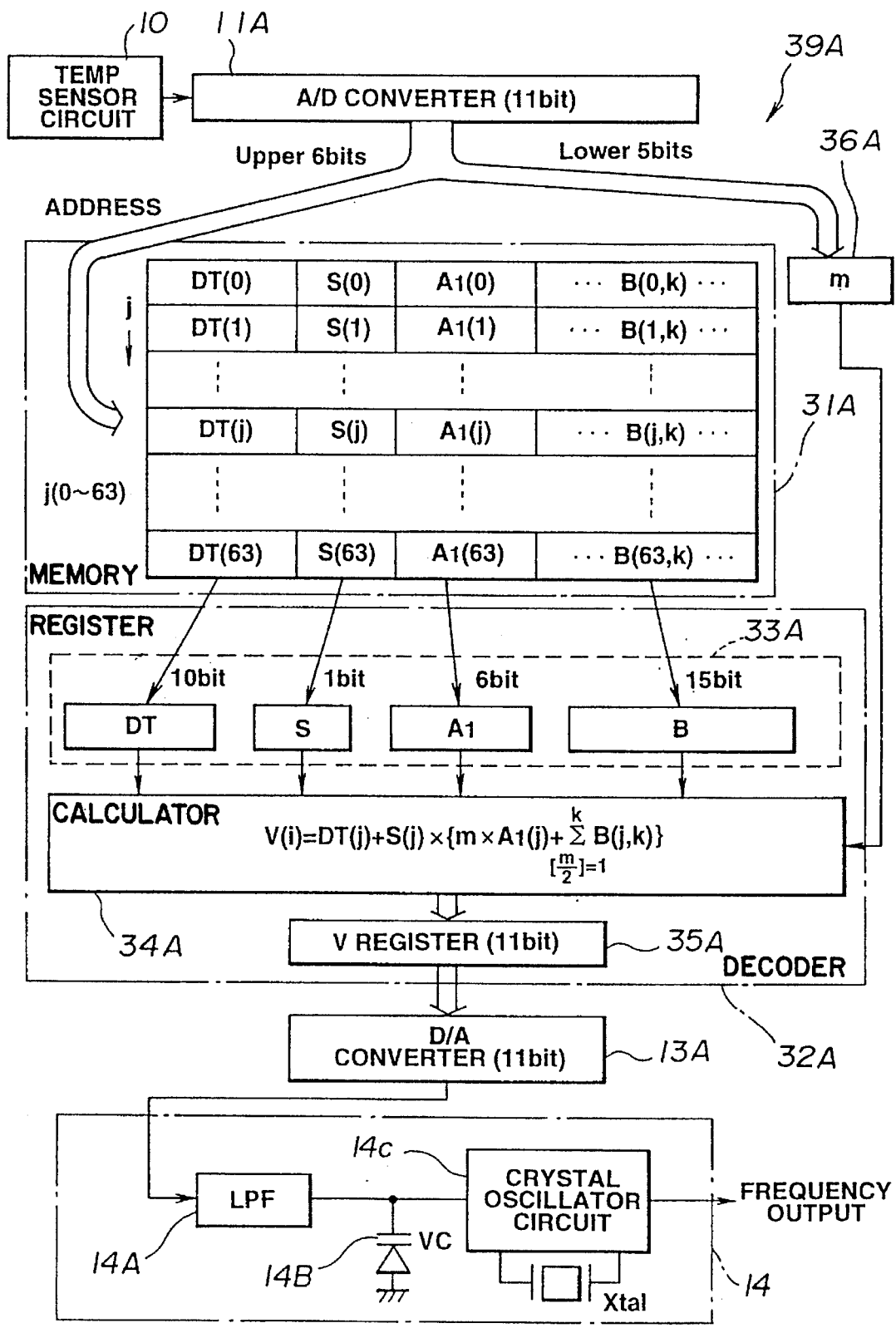
FIG. 6 is a schematic view showing a digital temperature compensated crystal oscillator system according to a second embodiment of the present invention.

[I-ii] Second Embodiment shown in FIGS. 6 and 12

FIG. 6 shows a digital temperature compensated crystal oscillator system according to a second embodiment of the present invention. This system comprises a digital temperature compensation data supplying section 39A which is interposed between an A/D converter 11A, and a D/A converter 13, and which comprises a memory section 31A, a decoder 32A and an m register 36A. The bit length of each of the A/D converter 11A, a V register 35A of the decoder 32A and the D/A converter 13A is 11 bits. That is, p is equal to 11 in the example shown in FIG. 6. The upper (higher order) six bits are supplied as the address input j, to the memory section 31A, as in the first embodiment. The lower (lower order) 5 bits are supplied, as a count (or parameter) m, to the m register 36A for temporarily storing a value of m (m=0~31). In this system of the second embodiment, the amount of the digital input information supplied to the compensation data supplying section 39A is doubled as compared with the system of the first embodiment, and accordingly the contents of A(j) are reduced to half, and referred to as $A_1(j)$. The data A(j) can be virtually expressed by four bits, as mentioned before. Therefore, the upper 4 bits of $A_1(j)$ are used as an integer part, and the lower 2 bits are used for a fractional part for describing at least one decimal place, to improve the precision. $A_1(j)$ is shown in Table I-3 of FIG. 12.

The decoder 32A shown in FIG. 6 comprises a register section 33A comprising a DT register, an S register, an $A_1$ register and a B register, a calculating section 34A and the above-mentioned 11 bit V register 35A. The calculating section 34A calculates V(i) by using the following decode equation (I-2):

$$V(i) = DT(j) + S(j) \times \left\{ m \times A_1(j) + \sum_{\left[\frac{m}{2}\right]=1}^{k} B(j,k) \right\} \quad (I-2)$$

$i = 16 \times j + m$
$j = 0~63, m = 0~31,$ $k = \left[\frac{m}{2}\right]$ ; 1~15, [ ] Gauss notation The amount of the ROM data is the same as that of the system of the first embodiment, but the bit length is increased by one. Therefore, from the characteristic before compensation shown in FIG. 4, the system of the second embodiment can provide a characteristic after compensation within a range of ±0.06 ppm, so that improvement of about 40% is achieved. Moreover, the system of the second embodiment can approximately double the effect explained in the first embodiment.

Figure 7:
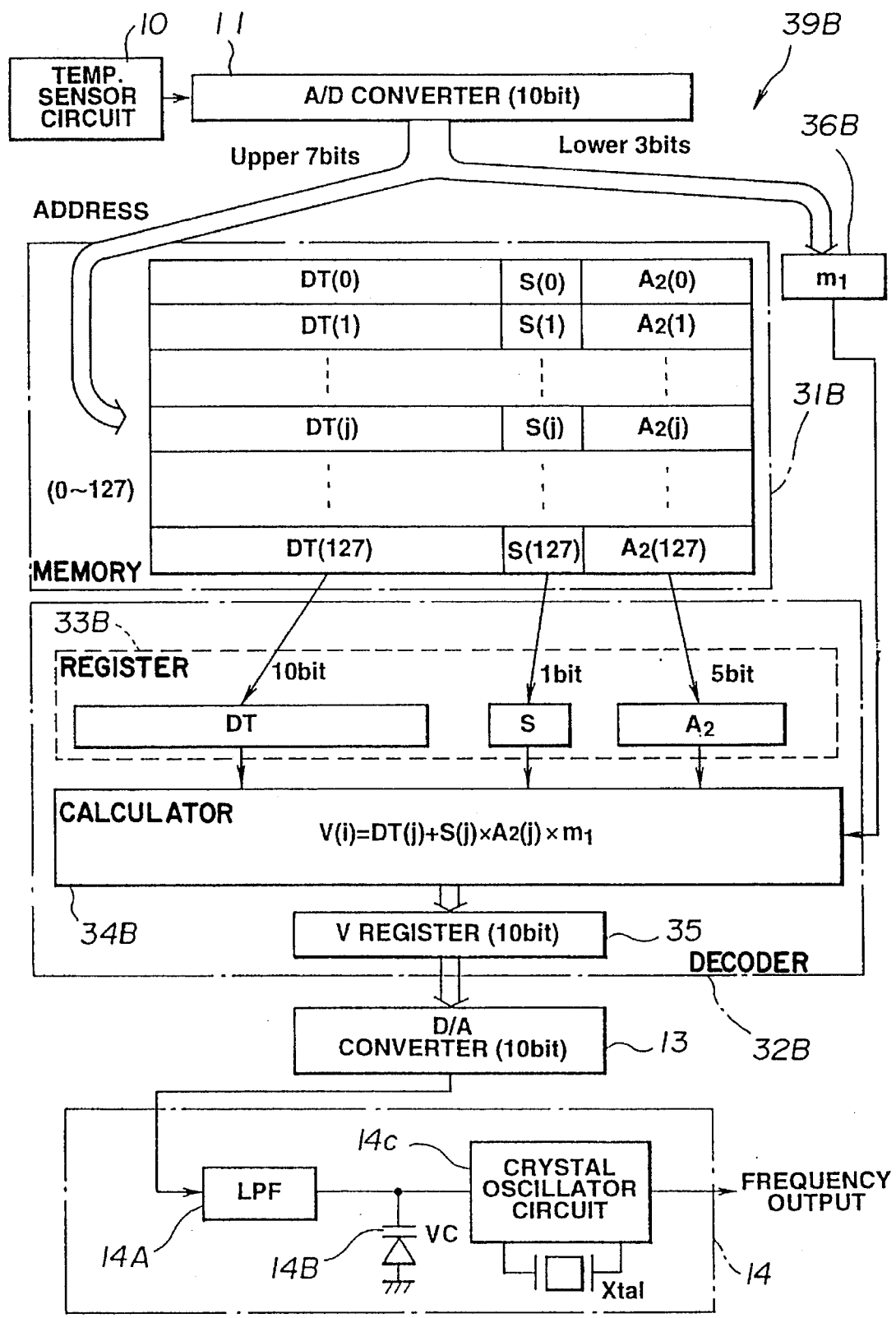
FIG. 7 is a schematic view showing a digital temperature compensated crystal oscillator system according to a third embodiment of the present invention.

[I-iii] Third embodiment shown in FIGS. 7 and 9A–9B

FIG. 7 shows a DTCXO system according to a third embodiment of the present invention. The third embodiment is applicable to the case in which the compensation data slope required by VCXO in a temperature block (or j block) is constant, including 0, and hence the applicability is sufficiently high. Accordingly, the number of temperature blocks (j blocks) is increased to 128, so that the temperature range is divided to about 1° C./block. Each block is divided into eight subsections, and accordingly, each of the addresses is identified by 10 bits. Unlike the first and second embodiments, the system of the third embodiment does not have the slope correction data B(j, k). In this case, the block and the linear approximation are shown in FIGS. 9A and 9B. The ROM data according to the third embodiment includes 10 bit reference data DT(j), 1 bit sign data S(j), and 5 bit linear approximation slope data $A_2(j)$. DT(j) is a compensation data for the lowest temperature in the j temperature block. $A_2(j)$ is given by the following equation:

$$A_2(j) = \frac{DT(j+1) - DT(j)}{8}$$

When DT(j+1)–DT(j)=1, 9, 17, . . . , then the decimal fraction part of $A_2(j)$ is 0.125. Therefore, the LSB of the five bits of $A_2(j)$ is made to correspond to that part. Namely, the five bit structure is so arranged that the upper 2 bits are assigned to the integer part, and the lower 3 bits are to the decimal part.

The system of the third embodiment is substantially identical in basic arrangement to the systems of the first and second embodiments. A temperature compensation data supplying section 39B of the third embodiment is interposed between a 10 bit A/D converter 11 and a 10 bit D/A converter 13, as in the first embodiment. In the system of the third embodiment, however, the upper 7 bits of the digital signal from the A/D converter 11 is inputted to the memory 31B as the is address signal. The lower 3 bits are inputted to an $m_1$ register 36B, and used as decode input information (parameter) $m_1$. The memory structure of the memory 31B, and a register section 33B and a calculating section 34B of the decoder 32B are modified accordingly. The mathematical expression of the calculating section 34B is:

$$V(i)=DT(j)+S(j)\times A_2(j)\times m_1 \qquad (I-3)$$

where
$i=8j+m_1$
$j=0~127$
$m_1=0~7$

As evident from the equation (I-3), the third embodiment can simplify the mathematical relationship in the calculating section as compared with the equations (I-1) and (I-2).

In the thus-constructed memory section 31A of the third embodiment, the ROM capacity is; $2^7 \times 2$ bytes=256 bytes. That is, the data is compressed to about ⅕. It is confirmed that the simulation result of the system of the third embodiment is within ±0.2 ppm with respect to the characteristic before compensation shown in FIG. 4, and it is estimated that the influence of data compression is not so much. The third embodiment offers the same effects as the first embodiment.

The first, second and third embodiments are summarized as follows: Since the main object of the DTCXO is the temperature compensation of the frequency, the speed of memory access speed need not be so high. The rate of change of the ambient temperature is about 1° C./min at most, and therefore the time of one compensation operation is not problematical even when the time of one compensation operation amounts to several seconds with addition of a time for algorithmic and arithmetic operation on the ROM data to the memory access time. In these embodiments, the data to be stored in the ROM is compressed according to a predetermined algorithm to a smaller amount which can be stored in a narrower memory space. Therefore, these embodiments can reduce the time for transfer and programming operation of ROM data, and contribute to the size reduction. As the bit lengths (the numbers of bits) of the A/D converter and D/A converter used in these embodiments, it is possible to choose the bit length of a general purpose device.

According to the first and second embodiments, the section 34, 34A or 34B serves as a calculating means which includes a means for determining the output variable (V(i)) which is a sum of the reference data item (DT) and a product obtained by multiplying a multiplicand by the sign data item (S). The above-mentioned multiplicand is a sum of a product obtained by multiplying the slope data item (A, $A_1$) by the parameter (k, m), and a partial sum.

In the third embodiment, the third data item is a linear slope data item ($A_2$) representing a slope of an approximate straight line, and the calculating means includes a means for determining the output variable (V(i)) which is a sum of the reference data item (DT) and a product obtained by multiplying a multiplicand by the sign data item. The multiplicand is a product resulting from multiplication of the linear slope data (A2(j)) and the parameter ($m_1$).

Figure 16:
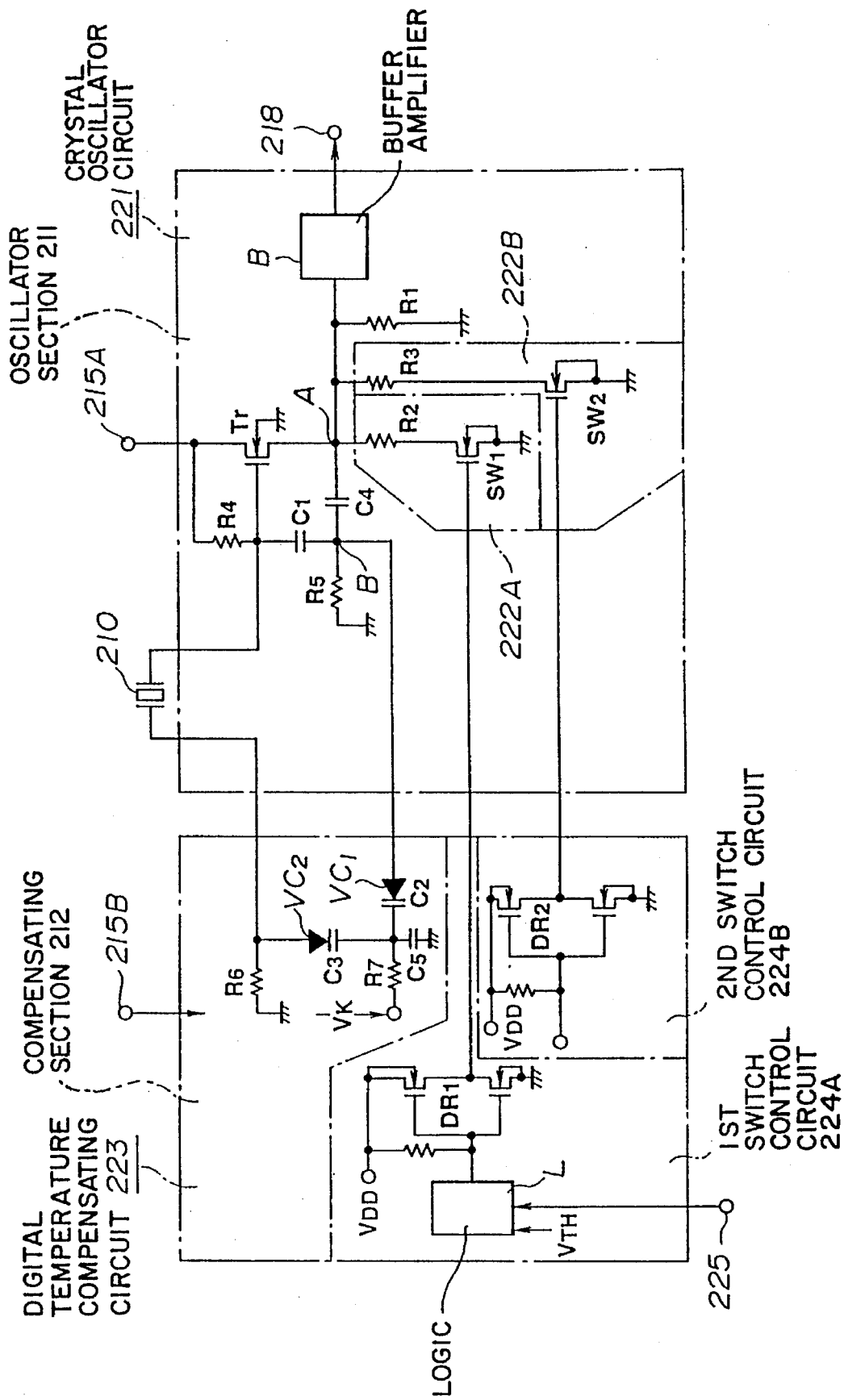
FIG. 16 is a circuit diagram showing a practical example according to a fourth embodiment of the present invention.

[II] Fourth Embodiment shown in FIG. 16

Figure 18:
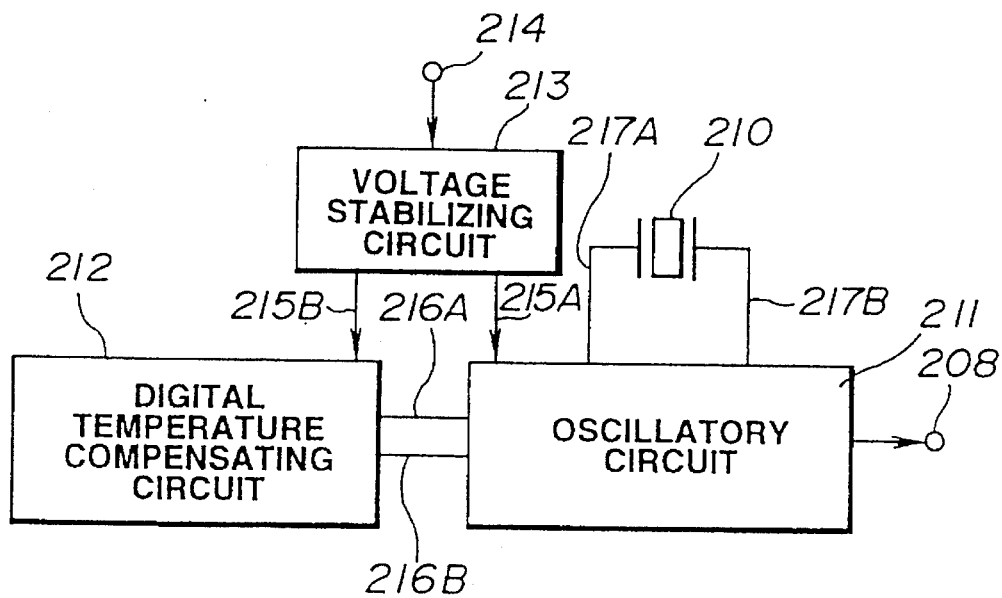
FIG. 18 is a block diagram showing a convention digital temperature compensated crystal oscillator system including a voltage stabilizing circuit.

FIG. 18 shows a conventional digital temperature compensated crystal oscillator which is useful to facilitate the understanding of the fourth embodiment. This crystal oscillator system includes a crystal unit 210, an oscillator circuit 211, a digital control temperature compensating circuit 212, and a circuit 213 for stabilizing a voltage. There are further provided a power supply terminal 214, conductor lines 215A, 215B, 216A, 216B, 217A and 217B, and a frequency output terminal 208.

When power is supplied through the supply terminal 214, the voltage stabilizer circuit 213 energizes the oscillator circuit 211, and the oscillator circuit 211 excites the crystal unit 210 and produces an output signal of oscillation frequency at the output terminal 208. The frequency of this circuit is readily affected by the temperature deviation characteristic of the crystal unit, and the frequency stability is below a desired level without the temperature compensation.

Therefore, the digital control temperature compensating circuit 212 is arranged to adjust a temperature compensating capacitance which is a capacitance between the lines 217A and 217B (that is, a capacitance connected in series to the crystal unit 210) as viewed from the oscillator circuit 211, so as to compensate for changes in the output frequency with the ambient temperature of the crystal unit 210. The temperature compensating circuit 212 comprises a temperature sensor, an A/D converter, a ROM, a D/A converter, a varicap (a varactor diode), a low pass filter and a control logic unit.

The voltage stabilizing (stabilizer) circuit 213 supplies a constant voltage to the circuits 211 and 212 even when the supply voltage from a battery or other power source varies widely (for example, 5.5~2.7 V), and by so doing prevents the output frequency from being influenced by voltage variation.

The digital temperature compensated crystal oscillator system of such a type is expected, as a component for mobile communication, to fulfill the following requirements. (i) The system must provide a prescribed oscillation performance (A deviation of the output frequency is constant, a frequency fluctuation is small, and the output waveform is constant.) (ii) The system must be small in size and light in weight. (iii) The system must be suitable for low voltage drive, and low in power consumption (6 mw, for example). (iv) Other requirements (The system must be vibration-proof and shock(or impact)-proof, and low in cost.). The first requirement can be achieved by the digital control temperature compensating circuit 212. As for the remaining requirements (ii)~(iv), however, the digital temperature compensated crystal oscillator system is rather poorer than the ordinary simple crystal oscillator without the compensating circuit 212.

For the requirements (ii) and (iv), one of the most effective ways is a large scale (or very large scale) integration of the circuits 211~213 into a one chip configuration. This solution is becoming feasible by the aid of the recent semiconductor technology at a reasonable cost.

However, the requirement (iii) for low power consumption remain unsolved.

A fourth embodiment of the invention is designed to provide a digital temperature compensated crystal oscillator circuit which is suitable for one chip configuration and low in power consumption.

In a Colpitts oscillator circuit, a condition for oscillation is that an equivalent negative resistance −Rn of a circuit constituted by an active element and a feedback circuit near a series resonance frequency of a crystal unit is sufficiently greater than an equivalent resistance $R_Q$ (at starting), of the crystal unit.

$$|-Rn| > \alpha R_Q \tag{II-1}$$

In this equation, α is a constant, and an empirical value of α is about 5.

When the oscillator circuit is excited and becomes stable, the negative resistance −Rn settles down, by a bias effect of a source resistance Rs with a nonlinear characteristic of MOS and an increase in high frequency amplitude, to a stable point expressed as;

$$|-Rn| = R_Q \tag{II-2}$$

The equivalent resistance $R_Q$ of the crystal unit can be regarded as being equal between the starting condition and the stable condition.

Figure 13:
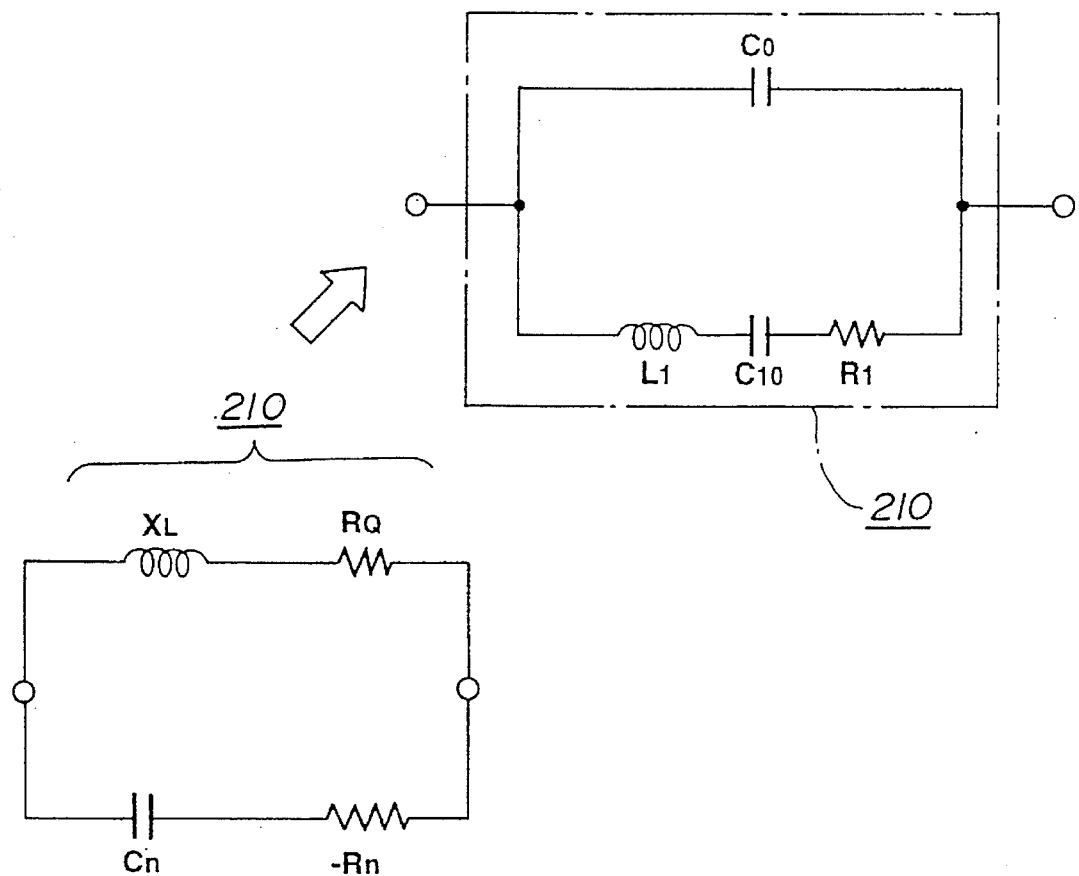
FIG. 13 is a diagram for showing an equivalent circuit of a crystal oscillator circuit.

FIG. 13 shows an equivalent circuit of a crystal oscillator circuit. In this equivalent circuit, $X_L$ and $R_Q$ are, respectively, equivalent reactance and resistance of the crystal, and Cn is a composite capacitance of a feedback capacitor $C_1$ to the source of the MOS (oscillation detecting capacitance), a capacitor $C_2$ (oscillation exciting capacitance), and a capacitor $C_3$ (an additional capacitance in series to the crystal unit). By using an angular frequency $\omega_0$ of oscillation, the equivalent reactance $X_L$ is given by:

$$X_L = 1/\omega_0^2 Cn \tag{II-3}$$

The angular frequency $\omega_0$ is related to a series resonance angular frequency $\omega s$ of the crystal unit as:

$$\omega_0 \approx \omega s (1 + C_{10}/(C_0 + Cn))^{1/2} \tag{II-4}$$

In this equation, $C_0$ is a parallel capacitance of the crystal unit, and $C_{10}$ is a series capacitance.

The equivalent resistance $R_Q$ is an observable quantity at the angular frequency coo by a device such as a CI meter. For example, $R_Q$ is about 10Ω at 10 MHz.

Figure 14:
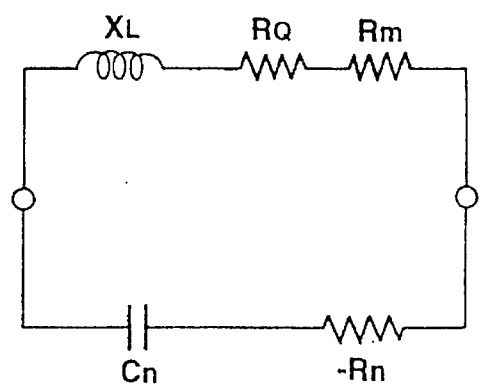
FIG. 14 is a diagram showing an equivalent circuit to which a resistor Rm is added.

The following is an explanation of the equivalent negative resistance −Rn. FIG. 14 shows a circuit in which a high frequency pure resistance Rm is connected in series to the equivalent resistance $R_Q$. When Rm is set equal to zero, Rm=0, then the circuit of FIG. 14 is identical to the circuit of FIG. 13, and capable of oscillating stably at $\omega_0$. Next, an oscillatable value $Rm_0$ can be found by decreasing Rm gradually from a higher side, and in this case, an effective negative resistance $-Rn_0$ capable of starting on the circuit's side is an observable quantity given by:

$$|-Rn_0| = R_Q + Rm_0 \tag{II-5}$$

This effective negative resistance $-Rn_0$ is determined by the oscillation angular frequency $\omega_0$, the capacitances $C_1$ and $C_2$, and a transconductance gm of the MOS transistor, as expressed as:

$$-Rn_0 \propto gm/\omega_0^2 C_1 C_2 \tag{II-6}$$

Among these quantities, the oscillation angular frequency $\omega_0$ (=2πf0) is a premise of the design. When the capacitors $C_1$ and $C_2$ and their ratio $C_1/C_2$ are properly designed, it is necessary to increase the transconductance gm in order to increase the startable effective negative resistance $-Rn_0$ capable of starting.

The transconductance gm is explained as follows: A characteristic of an N-MOS transistor in an unsaturated region is expressed by;

$$I_{DS}=K[(V_{GS}-V_{TH})\cdot V_{DS}-(\tfrac{1}{2})V_{DS}^2] \tag{II-7}$$

In this equation, $I_{DS}$ is a drain-source current; $V_{DS}$ is a drain-source voltage; $V_{GS}$ is a gate-source voltage; $V_{TH}$ is a threshold voltage; $K=(\mu\epsilon/t)(W/L)$, $\mu$ is a carrier mobility; $\epsilon$ is a dielectric constant of SiO2; t is a thickness of a gate oxide film; L is a channel length of the gate; W is a channel width of the gate. The transconductance gm is given by;

$$gm=\Delta I_{DS}/V_{GS} \tag{II-8}$$

Therefore, when $\mu$, $\epsilon$ and t are considered to be constant, the transconductance gm can be increased by increasing W/L, that is, by decreasing the channel length L and/or increasing the channel width W. The reduction of the channel length L is limited by the fabricating process, and the increase of the channel width tends to increase the area of the LSI. Therefore, W/L is determined by a trade-off among a desired size, a manufacturing cost and a target value of the transconductance gm.

Figure 15:
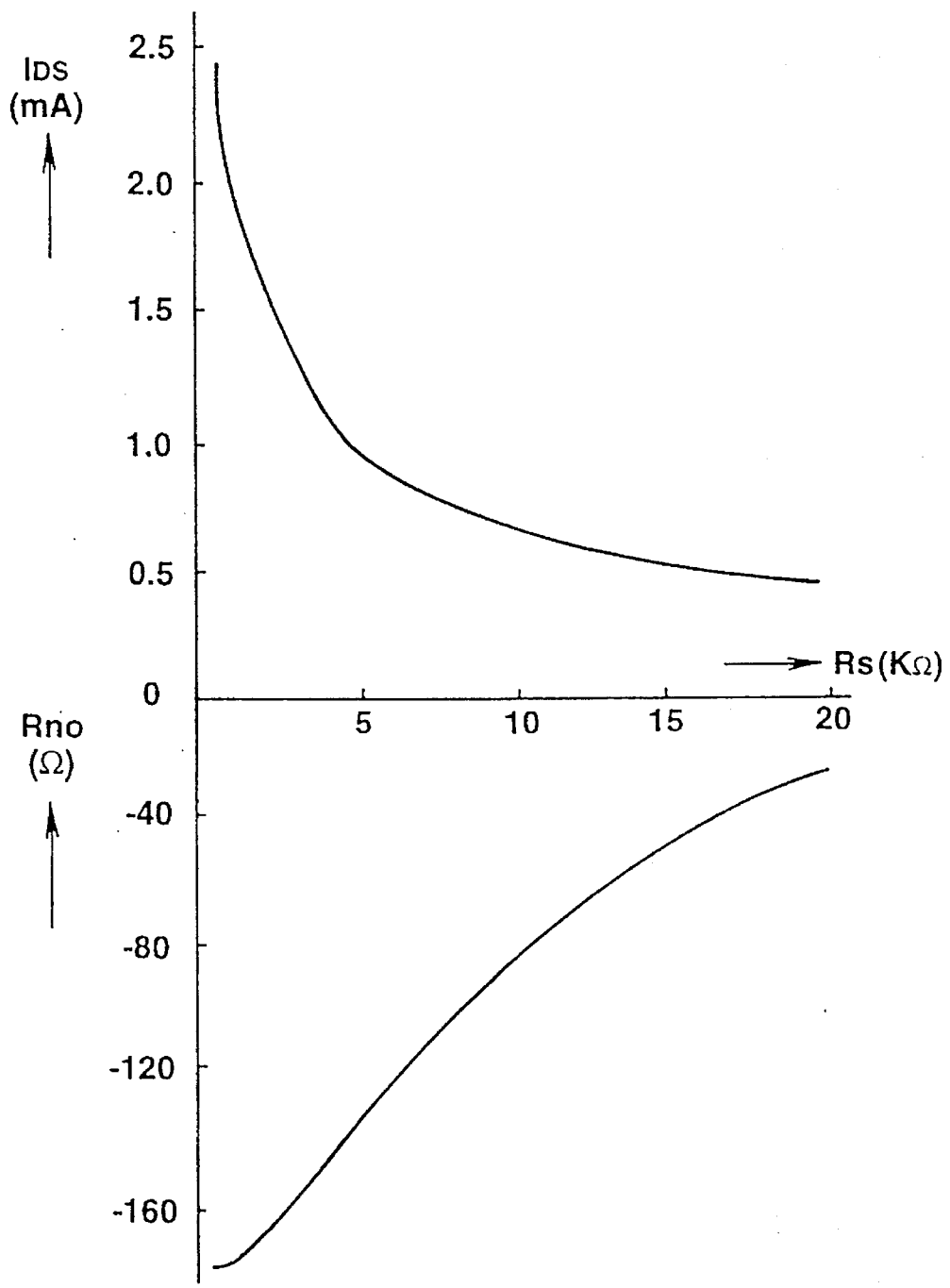
FIG. 15 is a graph showing characteristics of drain-source current and negative resistance of a MOS with respect to a source resistance.

In the fourth embodiment according to the present invention, it is forecasted that the transconductance gm in the equation (II-7) is related to the constant K, and simultaneously to the drain source current IDS, and a relation is found as shown in FIG. 15. This relation is a relation between the effective negative resistance $-Rn_0$ capable of starting and the drain source current $I_{DS}$ when the source resistance Rs is varied at an oscillation frequency of 10 MHz.

From this relation, the fourth embodiment is designed to secure a reliable starting operation with a large negative resistance obtained by decreasing the source resistance Rs during starting of oscillation, and to increase the source resistance to reduce the drain source current of the MOS transistor and reduce the power consumption at the end of a predetermined time interval at which the oscillation is supposed to be stable. In this embodiment, there may be further provided a source resistance switching circuit for making it possible to change the source resistance of the MOS transistor from the outside. This circuit helps maintain a reliable starting operation, and a stable and low current oscillation when the oscillation frequency is changed in the oscillator circuit such as an LSI oscillator circuit.

FIG. 16 shows one practical example according to the fourth embodiment.

A digital temperature compensated crystal oscillator circuit shown in FIG. 16 comprises a crystal oscillator circuit 221 and a digital temperature compensating circuit 223.

The crystal oscillator circuit 221 comprises first and second switch circuits 222A and 222B in addition to a crystal oscillator circuit section 211 which corresponds to the conventional crystal oscillator circuit shown in FIG. 18.

The digital temperature compensating circuit 223 comprises first and second switch control circuits 224A and 224B in addition to a compensating circuit section 212 corresponding to the conventional compensating circuit 212 shown in FIG. 18.

Each of the first and second switch circuits 222A and 222B is a series combination of a resistor $R_2$ or $R_3$ and a semiconductor switch $SW_1$ or $SW_2$. The switches $SW_1$ and $SW_2$ are controlled on and off, respectively, by the first and second switch control circuits 224A and 224B.

The crystal oscillator circuit section 211 is in the form of a Colpitts oscillator circuit, and comprises a transistor Tr (which, in this example, is an NMOS) as an active element, a source resistance $R_1$, an oscillation detecting capacitance $C_1$, an oscillation exciting capacitance $C_2$ (a first varicap (variable capacitor) $VC_1$ of the temperature compensating circuit 212), a series capacitance $C_3$ (a second varicap $VC_2$ of the temperature compensating circuit 212), and a crystal unit 210.

In the temperature compensating circuit 212, the two varicaps $VC_1$ and $VC_2$ are connected in parallel, and controlled by a temperature control reverse voltage Vk so as to improve the sensitivity of the temperature compensation. Furthermore, the range of variation of the voltage Vk is made low. The circuit is further arranged so as to prevent the sensitivity of the varicaps in the compensation of the frequency from being lowered by a parasitic capacitance entering each of the connecting points of the circuit, the resistors and the one chip interconnecting conductors.

The crystal oscillator circuit section 211 further comprises a buffer amplifier B for providing a frequency output of a constant frequency and a constant amplitude at the output terminal 218 by performing an impedance conversion of the frequency output from the transistor Tr. Although this output stage generally employs a capacitive coupling, the buffer amplifier B can be formed by LSI without offering problems to the reduction of size and power of the circuit.

A resistor $R_4$ is for determining a gate potential of the transistor Tr. For example, the resistor $R_4$ is in the form of a diffused resistor of 100 KΩ.

In this example, each of the circuit resistors $R_1$, $R_2$, $R_3$, $R_5$ and $R_6$ is in the form of a polysilicon resistor so as to prevent the sensitivity of the temperature compensation from being lowered by a parasitic capacitance.

The resistors $R_5$, $R_6$ and $R_7$ are connected so as to apply the control voltage Vk to the varicaps $VC_1$ and $VC_2$ in a manner of a direct current. The capacitor $C_4$ is a decoupling capacitor for preventing the circuit section of the resistor $R_1$ from being affected by the control voltage Vk. To make the high frequency potentials at both ends A and B of the capacitor $C_4$ equal to each other, the capacitance $C_4$ is greater than the capacitance $C_2$. Specifically in this example, the capacitors $C_4$ and $C_2$ are chosen so that $C_4 \gg C_2$.

The capacitor $C_5$ is for forming a high frequency earth point, and has a great capacitance. When circumstances require, a small size ceramic capacitor external to the LSI chip is added to o supplement the capacitor $C_5$.

In this way, the crystal oscillator circuit 221 and the compensating circuit 223 are combined to form a digital control temperature compensated Colpitts type crystal oscillator circuit competent for a large scale integration on and in one chip.

The first switch control circuit 224A comprises a control logic circuit L which obtains a threshold voltage $V_{TH}$ as a reference for comparison when a supply voltage is applied from the terminal 214 through the voltage stabilizer circuit 213 as shown in FIG. 18, and which compares a supply voltage for the analog circuit applied from a terminal 225, with the threshold voltage $V_{TH}$. When the supply voltage applied to the terminal 225 becomes equal to the threshold voltage $V_{TH}$, the logic circuit L produces an output signal of a logic "0", and with this output signal, turns on the first semiconductor switch $SW_1$ through a semiconductor switch driver $DR_1$. At the same time, the logic circuit L starts a timer operation. At the end of a predetermined time interval τ, the logic circuit L produces a logic "1", and with this output signal, turns off the first semiconductor switch $SW_1$ through the driver $DR_1$.

When the oscillator circuit 211 is started, therefore, the first semiconductor switch $SW_1$ is turned on, and the second resistor $R_2$ is inserted in parallel to the source resistor $R_1$. As a result, the source resistance is reduced, and the drain-source current $I_{DS}$ of the transistor Tr is increased to ensure the start of oscillation.

When the oscillation has become more stable, and the predetermined time τ has elapsed, then the first semiconductor switch $SW_1$ is turned off, and the source resistance is returned to $R_1$, so that the drain-source current of the transistor Tr is reduced to reduce the consumption of current.

Figure 17:
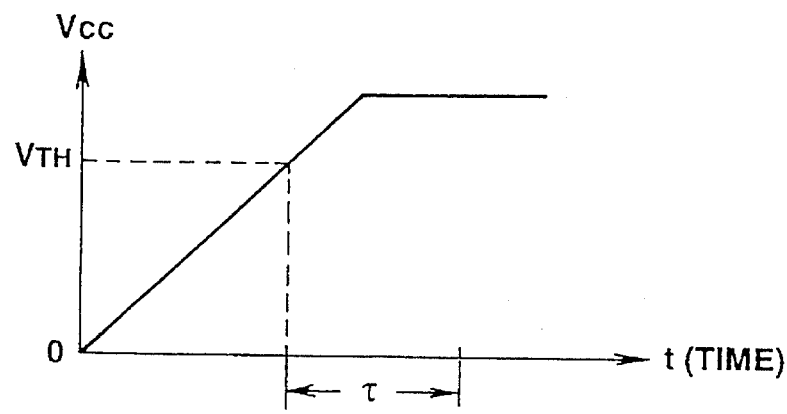
FIG. 17 is a graph showing a characteristic of a supply voltage, and a threshold voltage of a logic control circuit shown in FIG. 16.

As to the supply voltage for the analog circuit, the terminals 225 and 214 may be arranged to have the same system. However, the supply voltage for the analog circuit rises gradually as shown in FIG. 17, more slowly than the buildup of the voltage of the voltage stabilizer circuit 213. The switch $SW_1$ is on from the instant when the supply voltage reaches $V_{TH}$, to the end of the timer interval τ.

In the circuit shown in FIG. 16, the resistors $R_1$ and $R_2$ are chosen, by way of an example, as $R_1$=10 KΩ, and $R_2$=3 KΩ. When, in this case, the first switching element $SW_1$ is held on during starting, the source resistance Rs is given by Rs=2.4 KΩ. From the characteristic shown in FIG. 15, the negative resistance capable of generating oscillation is; $-Rn_0 \approx 160\Omega$. According to the above-mentioned equation (II-1), the crystal unit 210 of $R_Q$<30Ω can be readily started for oscillation. When the first switch $SW_1$ is switched off at the expiration of the predetermined time interval τ (5 ms, for example), the oscillator circuit undergoes a transition with tolerable changes in frequency and amplitude, to a new circuit condition capable of producing stable oscillation (Rs=$R_1$=10 KΩ). According to the equation (II-2), the source resistance Rs can be increased up to 20 KΩ to obtain a steady state of the crystal unit of $R_Q$<30Ω. However, Rs is set at 10 KΩ, for example, in consideration of the frequency stability (the degree of freedom from undesired frequency variations). On this condition, the drain current of the transistor Tr is equal to 1.3 mA during starting of oscillation whereas the drain current in the steady state condition is lowered to 0.7 mA. Thus, this circuit can reduce the power consumption significantly, by 35%.

The second switch circuit 222B is the series circuit of the resistor $R_3$ and the second semiconductor switch $SW_2$, as mentioned before. This series circuit is connected in parallel to the source resistor $R_1$. The second switch control circuit 224B comprises a second semiconductor switch driver $DR_2$ for controlling the second semiconductor switch $SW_2$ on and off in accordance with its logic input.

When, for example, a crystal oscillator circuit of $f_0$=10~20 MHz is formed by an LSI circuit in which gm, $C_1$ and $C_2$ are constant, the equivalent negative resistance $-Rn_0$ is reduced to ¼ when the frequency $f_0$ is increased twofold, as indicated by the equation (II-6). On the other hand, the equivalent resistance $R_Q$ of the crystal is normally reduced only to ½~¹/₁.₅.

For such a change of the frequency, it is not possible to obtain a desirable negative resistance (for stable oscillation) only with the first switch circuit 222A, and another LSI design is required.

In the example shown in FIG. 16, the second switch circuits 222B and the second switch control circuit 224B are incorporated in the form of an LSI device, and arranged so as to make it possible to decrease the source resistance and to increase the negative resistance $-Rn_0$ by switching on the switch circuit 222B in accordance with the frequency. Therefore, the crystal oscillator circuit shown in FIG. 16 is adequate for different frequencies, and advantageous in power consumption, and there is no need for a change of the LSI configuration design.

It is possible to supply an on/off control input to the switch control circuit 224B by a hardware short bar, or by a software program stored in a storage device such as a ROM.

In the fourth embodiment, it is possible to further provide one or more sets each consisting of a switch circuit similar to the switch circuit 222A or 222B and a switch control circuit similar to the switch control circuit 224A or 224B in the form of the LSI structure so that an optimum source resistance for reliable oscillation and low current level can be set in accordance with changes in the frequency by an external means.

As explained above, the fourth embodiment can ensure a start of oscillation with a large negative resistance. The cost can be reduced by using a crystal unit of a large equivalent resistance $R_Q$. Furthermore, this embodiment can reduce the power consumption significantly by reducing the MOS transistor current during stable oscillation. This embodiment can reduce the variation or fluctuation of the output frequency by ensuring the negative resistance required for stable oscillation. With the capability of changing the source resistance of the MOS transistor from the outside, it is easier to change the frequency of oscillation even in an LSI circuit so that the flexibility is enhanced. The circuit according to the fourth embodiment can be formed in a one chip IC device.

[III-i] Fifth Embodiment shown in FIGS. 19–23

Figure 32:
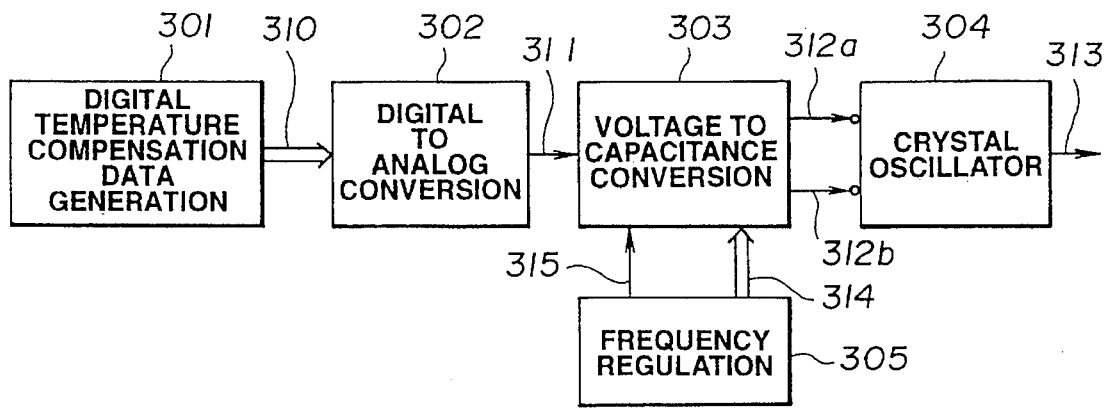
FIG. 32 is a block diagram showing a conventional digital temperature compensated crystal oscillator system having a frequency regulating section.

To facilitate the understanding of fifth, sixth and seventh embodiments of the present invention, reference is first made to FIG. 32 which shows, as an example, a conventional DTCXO system including a temperature compensation data generating section 301, a digital-to-analog converter 302, a voltage-to-capacitance converting section 303, a crystal oscillator section 304, and a frequency regulating section 305 for commanding a fine adjustment of a frequency.

The compensation data generating section 301 senses the ambient temperature of a crystal unit in the crystal oscillator section 304, producing an analog voltage Vt corresponding to the sensed ambient temperature, and converting the analog voltage Vt to a digital signal T corresponding to the sensed temperature. The digital signal T is inputted, as address digits, to a memory device (such as a ROM) for storing compensation data each item of which is identified by the address digits corresponding to the sensed temperature. Therefore, in response to the address digits, the compensation data item V (of 10 bits, for example) in the addressed memory location is read out from the memory device. The data item V is set in a data register, and supplied as a digital output data signal 310 to the digital-to-analog converter 302.

The D/A converter 302 converts the input V signal 310 to an analog voltage Vcw, and then producing a voltage Vc 311 by smoothing the varying analog voltage Vcw with a low pass filter (LPF) having an appropriate time constant (5 ms, for example). The voltage Vc 311 is inputted to the voltage-to-capacitance converting section 303 which comprises one or more varicaps (or variable capacitors or varactor diodes), one or more resistors and one or more semiconductor switches, and which varies an equivalent capacitance (or capacity) Cc between first and second terminals 312a and 312b in accordance with the input voltage Vc. There exists a one to one linear correspondence between Cc and Vc.

The crystal oscillator section 304 comprises a crystal unit (Xtal) and an inverting amplifier, and the equivalent capacitance between the first and second terminals 312a and 312b is inserted in series or in parallel to the crystal unit so that the temperature compensation is possible, and a voltage 313 of a constant frequency can be obtained independent of the ambient temperature. In this way, by using a crystal oscillator of 15 ppm, for example, it is possible to achieve a stable DTCXO of ±1 ppm in a wide temperature range (−40° C.~85° C., for example). When, at a standard temperature (20° C., for example), the equivalent capacitance Cc is substantially equal to a middle value Cco middle between the maximum and minimum values of Cc, the deviation of the constant frequency signal voltage 313 from an expected value should be zero. However, in practice, the deviation amounts to about ±16 ppm because of an adjustment deviation of the crystal unit itself, scattering variation of a constant of the oscillator circuit, and other factors. To solve this problem, some systems employ an offset type. In this case, however, the bit length of the compensation data V stored in the ROM must be increased from 10 bits to 12 bits, for example. Accordingly, the system of the offset type requires an increase of the memory capacity of the ROM, an increase (two bits) of the bit length of the D/A converter, and an about twofold increase of the voltage Vc of the D/A converter 302. As a result, the system becomes large in size and more expensive. This disadvantage is further increased when the temperature compensation data generating section 301, the D/A converting section 302 and the voltage-to-capacitance converting section 303 are integrated in a LSI circuit.

Figure 33:
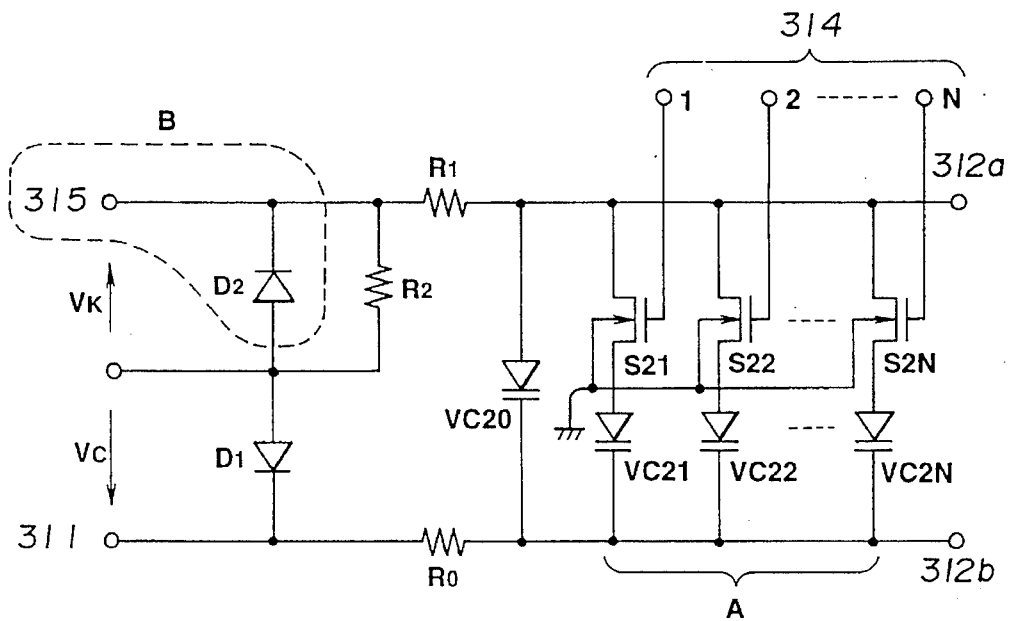
FIG. 33 is a circuit diagram showing one comparable example of a voltage-to-capacitance converting section.

To avoid this problem, the frequency regulating section 305 for fine frequency adjustment at the standard temperature is provided in the system shown in FIG. 32, and accordingly two circuit sections A and B are added to the voltage-to-capacitance converting section 303, as shown in FIG. 33. The circuit section A includes a plurality of branches each of which is a series combination of a varicap (VC21~VC2N) and a semiconductor switch (S21~S2N) and each of which is connected in parallel to a varicap VC20. The capacitance is given by the following equation (II-1).

$$Cc = C_{VC20} + \sum_{m=1}^{N} C_{VC2,m} \quad (III-1)$$

It is desirable that the gate group 314 of the semiconductor switches S21~S2N are turned on so as to satisfy the equation III-1 at the standard temperature. Although the capacitance distribution of Cvc2,m and the number of branches N are determined in accordance with the choice of design, one example employs $2^L$PF and L=3, 2, 1, 0, −1, −2 for N=6.

The circuit section B includes a terminal 315 for applying an analog control voltage Vk in series to Vc, and a protective diode $D_2$. The remaining circuit section includes protective resistors $R_0$, $R_1$ and $R_2$, and a diode $D_1$ regarding Vc.

The frequency regulating section 305 shown in FIG. 32 comprises two independent circuits. The first circuit comprises a ROM, a register and a plurality of two state drivers of 0 and Vcc (a drive voltage of the whole of the circuit). The number of the drivers is equal to N. The second circuit is an analog voltage source Vk of a small internal resistance, and its output is applied to the terminal 315. The frequency regulating section 305 shown in FIG. 32 can reduce the above deviation ±16 ppm at the standard temperature to a level of ±1 ppm by controlling the circuit sections A and B provided in the voltage-to-capacitance converting section 303 in the following manner. On data of the capacitance $Cvc_1,m$ for offset is written into a ROM, and in accordance with this on data, the register and driver turn on the semiconductor switch S2m to bring $Cvc_2,m$ in an operative state. Furthermore, it is possible to adjust the frequency at the standard temperature by applying the analog voltage Vk. The command through 314 is normally used, and the command through 315 is used secondarily.

This DTCXO system equipped with the frequency regulating section 305 can reduce the frequency deviation within a desirable range. When, however, this DTCXO is incorporated in a communication apparatus, there arise the following problems. Recently, there is a strong demand for size reduction of the communication apparatus, and accordingly the DTCXO is incorporated as a SMD (surface mount device) by SMT (surface mount technology). In SMT, reflow soldering is employed, and a SMD type DTCXO must pass through a reflow oven. Because of a temperature shock during this process, the frequency of the DTCXO is changed slightly. The amount of change is mainly determined by the resisting ability of the crystal unit against the temperature shock. Even if a strong crystal unit is employed, the DTCXO becomes expensive in order to always obtain a level of ±0.3 ppm or lower.

The frequency is further changed by the aging of the crystal unit. This also causes an increase in the cost of the device if a stringent requirement is to be met. Moreover, a demand has increased recently for a function of phase lock to adjust the frequency of a portable (mobile) station to the frequency of a base station.

The above is summarized as follows: (a) Frequency shift due to a reflow temperature shock (±0.3 ppm); (b) Frequency shift due to aging (±0.3 ppm); and (c) Function of adjusting frequency to a base station (±2.5 ppm). The DTCXO must correct or adjust these factors in the assembled state in the communication equipment. (The required precision is 0.1 ppm or less, and the range is ±3.0 ppm or wider.) Therefore, the conventional system is unsatisfactory from the following reasons. (i) In the type in which a ROM in the frequency regulating (or adjusting) section 305 is replaced by $E^2$PROM and then the above data is able to rewrite, the effective minimum value of the capacitance $Cvc_2,m$ of the varicap VC2m controlled by this is limited by a lead capacitance and a stray capacitance, and the on resistance of a semiconductor switch is limited (Reduction of the on resistance tends to increase the size and cost.), so that the precision of 0.1 ppm can not be attained. (ii) The system in which ROM in the temperature compensation data generating section 301 is replaced by an $E^2$PROM, and the compensation data is replaced, is not feasible because the rearrangement and writing operation of the data and the confirmation of the temperature compensation are not easy. (iii) The method using Vk of the command 315 is often used for frequency adjustment after DTCXO is incorporated in the communication equipment item. In this case, the signal terminal of the command 315 becomes independent since an internal connection to the frequency regulating section 305 is broken. An appropriate Vk voltage can be applied to this newly formed external terminal of the command 315. However, in order to control with a fineness of 0.1 ppm, the precision of Vk must be about 3 mV, for example. Therefore, it is not practical to equip the communication equipment with a Vk generating circuit.

Therefore, each of the fifth, sixth and seventh embodiments is intended to provide a digital temperature compensated crystal oscillator system which is capable of fine frequency adjustment without detriment to the size reduction and cost reduction.

Figure 19:
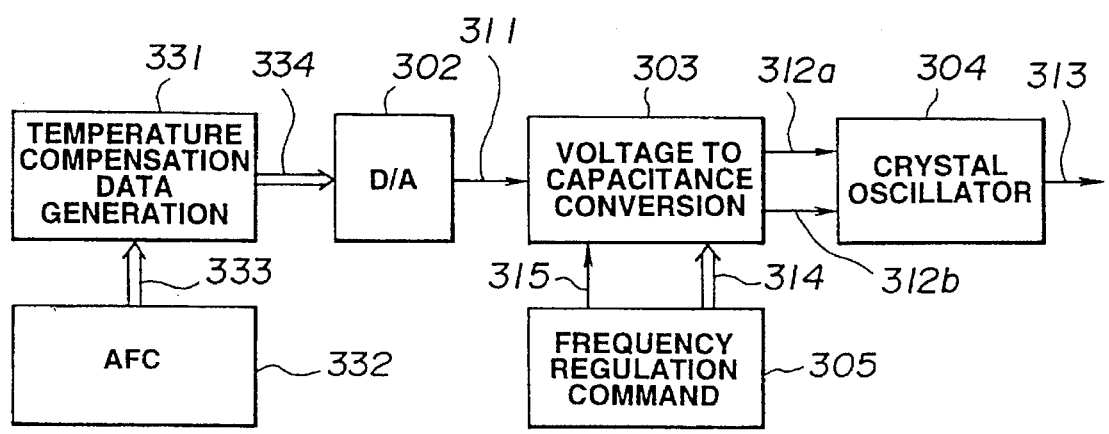
FIG. 19 is a block diagram showing a basic arrangement of a digital temperature compensated crystal oscillator system according to a fifth embodiment of the present invention.

FIG. 19 shows a basic arrangement according to a fifth embodiment of the present invention.

A digital temperature compensated crystal oscillator system shown in FIG. 19 comprises a temperature compensation data generating section 331, a digital-to-analog converting section 302, a voltage-to-capacitance converting section 303, a crystal oscillator section 304, and a frequency regulating section 305 for commanding a fine adjustment of a frequency.

There is further provided an auxiliary frequency control (AFC) section or means (or external frequency control section or means) 332 connected with the compensation data generating section 331. The data generating section 331 is controlled by data 333 supplied from the AFC section 332. The data generating section 331 delivers compensation data 334.

Figure 20:
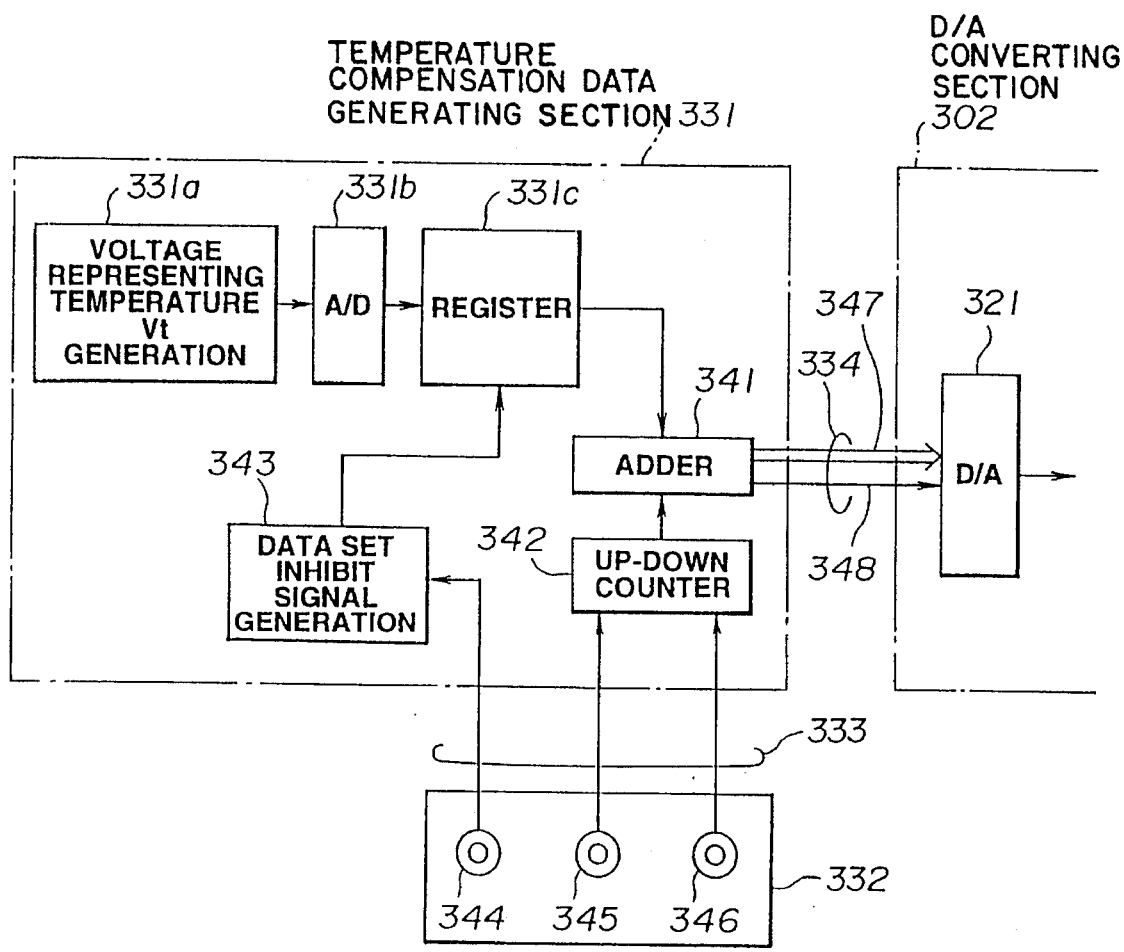
FIG. 20 is a block diagram showing a first practical example according to the fifth embodiment.

FIG. 20 shows a first practical example according to the arrangement according to the fifth embodiment shown in FIG. 19. The temperature compensation data generating section 331 shown in FIG. 20 comprises a voltage generating subsection 331a for sensing the ambient temperature of a crystal oscillator and producing a voltage Vt corresponding to the sensed temperature; an A/D converter (or A/D converting means) 331b for converting the analog voltage Vt of the voltage generating subsection 331a, to a digital signal T; a data storage subsection 331c which comprises a memory device (such as a ROM) for storing compensation data for each temperature, and a V register to which a selected data item selected by the digital signal T as an address signal is set. (This subsection 331c may be constructed in the conventional manner or as in the first, second or third embodiment of the invention.)

The data generating section shown in FIG. 20 further comprises an adder (or an adding means) 341, an up-down counter (or up-down counting means) 342, and a data set inhibit signal generating and sending subsection (or means) 343 for producing a data set inhibit signal to inhibit a data setting operation of the V register of the data storage subsection 331c.

The AFC section 332 of the example shown in FIG. 20 comprises first, second and third external input signal receiving terminals 344, 345 and 346.

The adder 341 receives the output of the register of the data storage subsection 331c as a first input, and the output of the up-down counter 342 as a second input. The adder 341 adds the first input which is the output of the register and the second inputs which is the output of the counter 342, and supplies an adder output signal representing the sum of the first and second inputs, to a D/A converting subsection 321 of the section 302. The output data signal (or total compensation data) 334 of the adder 341 comprises an N bit data signal 347 (N=10, for example), and an assurance signal 348 for confirming that the signal 347 is determined. The signals 347 and 348 are supplied to the D/A converter 321.

The data set inhibit signal generating subsection 343 produces the above-mentioned data set inhibit signal when a signal is inputted from the first external input signal terminal (or AFC enable signal receiving terminal) 344. If the register of the subsection 331c is in the data setting operation, the inhibit signal generating subsection 343 allows this data setting operation to continue until the end, and inhibits the next data setting operation. (The subsection 343 can be constructed in various manners. For example, the subsection 343 may comprise one or more registers and/or a logic array, or a microprocessor may serve as this subsection 343.)

The second and third terminals 345 and 346 of the AFC section 332 are for supplying an up pulse signal and a down pulse signal to the up-down counter 342.

The up-down counter 342 is arranged to pass data (or count) to the adder 341 when no pulses of the pulse signals are received for a predetermined time interval $t_0$.

In this system, it is possible to finely adjust the frequency by first introducing the AFC enable signal to the first terminal 344 (from communication equipment provided with DTCXO, for example), and thereafter introducing the up pulse signal or the down pulse signal to the second or third terminal 345 or 346. It is further possible to put a pause by interrupting the supply of pulses for a time length longer than $t_0$, and then to restart the frequency adjustment. When a desired frequency is reached, the supply of the AFC enable signal is terminated, and the normal temperature compensation can resume with an offset value.

The system shown in FIG. 20 can provide the following effects. (i) By the aid of the recent LSI semiconductor technology, the system can work properly even if the pulse width and/or pulse separation of the up and down pulse signals is reduced, and therefore, this system can achieve the AFC operation of a sufficiently high speed. (ii) The readjustment to correct an excessive adjustment can be done easily by cutting off the input of pulses for a time longer than $t_0$, and resuming the input of pulses. This system can receive both the up and down pulses without reducing $t_0$.

Figure 21:
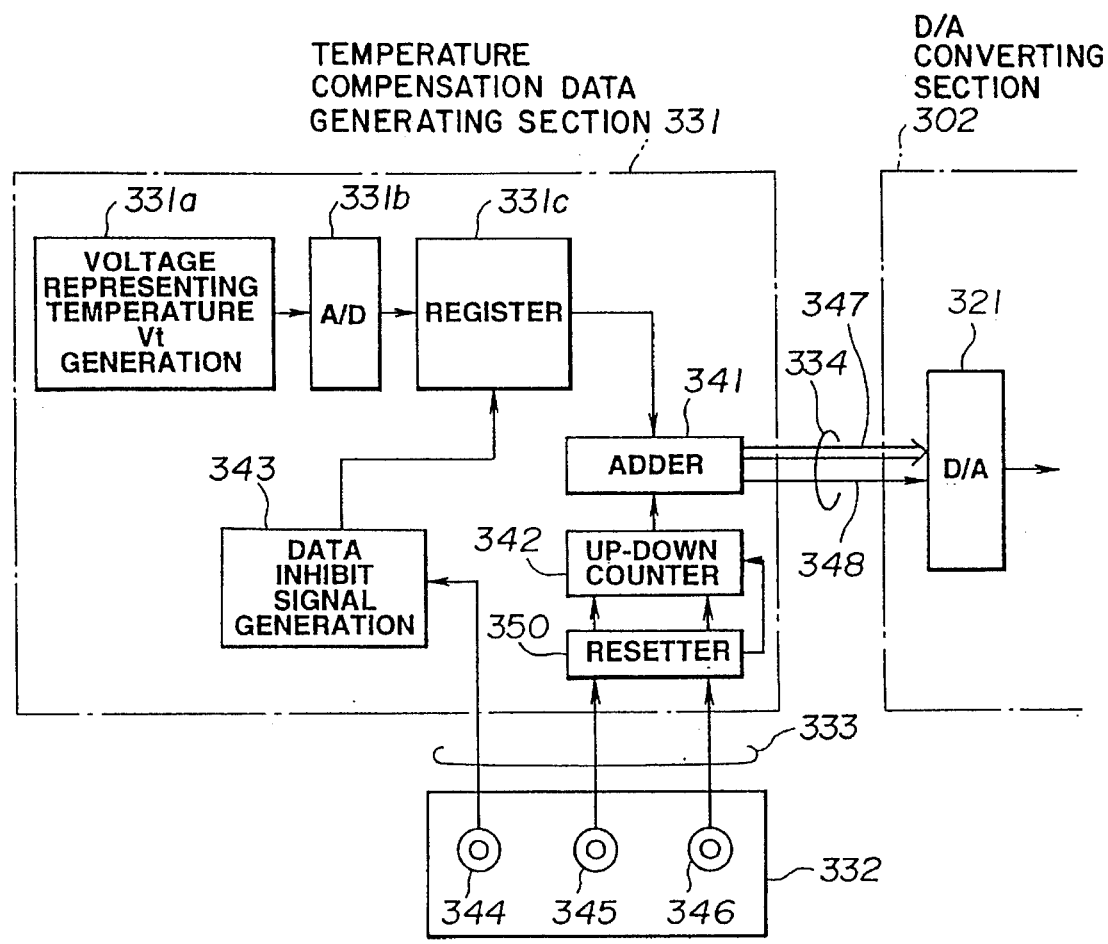
FIG. 21 is a block diagram showing a second practical example according to the fifth embodiment.
Figure 22:
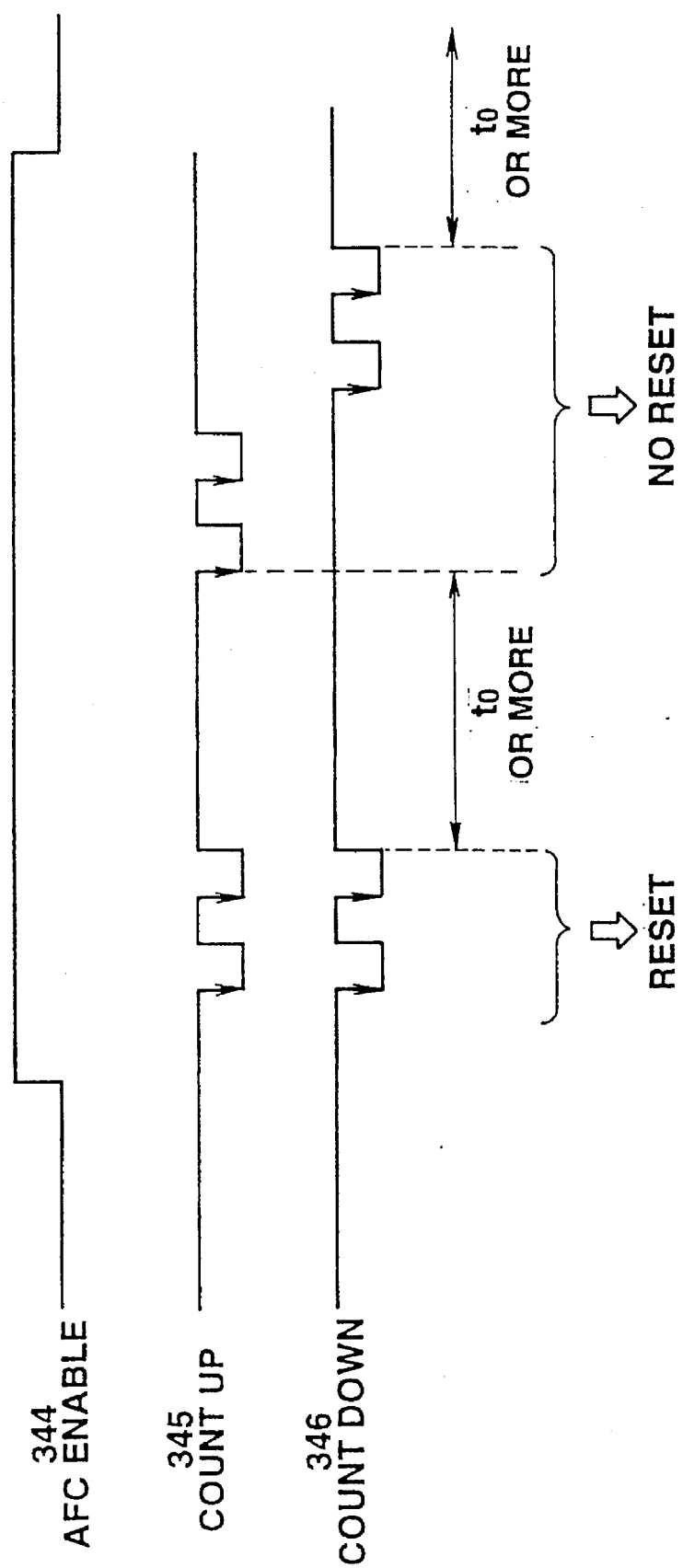
FIG. 22 is a time chart showing signals used in the second example shown in FIG. 21.

FIG. 21 shows a second practical example according to the fifth embodiment shown in FIG. 19. In the second example shown in FIG. 21, there is further provided a resetting section (or resetter or resetting means) 350 which produce a reset signal to reset the up-down counter 342 when the input signals inputted to the second and third terminals 345 and 346 are coincident with each other for a predetermined time interval (one pulse or two pulses, for example). In an example shown in FIG. 22, the resetting section (or resetter) 350 resets the counter 342 when two consecutive pulses of the up pulse signal supply through the terminal 345 are coincident with two pulses of the down pulse signal supplied through the terminal 345. When pulses are not coincident, the resetting section 350 does not produce the reset signal, and the counter 342 is not reset but holds the previous count. This system shown in FIG. 21 makes the reset operation possible without requiring an additional terminal for reset.

In the first and second examples shown in FIGS. 20 and 21, it is possible to increase an amount of frequency adjustment per one pulse of the terminals 345 and 346 by making the LSB sensitivity of the up-down counter 342 $2^M$ times as high as the LSB sensitivity of the V register of the subsection 31c (0.03 ppm, for example) (where M=1, 2, 3, ... ). When M=3, for example, the LSB sensitivity of the counter 342 is eight times as high as that of the V register. In the case of M=3, the data of the counter 342 is shifted by 3 bits to the higher order with respect to the V register, and then added to the data of the V register by the adder 341. It is optional to add an arrangement of a memory and a switch for selective setting. In this case, the adjustment sensitivity per pulse can be readily changed, and a high speed adjustment becomes feasible.

Figure 23:
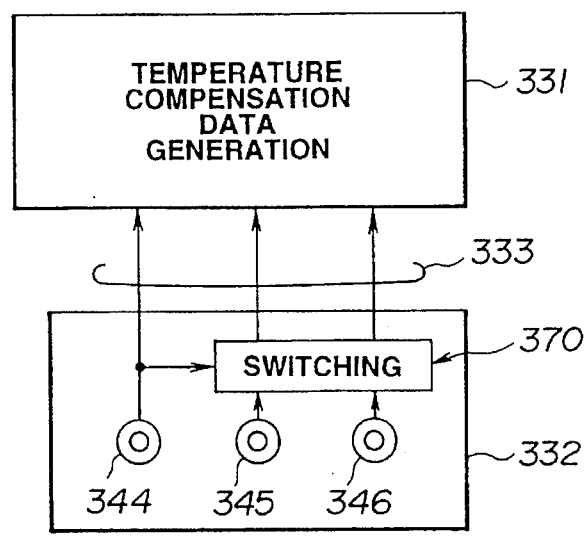
FIG. 23 is a block diagram showing a third practical example according to the fifth embodiment.

FIG. 23 shows a third practical example according to the fifth embodiment shown in FIG. 19. In order to reduce the number of required terminals and to reduce the overall size of the DTCXO, the second and third terminals 345 and 346 of the third example shown in FIG. 23 are normally used for other purposes. Only the first terminal 344 is used exclusively for the AFC. As shown in FIG. 23, the AFC section 332 is provided with a switching section 370. When the AFC enable signal inputted from the first terminal 344 is in the on state, the switching section 370 connects the terminals 345 and 346 to the temperature compensation data generating section 331 to allow the signals applied to the terminals 345 and 346, to reach the data generating section 331. The second and third terminals 345 and 346 can be used for off-line ROM data writing operation, confirmatory read-out, or as a test terminal. The third examples shown in FIG. 23 can reduce the number of required terminals, and reduce the size and cost of the device. (The switching section 370 may comprise two switching devices each having a first terminal connected with one of the terminals 345 and 346, a second terminal connected with the data generating section 331, and a control terminal for receiving the AFC enable signal.)

In this fifth embodiment, the temperature compensation data and the additional (offset) data are added to obtain the total compensation data in the digital region, and then the resulting data is supplied to the D/A converter. An adjustment is possible even in the assembled state in which DTCXO is incorporated in a communication equipment unit. This embodiment can make the control of the communication equipment, such as a portable telephone set, easy and accurate, and facilitate the size reduction and cost reduction of the set.

[III-ii] Sixth Embodiment shown in FIGS. 24–28

Figure 24:
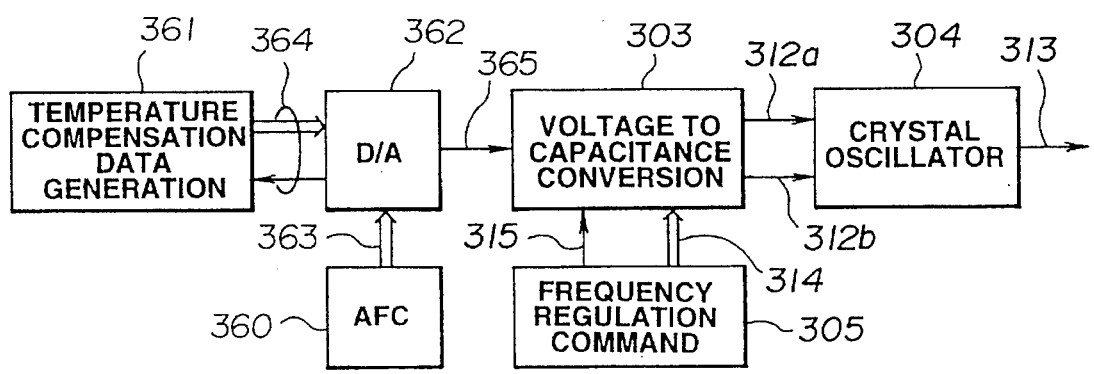
FIG. 24 is a block diagram showing a basic arrangement of a digital temperature compensated crystal oscillator system according to a sixth embodiment.

FIG. 24 shows a basic configuration according to a sixth embodiment of the present invention. In the sixth embodiment, an AFC section 360 is connected with a D/A converting section 362.

Figure 25:
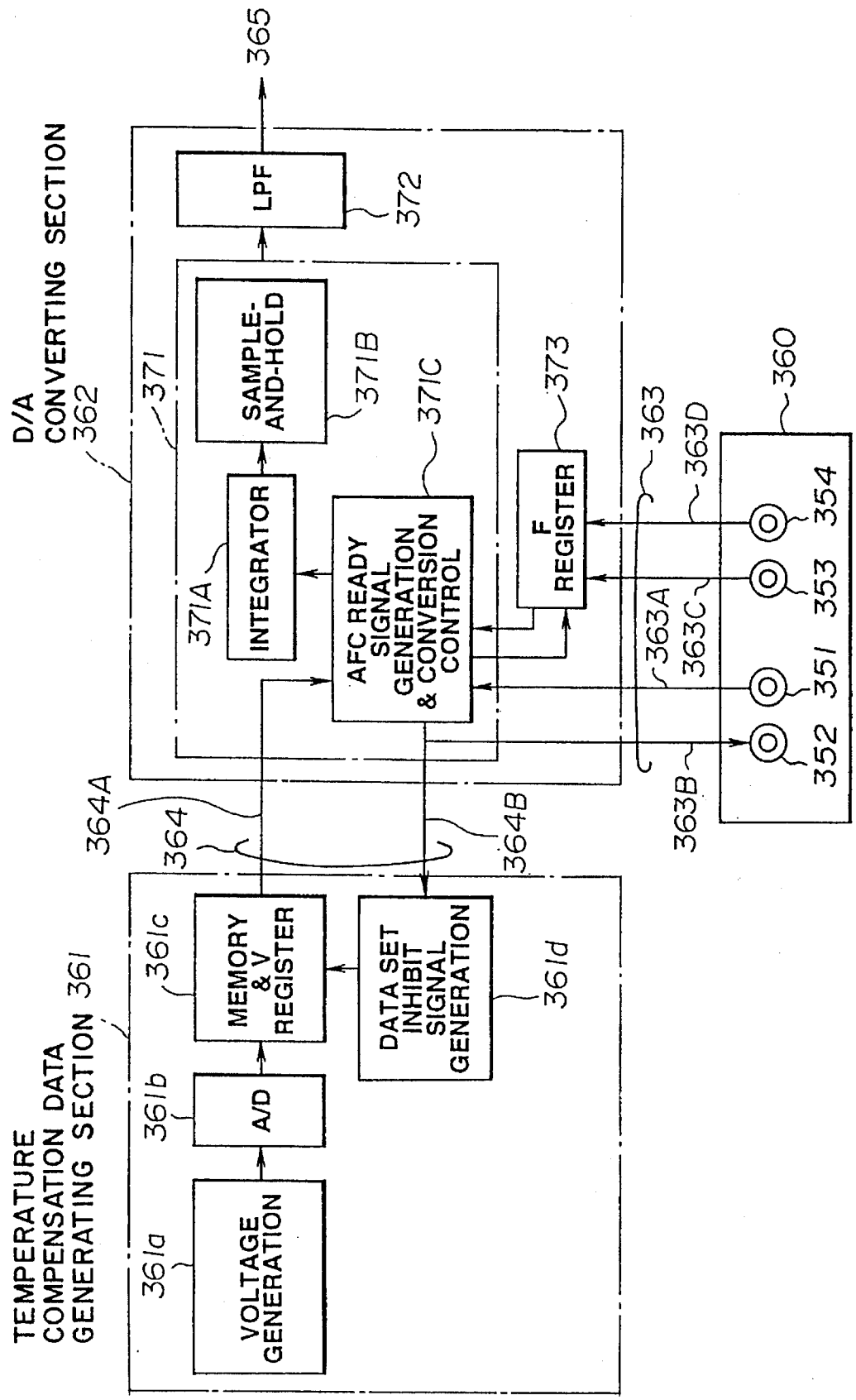
FIG. 25 is a block diagram showing a practical example according to the sixth embodiment.

FIG. 25 shows a practical example according to the sixth embodiment.

A temperature compensation data generating section 361 shown in FIG. 25 comprises a voltage generating subsection 361a, an A/D converting subsection 361b, a data storage subsection 361c comprising a V register, and a data set inhibit signal generating and sending subsection 361d. This subsection 361d is controlled by an AFC ready signal 344B sent from a subsection 371c of the D/A converting section 362. The inhibit signal generating subsection 361d produces the data set inhibit signal to inhibit the data setting operation of the V register when the AFC ready signal is in the on state, and cancels the inhibition when the AFC ready signal is in the off state.

A cycle period τ of repetition of the setting operation of the V register of the subsection 361c is normally in the order of several seconds shorter than 10 sec because it is desirable to lower the speed when frequency jitter is estimated by Allan variance in the case in which the change of the ambient temperature of DTCXO is not so large (equal to or lower than 1° C./minute, for example), and the amount of compensation is not so large (equal to or lower than 1 ppm/1° C., for example).

The AFC section (or means) 360 shown in FIG. 25 comprises first, second and third input terminals 351, 353 and 354 for receiving external signals, and an output terminal 352. These terminals are connected to the part of the communication apparatus on which DTCXO is mounted. The first input terminal 351 is for receiving the AFC enable signal. This AFC enable signal is sent through a signal line 363A from the first input terminal 351 to a control subsection 371C of the D/A converting section 362. The AFC enable signal is turned on when the AFC operation is to be initiated, and turned off to terminate the AFC operation. The output terminal 352 is a terminal for outputting an AFC ready signal (or AFC permission signal) which is sent from the control subsection 371C through a signal line 363B. The signal of the line 363B is identical to the signal of a line 364B. The AFC ready signal is brought to the off state simultaneously when the AFC enable signal is brought to the off state. The second input terminal 353 receives an up/down signal and delivers the up/down signal to an F register (or offset data register) 373 of the D/A converting section 362 through a signal line 363C. The third input terminal 354 receives a clock signal and delivers the clock signal to the F register 373 through a signal line 363D. The count up/down operation of the F register 373 is determined by these signals.

The D/A converting section 362 comprises a D/A converter 371, a LPF 372 and the above-mentioned F register 373. This D/A converting section 362 is arranged to determine an output quantity in accordance with not only V data supplied from the data generating section 361 but also F data which is a result of the AFC operation. Therefore, the LPF produces an output voltage Vc 365 representing the thus-determined output quantity.

The D/A converter (or converting means) 371 in the example shown in FIG. 25 comprises an integrator (or integrating subsection or means) 371A, a sample-and-hold circuit (or means) 371B, and the above-mentioned control subsection (or control means) 371C for producing the AFC ready signal and controlling the conversion.

The AFC ready signal producing and conversion controlling subsection 371C receives the AFC enable signal through the signal line 363A. If a DAC (digital-to-analog conversion) operation is not being performed, then the control subsection 371c delivers the AFC ready signal immediately upon receipt of the AFC enable signal. If the DAC operation is under way, then the control subsection 371C waits until the DAC operation terminates, and delivers the AFC ready signal at the end of the DAC operation. Furthermore, the control subsection 371C compares the value of the V register with the value of the F register 373, and causes the DAC operation to terminate when the value of the V register becomes equal to the value of the F register 373 (while on the other hand, in a conventional system the DAC operation is terminated when the value of the V register is reduced to zero). As a result, the control subsection 371C causes the DAC operation to terminate sooner (than the conventional system) when the value of the F register 373 is positive. In the case that the value of the F register 373 is smaller than zero, the V register counts down through zero further to the negative side, and the DAC operation terminates when the value of the V register with the sign of the highest order bit of one becomes equal to the value of the F register 373. This operation corresponds to an addition of the value of V register and the value of the F register, and the is control subsection 371 serves as a means for adding the value (or count) of the F register to the value (or count) of the V register. In the count-down operation, the count of the V register is reduced by one in response to each pulse of a clock. The control subsection 371C may be in the form of a logic array or a RISC chip.

Figure 26:
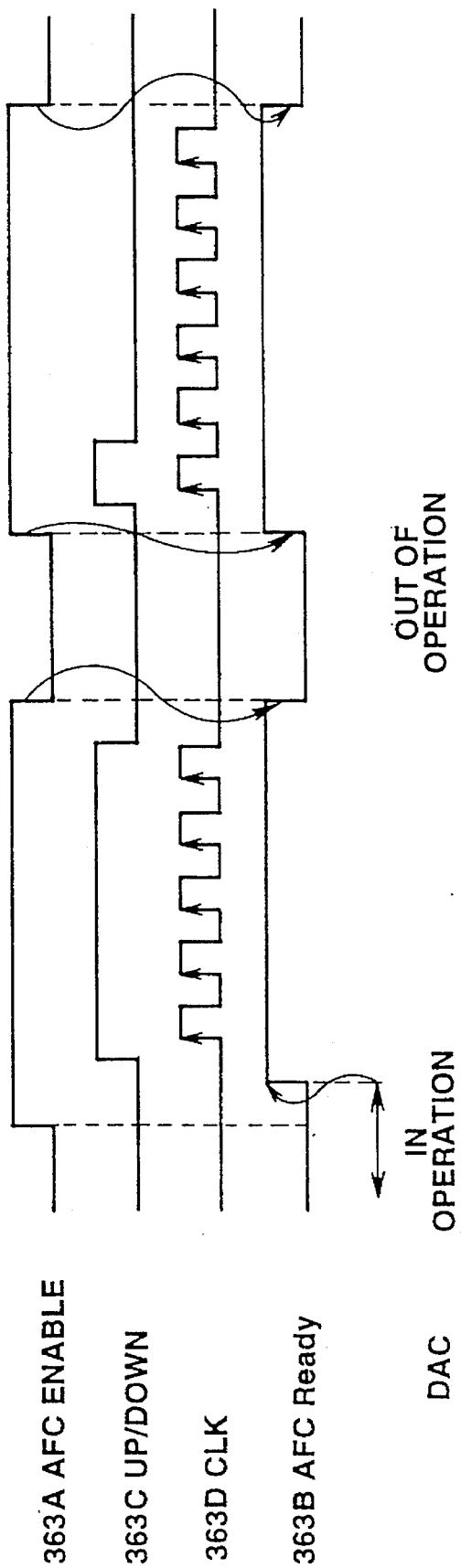
FIG. 26 is a time chart showing signals appearing in the example shown in FIG. 25.

The F register 373 is counted up or down by the clock signal and the up/down signal during the presence of the AFC ready signal. The F register 373 is put in a down-count state when the frequency is to be increased, and in an up-count state in order to decrease the frequency. FIG. 26 shows a timing relationship among the enable signal, the AFC ready signal, the count up/down signal, and the clock signal when the DAC is in operation and when the DAC is out of operation.

The speed of DAC is sufficiently high by virtue of the recent LSI semiconductor technology, even in the case of the integration type. Accordingly, a delay of the AFC ready signal with respect to the AFC enable signal due to the DAC operation being in progress does not pose a problem. In the left part of FIG. 26, the F register 373 counts five pulses of the clock signal of the line 363D upward while the up/down signal of the line 363C is in the high signal level. In the right part of FIG. 26, the F register 373 counts down by four. In the example, the adjustment speed is improved by changing the LSB weight of the F register 373, and in this case, however, the fineness is eliminated. Another way is to increase the speed of the clock signal. The recent LSI technology makes it possible to make the speed of the clock signal significantly high without increasing the manufacturing cost. The AFC process is performed in the following manner. The apparatus for communication on which the DTCXO is mounted performs the following steps.

(1) First step is to bring the AFC enable signal to the on state, and to input this signal to the terminal 351.

(2) Second step is an operation to confirm that the AFC ready signal from the terminal 352 is on.

(3) Third step; To determine the direction by inputting the up/down signal to the terminal 353.

(4) Fourth step; To send a predetermined number of clock pulses of the clock signal of an appropriate speed (or of an appropriate pulse repetition rate). The number of clock pulses corresponds to an amount of frequency adjustment. (The number of required pulses can be readily calculated since the sensitivity ppm per one pulse is known.)

(5) Fifth step; To turn off the AFC enable signal.

(6) Sixth step; To check the new frequency resulting from the frequency adjustment, to proceed the first step (1) if a readjustment is required, and to terminate the AFC process if it is not necessary.

Figure 27:
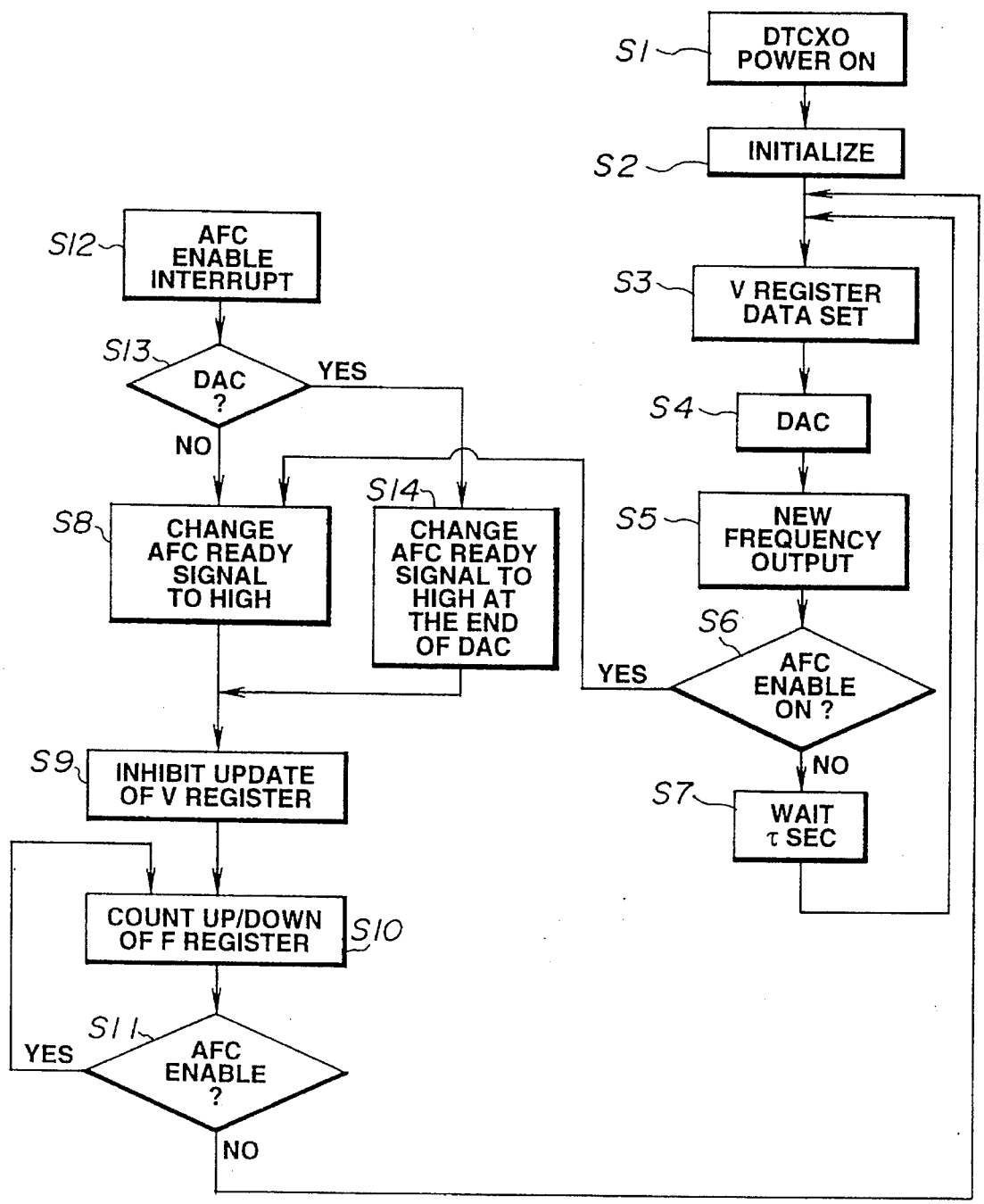
FIG. 27 is a flow chart showing a control procedure performed by the system shown in FIG. 25.

On the other hand, the DTCXO system is operated as shown in a flowchart of FIG. 27.

At a step S1 of FIG. 27, the power supply of the DTCXO is turned on. Then, the DTCXO performs an operation of initialization at a step S2, and sets the data in the V register at a step S3. A fourth step S4 is a DAC control step in which the DAC control is performed. As the result of the DAC control of the step S4, a new frequency output is obtained at a step S5.

At a step S6, the DTCXO (or the control subsection 371C of the DTCXO) determines whether the AFC enable signal is in the on state or not. If it is not, the DTCXO waits for τ sec at a step S7, and then returns to the step 3. If the AFC enable signal is on, then the DTCXO proceeds from the step S6 to a step S8 at which the control subsection 371 turns the AFC ready signal to a high state. After the step S8, the DTCXO inhibits the data setting operation (or update operation) of the V register of the subsection 361c, at a step S9, by causing the data inhibit signal generating subsection 361d to produce the inhibit signal in response to the AFC ready signal. Then, at a step S10, the F register 373 counts pulses of the clock signal in the upward or downward direction determined by the up/down signal. At a next step S11, it is determined whether the AFC enable signal is on. If it is, then the program returns to the step S10. If the answer of the decision step S11 is negative, then the program returns to the step S3.

A step S12 is a step for AFC enable interrupt. When an interrupt occurs, the DTCXO (or the control subsection 371C of the DTCXO) determines, at a step S13, the DAC operation is in progress, or not. If the DAC is out of operation, then the AFC ready signal is changed high at the step S8. If the DAC is in operation, the AFC ready signal remains low until the end of the DAC operation, and is changed to high at the end of the DAC operation at a step S14. The step S14 is followed by the step S9.

Figure 28:
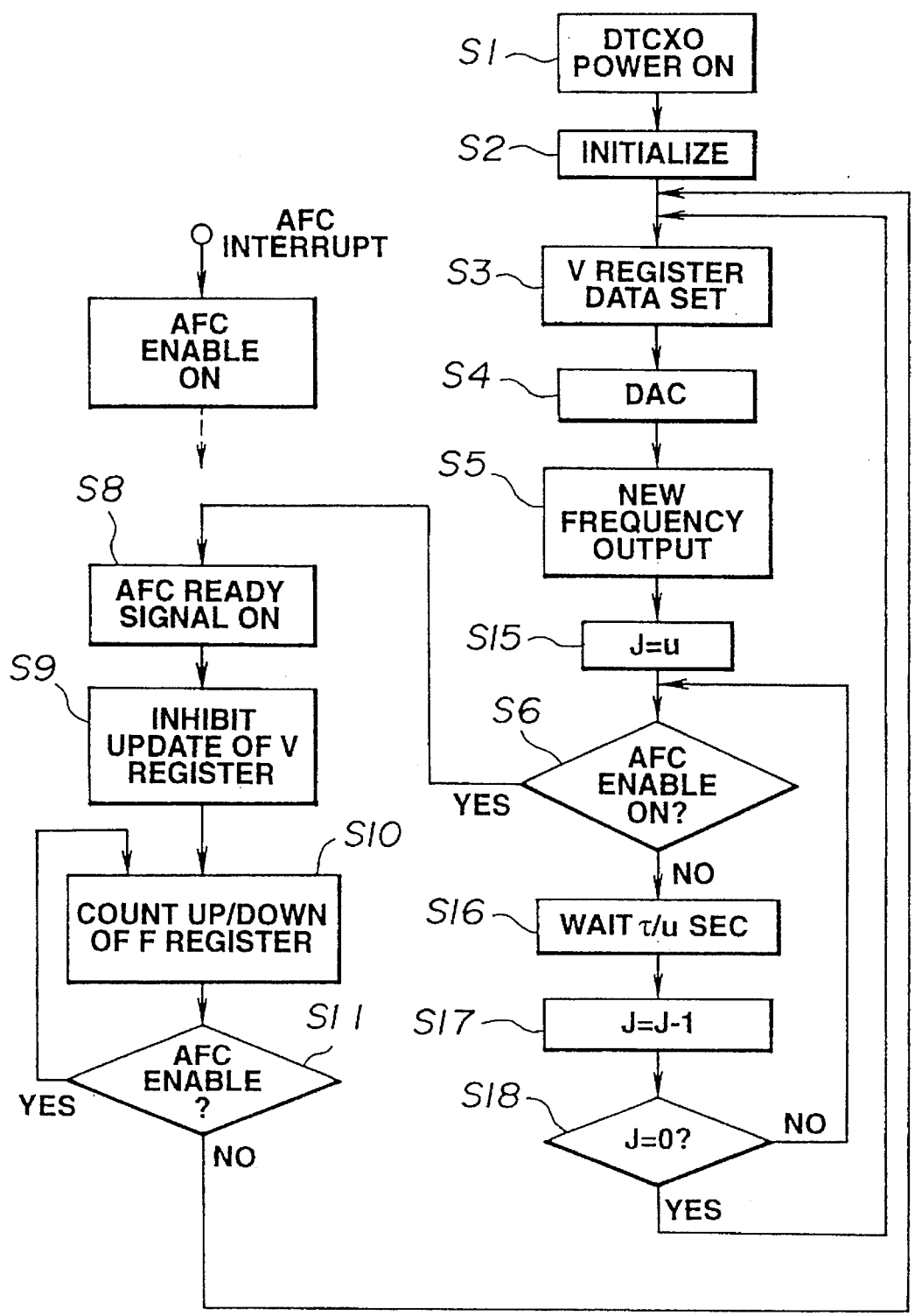
FIG. 28 is a flow chart showing a modification of the control procedure shown in FIG. 27.

FIG. 28 shows a modification of the procedure of FIG. 27. Steps S1~S6 and S8~S11 of FIG. 28 are substantially identical to the steps S1~S6 and S8~S11 of FIG. 27. In FIG. 28, a step S15 is interposed between the steps S5 and S6. At the step S15, J is set equal to u (J=u). The step S7 of FIG. 27 is replaced by steps S16, S17 and S18 shown in FIG. 28. If the answer of the step S6 is negative, the DTCXO waits for t/u seconds at the step S16, and then decrements J at a step S17 (J=J−1). Next, it is determined whether J is equal to zero or not at the step S18. If J is not equal to zero, then the DTCXO returns to the step S6. If J=0, then the DTCXO returns to the step S3. The example shown in FIG. 28 can facilitate the rise (or buildup) of the AFC ready signal. The sixth embodiment can be implemented by using a combination of a DSP (digital signal processor) and F/W(firmware) in a manner as shown in FIGS. 27 and 28, and the size of the system can be reduced by the LSI technology.

The sixth embodiment can make the control of the communication device equipped with DTCXO logical, simple and accurate, and reduce the cost and the size of the whole of a set. Furthermore, by making the weight of LSB of the F register 373 $2^M$ times (M=1, 2, 3 . . . ) as high as that of the V register, the sixth embodiment enables high speed adjustment. The speed can be further increased by reducing the width (or pulse interval) of the clock signal. In the examples of FIG. 28, the adjustment can be done quickly without waiting for τ sec. The sixth embodiment employs a quasi adder, and requires no hardware component of an actual adder, which contributes to the size reduction and cost reduction.

Figure 29:
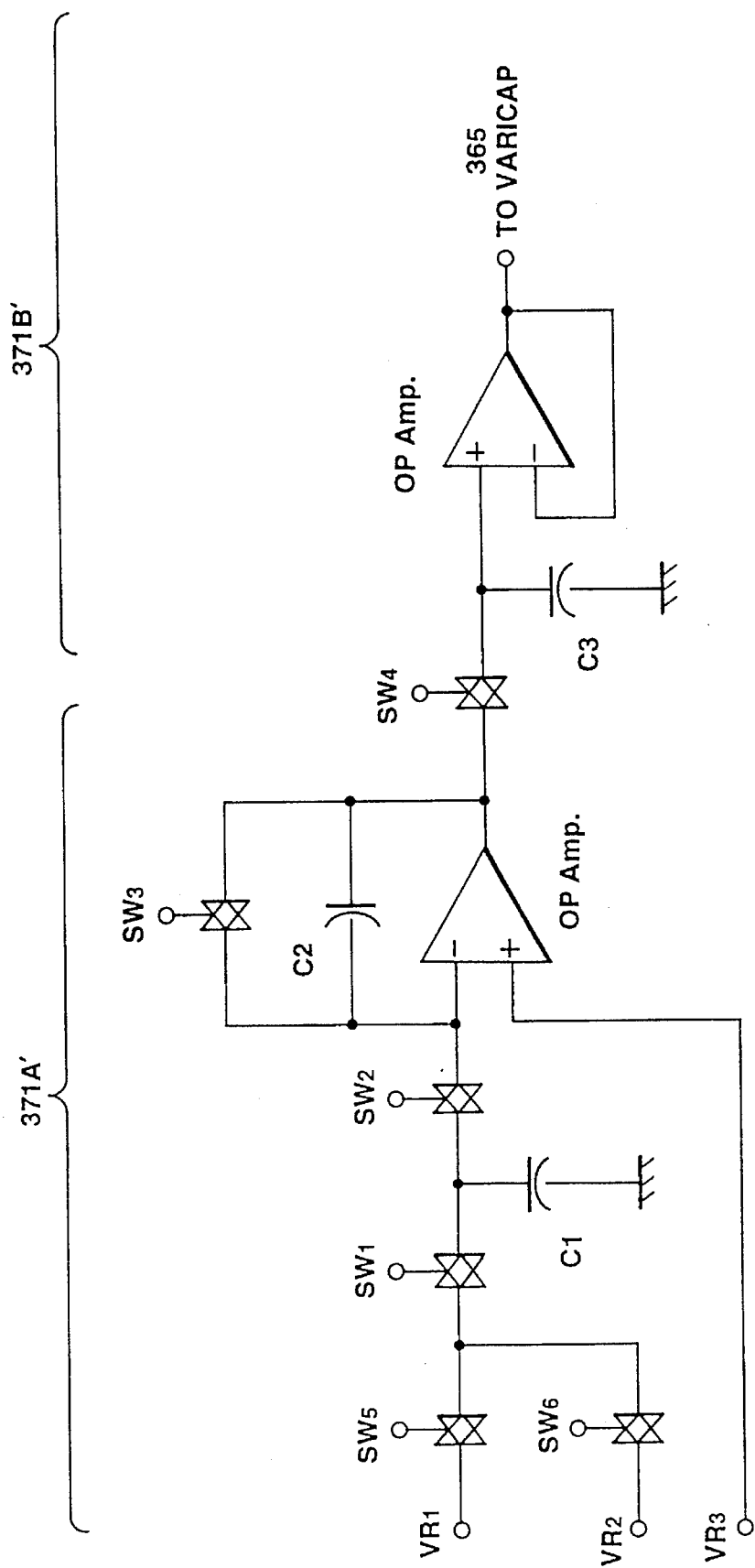
FIG. 29 is a circuit diagram for showing a part of a control system according to a seventh embodiment of the present invention.
Figure 31:
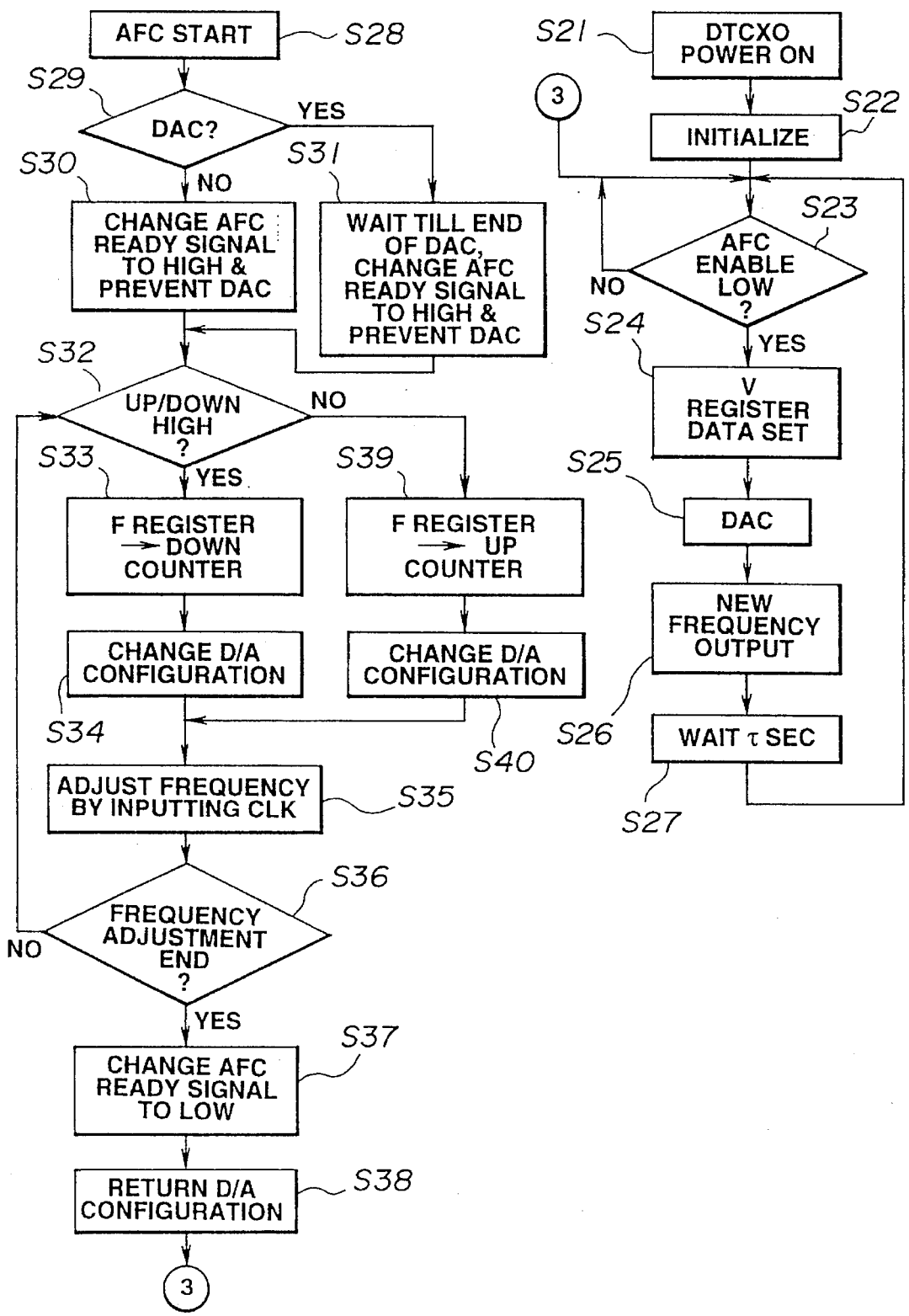
FIG. 31 is a flow chart showing a control procedure performed by the system according to the seventh embodiment.

[III-iii] Seventh Embodiment shown in FIGS. 29–31

A seventh embodiment is substantially identical in the basic arrangement to the system shown in FIGS. 24 and 25. In the system according to the seventh embodiment, however, integrator 371A' and sample-and-hold circuit 371B' are arranged as shown in FIG. 29. The circuitry shown in FIG. 29 is different in semiconductor switches $SW_5$ and $SW_6$ from the system of the sixth embodiment in which the portion corresponding to the switch $SW_5$ is short-circuited, and the portion of $SW_6$ is open, and there is no input corresponding to $VR_2$.

The combination of the circuits 371A' and 371B' shown in FIG. 29 comprises six semiconductor switches $SW_1$~$SW_6$, two operational amplifiers (OP Amp.), and three capacitors $C_1$~$C_3$. The semiconductor switches $SW_1$~$SW_6$ are controlled on and off by the AFC signal generating and conversion control subsection 371C (shown in FIG. 25) in a manner shown in a table (III-1) of FIG. 30. The control terminal of each of the semiconductor switches $SW_1$~$SW_6$ is connected with the control subsection 371C. In FIG. 30, the portions denoted by reference numerals 381 and 382 are characteristic of the seventh embodiment, and the remaining portion is known. Terminals $VR_1$, $VR_2$ and $VR_3$ are connected with a stabilized common reference power supply (Vr) through a circuit of resistors as a voltage divider. When, for example, 2Vr, 1.6Vr and 1.8Vr are chosen for $VR_1$, $VR_2$ and $VR_3$, then $VR_2$ is arranged with respect to $VR_1$ so that the same value is subtracted each count down.

The circuit system of FIG. 29 is operated as shown in FIG. 31. The power source of the DTCXO system is turned on at a step S21. A second step S22 is for initialization. Then, at a step S23, the system determines whether the AFC enable signal is in the low state or not. If the AFC enable signal is low, then the data is set in the V register at a step S24. After the data setting operation of the step S24, the DAC operation is performed at a step S25, and as a result, a new frequency output is obtained at a step S26. Then, the system waits for τ sec at a step S27, and then returns to the step S23. The DAC operation of the step S25 is the same as that of the sixth embodiment, and the DAC operation comes to an end when the V register is counted down to the value of the F register. The end of the DAC operation is determined not by the down count of the V register to zero, but by the comparison between the V register and F register, as in the sixth embodiment. Thus, the F register 373 temporarily stores the count which is the result of the AFC operation, and this count stored in the F register 373 is used as an offset value. The control subsection 371C serves as an adder or a means for addition.

A step S28 is a step for starting the AFC operation. At the step S28, the AFC enable signal is turned to the high state by an external device from the outside. At a step S29 following S28, the system determines whether the DAC is in operation or out of operation. If the DAC is not being performed, then the system changes the AFC ready signal to the high state, and prevents the DAC operation from being initiated at a step S30. If the DAC operation is under way, then the DAC operation currently being performed is allowed to proceed, the AFC ready signal is changed high at the end of the current DAC operation, and the next DAC operation is prevented at a step S31.

A step S32 follows the step S30 or the step S31. At the step S32, the count direction of the F register 373 is determined by the up/down signal. If the up/down signal is in the state indicating the down direction, then the F register 373 is set in the state of a down counter (for making the frequency higher) at a step S33. After the step S33, the configuration of D/A is changed at a step S34. If the up/down signal is in the state of the up direction, then the F register 373 is set in the state of an up counter (for making the frequency lower) at a step S39, and the configuration of D/A is changed at a step S40.

At a step S35 following the step S34 or S40, the frequency is adjusted by inputting clock pulses. A next step S36 is for determining whether the frequency adjustment has been completed or not. If the answer of the step S36 is NO, then the system returns to the step S32. If the frequency adjustment is finished, then the system proceeds from the step S36 to a step S37 where the control subsection 371C changes the AFC ready signal to the low state. Thereafter, the DAC configuration is restored to the original state at a step S38, and the program proceeds from the step S38 to the step S23.

At the step S34 or S40, the states of the semiconductor switches $SW_3 \sim SW_6$ are determined in the case of increment or decrement as shown in the portion 382 of the table in FIG. 30. When $SW_4$ is on, a sampling hold voltage is added in a manner of analog addition in accordance with the count of the F register. The integration is carried out when $SW_3$ is OFF, and the direction of the integration is determined by $SW_5$ and $SW_6$. At the step S38, the switches $SW_1 \sim SW_6$ are set in the states of the $SW_1 \sim SW_6$ immediately before DAC shown in FIG. 30.

In the seventh embodiment, AFC can be performed in an analog region without increasing the size and cost of DTCXO, and accordingly the AFC operation becomes easier and faster. This embodiment allows a high speed AFC in the analog region without need for increasing the speed of the digital logic system. In this embodiment, it is not necessary to increase the speed of the control of the DTCXO (The cycle time τ is in the order of a few seconds, lower than 10 seconds.).

In the illustrated examples according to the fifth, sixth and seventh embodiments based on the third aspect of the invention, a DTCXO system comprises:

a digital temperature compensation data generating means or section (such as 331 or 361) for generating a digital temperature compensation data signal representing a magnitude of a temperature compensation quantity which is a function of a sensed temperature; and a digital-to-analog converting means or section (such as 302 or 302) for converting said digital temperature compensation data signal to an analog temperature compensation data voltage signal;

a voltage controlled crystal oscillating means or section (such as 303, 304) for producing an output frequency which is varied in accordance with the analog temperature compensation data voltage signal;

wherein the DTCXO system further comprises a temperature compensation data registering means (such as the V register of 331c or 361c for storing the magnitude of the digital temperature compensation data signal), an offset data registering means (a register or a counter or some other means) (such as 342, 350, 373) for storing a magnitude of an offset data signal, and an adding means (such as 341 or 371C) for causing said digital-to-analog converting section to producing said analog compensation data voltage signal corresponding to a sum of said compensation data signal and said offset data signal.

The adding means may be in the form of an adder as in the fifth embodiment, or may be in the form of a control section for controlling the D/A conversion as in the sixth and seventh embodiments.

(IV) Eighth Embodiment shown in FIGS. 34–42

Recently, as mentioned before, the carrier frequency spacing (12.5 kHz, for example) and the modulation band width (5 kHz, for example) are becoming narrower, and the required precision of the frequency source is becoming more severe, as the following equation.

$$|\Delta f/f| \leq 1 \text{ ppm} \qquad \text{(IV-1)}$$

DTCXO can fulfill this equation (IV-1) in a wide temperature range of –40° C.–85° C. with a small size at a reduced cost.

In a mobile communication system, communication is often carried out between a mobile station and a stationary base station. In this case, there are two different types. In one type, a source for oscillation frequency is provided in each station, and operated within a predetermined allowable range of frequency deviations. In the other type, the frequency of the stationary base station is followed up by a frequency source of the mobile station. The latter function is required specifically in the case of DTXCO.

Figure 40:
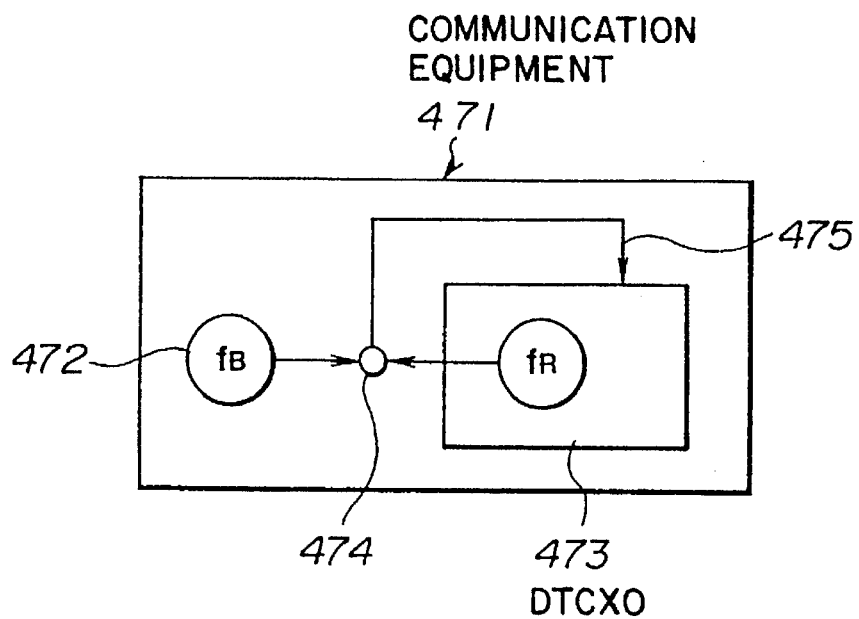
FIG. 40 is a schematic view showing a mobile communication equipment unit.

FIG. 40 shows a communication equipment unit 471 for a mobile station. This unit 471 has a sensing section 472 for sensing a frequency $f_B$ of a stationary base station, a DTCXO 473, and a comparator 474 for determining a frequency deviation which is a difference between the base station frequency $f_B$ and the frequency $f_R$ of the DTCXO 473. By using a voltage 475 corresponding to this frequency deviation, the frequency of the DTCXO is controlled in the form of a follow-up control.

Figure 41:
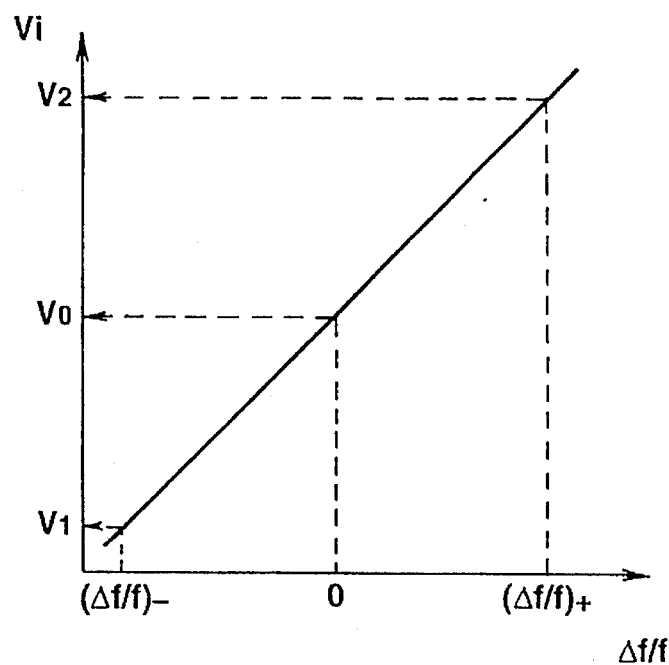
FIG. 41 is a graph showing a characteristic between frequency deviation information and a control (or correction) voltage.

FIG. 41 shows a characteristic between the above-mentioned frequency deviation and voltage Vi. In this example, the voltage is equal to $V_0$ when the frequency deviation ($\Delta f/f$) is zero, equal to $V_1$ when $\Delta f/f$ is negative one, and equal to $V_2$ when $\Delta f/f$ is positive one. The characteristic of this example is linear. The slope of the characteristic straight line shown in FIG. 41 is varies from communication equipment unit to unit. Numerical examples are shown in a table (IV-1) of FIG. 42.

In order to attain the required stability, miniaturize the equipment and reduce the cost, the above-mentioned DTCXO employs a one-chip LSI in which a crystal unit having a relatively large deviation (15 ppm, for example) in relation to temperature, and other functional components are integrated. In such a DTCXO, analog nonlinearity and errors in the temperature sensitivity of a temperature sensor in the LSI and the voltage versus capacitance sensitivity of a varactor diode are corrected with digital compensation data, and a standard temperature (20 ° C., for example) bias deviation of a resonance frequency of a crystal is corrected by a selective on/off control with a semiconductor switch of a varactor diode connected equivalently in series to the crystal unit. Therefore, it is not possible to obtain desired characteristics (sensitivity, linearity and the quality of offset) simply by providing a terminal for the varactor diode, and applying control voltage information shown in FIG. 41. Consequently, it is difficult to deal with different types of the mobile communication equipment, and variations from unit to unit of the equipment. Now, the quality of offset means that $\Delta f/f$ (control of deviation) is zero even when the voltage $V_0$ shown in FIG. 41 is applied.

In some examples, VCXO (voltage-controlled crystal oscillator) and H/W circuit are provided in parallel, and these are switched with S/W or H/W switch. However, this system is disadvantageous in that this system tends to increase the size and cost, and makes it difficult to continue the temperature compensation.

The eighth embodiment of the present invention is designed to provide a digital temperature compensated crystal oscillator system or circuit which is superior in linearity with respect to a control voltage, which can achieve the desired quality of offset, and which can allow the continuation of the temperature compensation.

Figure 34:
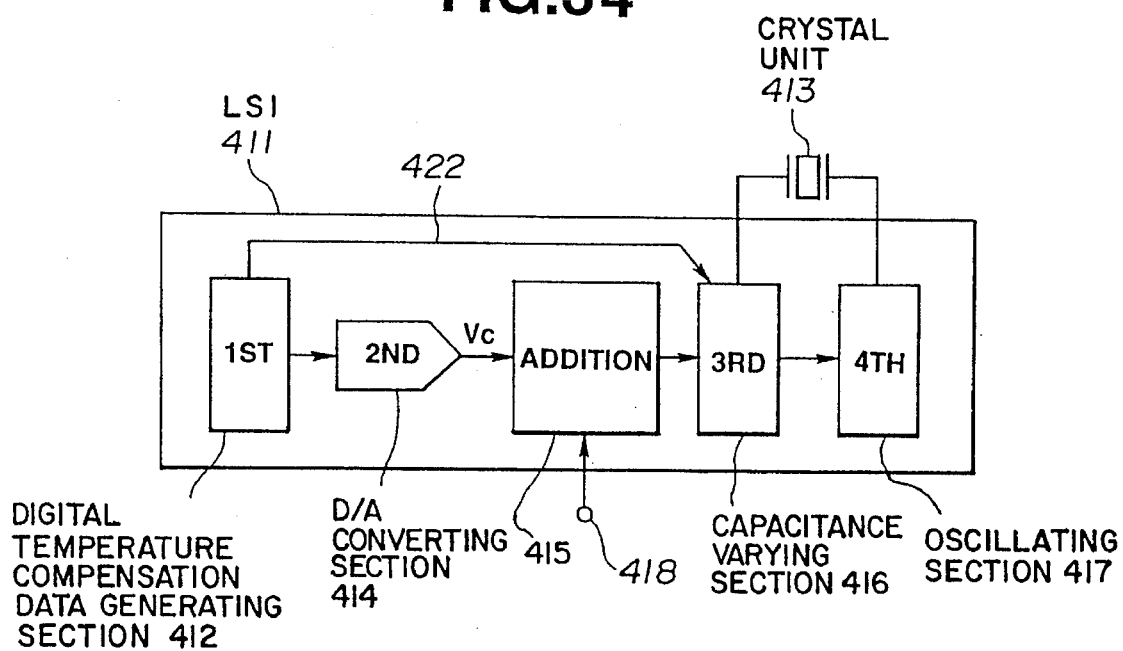
FIG. 34 is a schematic view showing a DTCXO according to an eighth embodiment of the present invention.

FIG. 34 shows a practical example according to the eighth embodiment of the invention. A DTCXO system shown in FIG. 34 comprises a single LSI chip 411 which comprises a first functional section 412, a crystal unit (or crystal element) 413, a second functional section 414, an adding section 415, and third and fourth functional sections 416 and 417.

The first functional (or temperature compensation data generating) section 412 performs a function of sensing an ambient temperature of the crystal unit 413 and producing an analog voltage Vt corresponding to the sensed temperature, a function of analog-to-digital conversion for obtain a digital data item T from the analog voltage Vt, and a function of storing a collection of temperature compensation data Dc in a storage device such as a ROM. The first functional section 412 of this example further has functions of generating a reference voltage Vr, data decoding, and a sequence function about starting operation. The digital decoded data T of the first functional section 412 is outputted to the second functional section 414.

The second functional (digital-to-analog converting) section 414 performs a converting function of digital-to-analog conversion for converting the digital decoded data supplied from the first section 412 to an analog voltage Vcw, and a smoothing function of producing an analog voltage Vc by smoothing the analog voltage Vcw with a smoothing circuit. The output voltage Vc of the second functional section 414 is applied through the adding section 415 to a varactor diode of the third functional section 416.

The third functional (capacitance varying) section 416 performs a function of voltage-to-capacitance conversion for temperature compensation of the frequency of the crystal, and a correcting function of correction for oscillator circuit constant deviation involved the crystal unit's frequency by a signal 422.

The fourth (oscillating) section 417 performs an active function of oscillation. In this example, the fourth section 417 comprises a CMOS transistor for performing this active function. The crystal unit 413 is connected between this fourth section 417 and the third section 416.

The system shown in FIG. 34 further comprises an input terminal 418 for receiving a frequency deviation signal representing a frequency deviation. In this example, the frequency deviation is a difference between the output frequency of the fourth functional section 417 and a frequency outputted from another oscillator (for example, the frequency of the stationary base station as in the example shown in FIG. 40.). The frequency deviation signal inputted to the input terminal 418 is in the form of a correction voltage Vi.

The adding section 415 receives the analog compensation data voltage Vc as a first input signal, from the second functional section 414, and the correction voltage Vi as a second input signal, from the terminal 418, and produces a sum voltage signal by adding the first and second input signals. The sum voltage signal is supplied as a control voltage, to the third section 416.

Figure 35:
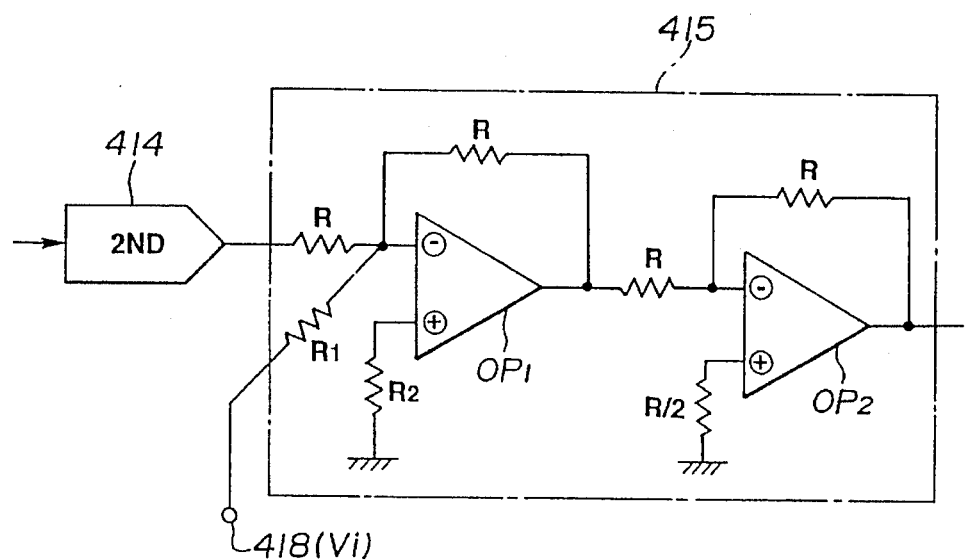
FIG. 35 is a diagram showing a circuit which can be used as an adding section 415 shown in FIG. 34.

FIG. 35 shows one practical example of the adding section (or means) 415. In this example, the adding section 415 is in the form of an adder circuit comprising first and second inverted operational amplifiers $OP_1$ and $OP_2$ (each composed of an operational amplifier), which are connected in tandem. FIG. 35 shows an equivalent circuit of the adder circuit, and it is possible to fabricate the adder circuit in various LSI designs with various LSI circuit components. Voltage dividing resistors R of the operational amplifiers $OP_1$ and $OP_2$ have a resistance of 50 k$\Omega$, for example. In order to make the level of the sensitivity ViS of the correction voltage Vi inputted from the input terminal 418 equal to the level of the sensitivity VcS of the voltage Vc supplied from the second functional section 414, a first resistor $R_1$ of FIG. 35 is chosen in accordance with the following equation (The sensitivity is a degree of frequency variation with respect to a unit voltage of Vi or Vc.)

$$R_1 = (VcS/ViS) \cdot R \qquad (IV\text{-}2)$$

A second resistor R2 shown in FIG. 35 is given by:

$$R_2 = R_1 R/(2R_1 + R) \qquad (IV\text{-}3)$$

According to this equation (IV-3), it is possible to determine a value of R2 in the equivalent circuit shown in FIG. 35. A reference voltage Vref is set at or about 2.4 V, for example, so that the DTCXO can operate in a wide supply voltage range of 3 V~5 V. The voltage Vc(max) of the second functional section 414 is also chosen at a lower level near this reference voltage Vref. When, for example, the frequency range of the crystal unit of the temperature compensated oscillator circuit is 22 ppm, then the above mentioned sensitivity VcS is equal to about 9 ppm/volt.

Figure 36:
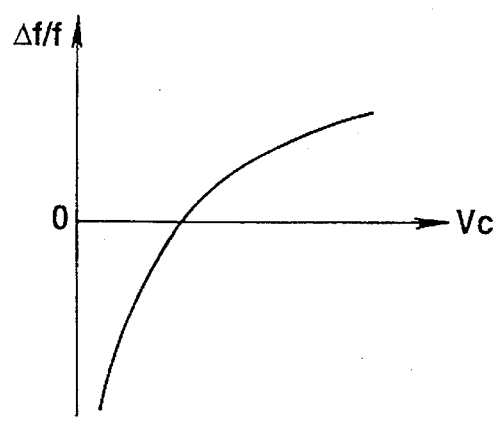
FIG. 36 is a graph for illustrating a nonlinear voltage versus capacitance characteristic of a varactor diode and a variation of an oscillation frequency with respect to a control voltage when the capacitance of the varactor diode is connected in series to a crystal unit.

In the example of Table IV-1, the required sensitivity ViS is 3 ppm/volt. Therefore, the equation (IV-2) yields; $R_1 = 3R$. Thus, by using the equation (IV-2), the sensitivities can be readily adjusted. In general, the voltage versus capacitance characteristic of a varactor diode is generally nonlinear, and in a configuration in which its capacitance is introduced in series to the crystal unit, a variation of the frequency with change in the correction or control voltage is in the form of such a curve, as shown in FIG. 36, that the sensitivity is high when the voltage Vc is low, and the sensitivity is low when Vc is high. Accordingly, it is possible to improve the linearity by utilizing a part of the curve.

In the first example shown in FIG. 35, the first resistor R1 for control voltage sensitivity adjustment is a built-in resistor formed in the LSI chip. Another example is arranged so that all or a part of the built-in resistor in the LSI is formed in the form of a resistor attached to a device external to the input terminal 418. This second example makes it easier to adjust the sensitivity adequately from type to type of the equipment on which the DTCXO is incorporated, and from item to item of the equipment. With this external sensitivity adjusting resistor external to the LSI chip 411, it is possible to absorb errors in the fabrication process of the one-chip LSI of the DTCXO. Furthermore, this second example further enables a later-mentioned sensitivity adjustment with a capacitance of a varactor diode.

In the above-mentioned first and second examples, the correction (or control) voltage Vi can be added to the compensation voltage Vc. However, these examples do not always satisfy the condition that Δf/f=0 when Vi is equal to $V_0$. This can be achieved by adding ($-V_0$) to a summing point 430 of the adding section 415 as in an example shown in FIG. 37 or in an example shown in FIG. 38.

Figure 37:
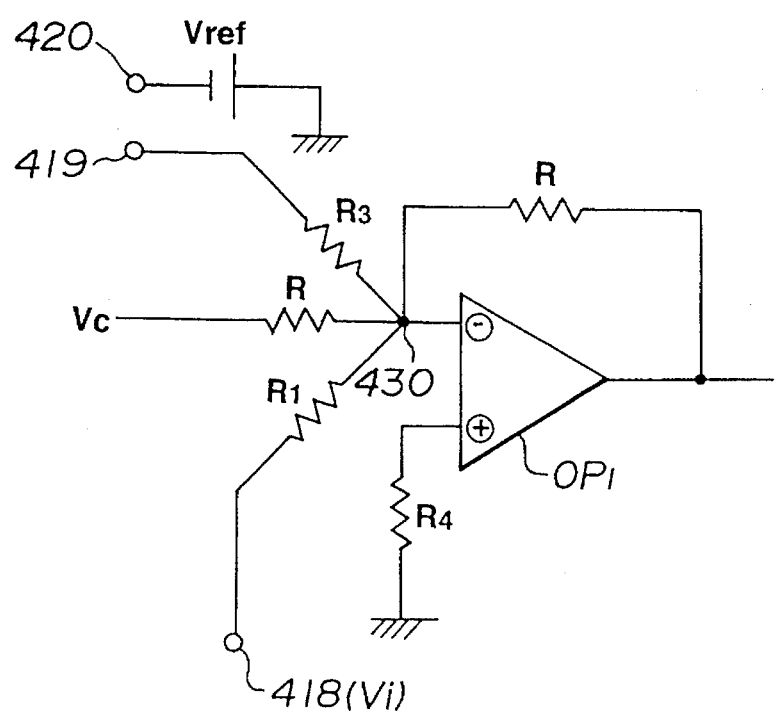
FIG. 37 is a circuit diagram showing a resistor $R_3$ which can be employed in the adding section of the DTCXO system according to the eighth embodiment.
Figure 38:
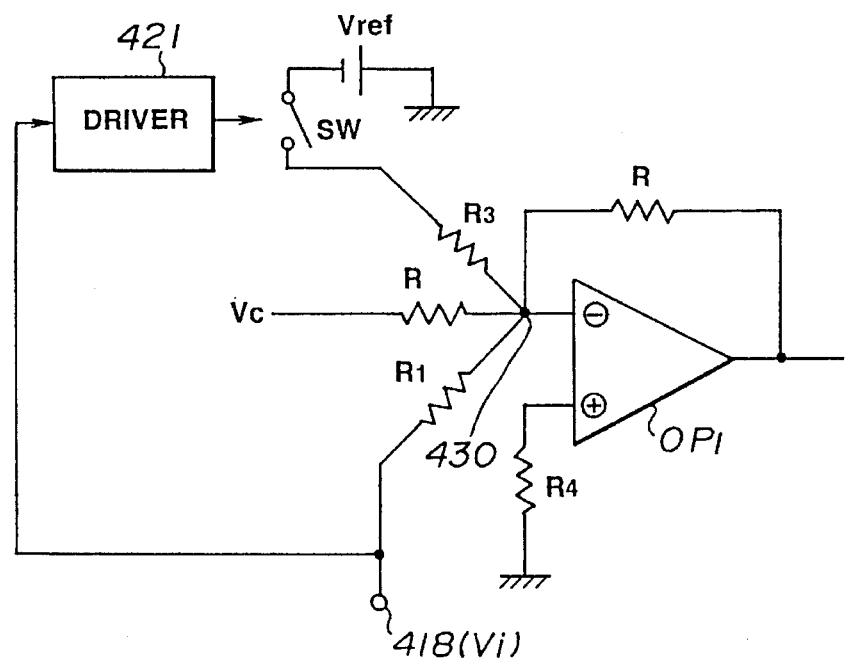
FIG. 38 is a circuit diagram showing a switch and a driver circuit 421 for controlling a connection of the resistor $R_3$.

In the examples of FIGS. 37 and 38, a third resistor $R_3$ is connected to the summing point 430. The compensation voltage Vc is applied through the resistor R to the summing point 430 while the correction voltage Vi is applied through the resistor $R_1$ to the summing point 430 which is connected to the inverting input of the operational amplifier $OP_1$, as shown in FIG. 37. In the examples of FIGS. 37 and 38, the resistor $R_3$ is determined by the following equation.

$$R_3=(V_{ref}/V_0) \cdot R \qquad \text{(IV-4)}$$

Therefore, a fourth resistor $R_4$ between the noninverting input of the operational amplifier $OP_1$ and the ground is determined by the following equation.

$$R_4=R_2R_3/(R_2+R_3) \qquad \text{(IV-5)}$$

In the example of FIG. 37, terminals 419 and 420 are short-circuited by an external means when the function of VCXO is to be operated. In the example shown in FIG. 38, there is provided an internal means. In this example, an analog switch SW is connected between the resistor $R_3$ and the Vref, and there is further provided a driver circuit 421 for comparing the correction voltage Vi with a predetermined voltage such as $V_1$ shown in Table IV-1, and for switching on the switch SW shown in FIG. 38 when the Vi is greater than $V_1$, for example. In this way, the Vref voltage is applied to the summing point 430 through the resistor $R_3$ to offset the correction (or control) voltage corresponding to a frequency deviation control quantity of zero.

Figure 39:
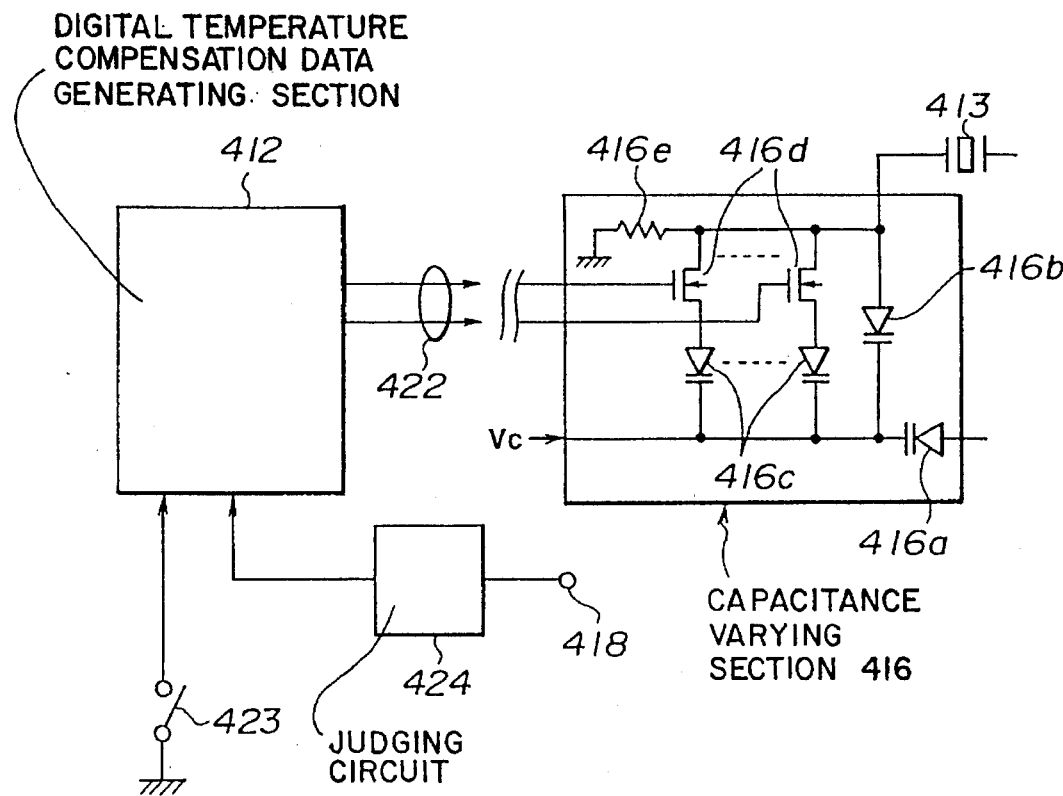
FIG. 39 is a circuit diagram showing one example of a third functional section 416 according to the eighth embodiment.

FIG. 39 shows another example for offsetting $V_0$. In this example, the first functional section 412 is connected with the third functional section 416 by a selection signal line 422 which comprises one or more signal lines, as shown in FIG. 39. The third function section 416 comprises first and second varactor diodes 416a and 416b, and one or more additional varactor diodes 416c. The capacitance of each of these varactor diodes is varied by the control voltage Vc or the output voltage of the adding sect 415. The circuit shown in FIG. 39 is a part of a Colpitts oscillator circuitry. The varactor diode 416a serves as a source capacitance of a CMOS transistor formed in the fourth functional section 417 shown in FIG. 34.

Each of the varactor diodes 416b and 416c serves as a series capacitance of the crystal unit 413, and a resistor 416e forms a receiving circuit of the control voltage Vc. The third functional section 416 further comprises one or more semiconductor switches 416d. In the example shown in FIG. 39, there are provided a plurality of the varactor diodes 416c and a plurality of the semiconductor switches 416d. Each semiconductor switch 416d is connected in series to a unique one of the varactor diodes 416c. Each series combination of one varactor diode 416c and one switch 416d is connected in parallel to the varactor diode 416b. Therefore, each varactor diode 416c is connected in parallel to the varactor diode 416b when the corresponding semiconductor switch 416d is on, and disconnected when the switch 416d is off. The semiconductor switches 416d are controlled on and off by the selection signal sent through the signal line 422 from the first functional section 412, for the purpose of correcting an adjustment error of the frequency of the crystal unit itself and a deviation in a design value of a circuit constant of the oscillator circuit (for example, a deviation of an equivalent capacitance of 416a from an expected value).

During the fabricating process of the DTCXO, on/off data for connecting and disconnecting the varactor diodes 416c for offset corresponding to $V_0$ is stored, together with other data such as temperature compensation data, in a storage device such as a ROM in the first functional section 412. In the example shown in FIG. 39, a switch 423 and/or an internal judging circuit 424 is connected with the first functional section. When the switch 423 is switched on manually, the first functional section 412 sends the stored on/off data through the signal line 422 and controls the third functional section 416. The internal judging circuit 424 is connected between the input terminal 418 and the first functional section 412, and arranged to compare the correction voltage Vi with a predetermined voltage such as $V_1$, and causes the first functional section 412 to deliver the on/off data signal through the signal line 422 when the Vi is equal to or higher than the predetermined voltage such as $V_1$. The internal judging circuit 424 can be also integrated in the LSI.

The DTCXO system according to the eighth embodiment is superior in linearity with respect to the control voltage, and capable of offsetting the control voltage. Furthermore, the system can be arrange to automatically start the offset operation when the control voltage is equal to or greater than a predetermined value, and enables the offset operation while the temperature compensation of the VCXO is being continued. When an integrated circuit such as a LSI is incorporated in the DTCXO, the integrated circuit comprises both of an analog circuit and a digital circuit. Therefore, the eighth embodiment is advantageous in the configuration of the LSI, and in the cost.

The system according to the eighth embodiment may further comprises a comparing means (such as the comparator 474 shown in FIG. 40) for comparing the output frequency of the DTCXO with a standard frequency of a second oscillator (which may be included in the system or may be external to the system) and for producing a frequency deviation signal to be supplied to the input terminal 418. The system may comprises a sensing means (such as the sensing section 472 shown in FIG. 40). In this case, the system further comprises the comparing means for comparing the output frequency of the DTCXO with the frequency (such as the frequency of the base station) sensed by the sensing means, and for producing the deviation signal to be inputted to the terminal 418.

In the present invention, it is possible to make different practical examples of the invention by combining some of the features of the illustrated examples of the eight embodiments. In particular, it is optional to add, to the illustrated practical example or each of the illustrated practical examples according to each of the first, second, third and fourth aspects of the invention, the characteristic function or functions of any one or more of the other aspects of the invention.

What is claimed is:

1. A digital control system comprising:
   an analog-to-digital converter for converting an analog input signal into a digital input signal;
   a data supplying means for storing information items, receiving said digital input signal and producing a digital output information signal representing a selected information item selected in accordance with said digital input signal; and
   a digital-to-analog converter for converting said digital output information signal into an analog output information signal;
   wherein said digital input signal supplied from said analog-to-digital converter to said data supplying means is divided into a first signal portion and a second signal portion;
   wherein said data supplying means comprises a storage device which stores a plurality of data sets each of which is identified by said first signal portion of said digital input signal, which receives said first signal portion, as an address input signal, from said analog-to-digital converter, and provides a selected data set specified by said signal portion; and
   wherein said data supplying means further comprises a decoding means for receiving said selected data set from said storage device, further receiving said second signal portion of said digital input signal, and producing said information output signal in accordance with said selected data set and said second signal portion of said digital input signal.

2. A digital control system according to claim 1:
   wherein said digital input signal, said first signal portion and said second signal portion are all in a form of a digit string, said digital input signal is divided into said first and second signal portions so that each of the digits of said digital input signal belongs to only one of said first and second signal portions but does not belong to both, a string length q of said first signal portion is smaller than a string length p of said digital input signal, and a string length r of said second signal portion is equal to a difference resulting from subtraction of q from p;
   wherein said storage device stores memory information corresponding to a plurality of addresses which are a qth power of two ($2^q$) in number; and
   wherein said decoding means provides output information corresponding to a plurality of addresses which are a pth power of two ($2^p$) in number.

3. A digital control system according to claim 2:
   wherein the digit string of said digital input signal is a p bit string consisting of a higher order bit string and a lower order bit string following said higher order bit string, the digit string of said first signal portion is a q bit string, the digit string of said second signal portion is an r bit string, one of said q bit string and said r bit string is said higher order bit string, and the other is said lower order bit string, each of p, q and r is a number of bits, p is equal to or greater than two, and each of q and r is equal to or greater than one;
   wherein each of said data sets stored in said storage device is uniquely identified by said q bit string of said first signal portion;
   wherein said data supplying section further comprises an input register for receiving the r bit string of said second signal portion and retaining a numerical value represented by said r bit string as a value of a parameter; and
   wherein said decoding means comprises a calculating means for calculating an output variable represented by said digital information output signal, according to a predetermined mathematical equation by using said selected data set and the value of said parameter stored in said input register.

4. A digital control system according to claim 3 wherein each of said data sets stored in said storage device comprises a first data item, a second data item, and a third data item; and wherein said decoding means further comprises a register group comprising a first intermediate data register for retaining said first data item of said selected data set selected by said first signal portion of said digital input signal, a second intermediate data register for retaining said second data item of said selected data set, and a third intermediate data register for retaining said third data item of the selected data set.

5. A digital control system according to claim 4:
   wherein said digital control system is a digital temperature compensated crystal oscillator system, and further comprises;
   a crystal oscillator which comprises a crystal unit and which is controlled by said analog output information signal supplied from said digital-to-analog converter, and
   a temperature sensor for sensing an ambient temperature of said crystal unit, for producing said analog input signal representing a sensed temperature, and sending said analog input signal to said analog-to-digital converter; and
   wherein said output variable represented by said digital output information signal produced by said data supplying means is a quantity for temperature compensation and a function of the temperature represented by said digital input signal within a predetermined temperature range.

6. A digital control system according to claim 5:
   wherein said crystal oscillator is a voltage controlled crystal oscillator, and said digital-to-analog converter produces said analog output information signal which is an analog voltage signal;
   wherein said storage device comprises a group of storage locations which are $2^q$ in number, and each of which stores said first data item which is a reference data item, said second data item which is a sign data item and said third data item which is slope data item, said reference, sign and slope data items being obtained by data compression from original temperature compensation data;
   wherein said reference data item represents a first value of said output variable in one of temperature sections into which said temperature range is divided, said sign data item represents one of plus and minus signs, and said slope data item represents a rate of change of said output variable with respect to the temperature; and wherein said decoding means further comprises an output data register for retaining a result of calculation of said calculating means and providing said digital output information signal to said digital-to-analog converter.

7. A digital control system according to claim 6 wherein each of said data sets stored in said storage device further comprises a fourth data item which is a slope correction data item comprising a sequence of data elements, and wherein said register group further comprises a fourth intermediate data register for storing said fourth data item.

8. A digital control system according to claim 7 wherein said calculating means includes a means for determining said output variable which is a sum of said reference data item of the selected data set and a product obtained by multiplying a multiplicand by said sign data item of the selected data set, said multiplicand being a sum of a product obtained by multiplying said slope data item of the selected data set by said parameter, and a partial sum of said sequence of said data elements of the selected data set.

9. A digital control system according to claim 6 wherein said third data item is a linear slope data item representing a slope of an approximate straight line, and wherein said calculating means includes a means for determining said output variable which is a sum of said reference data item of the selected data set and a product obtained by multiplying a multiplicand by said sign data item of the selected data set, said multiplicand being a product resulting from multiplication of said linear slope data of the selected data item and said parameter.

10. A digital control system according to claim 6 wherein the bit length q of said first signal portion is greater than the bit length r of said second signal portion, a bit length of said first data item of each data set is equal to a bit length of said digital output information signal, and wherein said digital temperature compensated crystal oscillator system is a component for radio communication.

11. A digital temperature compensated crystal oscillator circuit comprising:

a Colpitts oscillator circuit comprising an active device which is a MOS transistor, and a source resistor;

a temperature compensating circuit for adjusting a feedback capacitance to a source of said MOS transistor;

a first series circuit which is connected in parallel to a source resistance of said MOS transistor and which comprises a second resistor and a first semiconductor switch; and a current control circuit for turning on said first semiconductor switch when power is supplied, and for turning off said first semiconductor switch at the end of a predetermined delay time.

12. A digital temperature compensated crystal oscillator circuit according to claim 11 wherein said current control circuit includes a circuit for producing a turn on signal to turn on said first semiconductor switch when a supply voltage is applied, and producing a turn-off signal to turn off said first semiconductor switch at the end of said predetermined delay time from the instant when said turn on signal is produced.

13. A digital temperature compensated crystal oscillator circuit according to claim 11 wherein said oscillator circuit further comprises a second series circuit which comprises a third resistor and a second semiconductor switch and which is connected in parallel to said source resistor of said MOS transistor, and a source resistance control circuit for turning said second semiconductor switch on and off.

14. A digital temperature compensated crystal oscillator circuit according to claim 13 wherein said source resistance control circuit comprises a terminal for receiving an external signal, and a drive circuit for controlling said second semiconductor switch in accordance with said external signal.

15. A digital temperature compensated crystal oscillator circuit according to claim 11 wherein said source resistor comprise a first end connected with the source of said MOS transistor and a grounded second end, each of said first and second series circuits comprising a first end connected with said source of said MOS transistor and a grounded second end; wherein said Colpitts oscillator circuit comprises a crystal unit comprising a first end and a second end connected with the gate of said MOS transistor, a fourth resistor connected between the drain and gate of said MOS, a first capacitor connected between the gate of said MOS transistor and a first branch point, a second capacitor connected between said first branch point and the source of said MOS transistor, a fifth resistor connected between said first branch point and a ground; and wherein said temperature compensating circuit comprises a first varicap having an anode connected with said first branch point of said Colpitts oscillator circuit, a second varicap comprising an anode connected with said first end of said crystal unit, and a cathode connected with a cathode of said first varicap, a sixth resistor connected between said anode of said second varicap and the ground and a seventh resistor connected between said cathode of said first varicap and a control voltage receiving terminal.

16. A digital temperature compensated crystal oscillator circuit according to claim 15 wherein said Colpitts oscillator circuit further comprises a buffer amplifier connected between said source of said MOS transistor and an output terminal for providing an output frequency; and wherein said fourth resistor is a diffused resistor, each of said source resistor, and said second, third, fifth and sixth resistors is a polysilicon resistor in a one chip LSI.

17. A digital temperature compensated crystal oscillator circuit according to claim 12 wherein said current control circuit comprises a circuit for comparing the supply voltage with a predetermined threshold voltage, and for turning on said first semiconductor switch when the supply voltage becomes equal to the threshold voltage.

18. A digital temperature compensated crystal oscillator system comprising:

a crystal oscillating section which comprises a crystal unit and which provides an output voltage of a constant output frequency;

a digital temperature compensation data generating section for storing a collection of temperature compensation data items, sensing an ambient temperature of said crystal unit, producing an analog temperature signal representing a sensed ambient temperature, converting said analog temperature signal into a digital temperature signal, and producing a digital compensation data signal representing one of said data items identified by said digital temperature signal as an address;

a digital-to-analog converting section for converting said digital compensation data signal to an analog compensation data voltage signal; and a voltage-to-capacitance converting section for varying a capacitance in accordance with said analog compensation data voltage signal to hold said output frequency of said crystal oscillating section constant independent of changes in the ambient temperature;

wherein said temperature compensation data generating section comprises a compensation data register for retaining one of said temperature compensation data items, an up/down counter, an adder for receiving input signals from said register and said up/down counter and for producing an output sum signal representing a sum of the input signals, and a signal sending section for controlling said register; and wherein said crystal oscillator system further comprises an auxiliary frequency controlling means for sending a first signal to said signal sending section, and a second signal to said up/down counter.

19. A system according to claim 18 wherein said temperature compensation data generating section further comprises a temperature sensor section for sensing the ambient temperature of said crystal unit and producing said analog temperature signal, and an analog-to-digital converting section for converting said analog temperature signal to said digital temperature signal, and a memory section comprising said data register and a storage device for storing said collection of temperature compensation data items and for providing a selected data item in accordance with said digital temperature signal, said selected data item being set to said compensation data register; wherein said adder sends said output signal to said digital-to-analog converting section; and wherein said auxiliary frequency controlling means comprises a first terminal for receiving a first external signal and a second terminal for receiving a second external signal, said first terminal being connected with said signal sending section, said second terminal being connected with said up/down counter.

20. A system according to claim 19 wherein said signal sending section sends an inhibit signal to inhibit a data setting operation of said data register when said first terminal of said auxiliary frequency controlling means receives said first external signal which is an AFC enable signal; wherein said auxiliary frequency controlling means further comprises a third terminal for receiving a third external signal which is a down pulse signal while said second external signal is an up pulse signal; wherein said up/down counter counts pulses of said up pulse signal and said down pulse signal; and wherein said system further comprises a frequency regulating section for performing a fine adjustment of the frequency at a standard temperature, said frequency regulating section being connected with said voltage-to-capacitance converting section.

21. A system according to claim 20 wherein said temperature compensation data generating section further comprises a resetting section for resetting said up/down counter when a predetermined condition appears in said second and third external signals.

22. A system according to claim 21 wherein said resetting section is connected with said second and third terminals, and resets said up/down counter when said resetting section receives pulses of said up pulse signal and down pulse signal simultaneously during a predetermined time interval.

23. A system according to claim 20 wherein an LSB sensitivity of said up/down counter is set equal to a LSB sensitivity of said compensation data register multiplied by $2^M$ where M is a positive natural number and equal to or greater than one.

24. A system according to claim 20 wherein said auxiliary frequency controlling means further comprises a switching means for opening and closing a circuit connecting each of said second and third terminals with said temperature compensation data generating section in accordance with said first external signal inputted to said first terminal.

25. A system according to claim 20 wherein said up/down counter sends a count signal to said adder when said counter receives no pulses for a predetermined time interval.

26. A digital temperature compensated crystal oscillator system comprising:

a crystal oscillating section which comprises a crystal unit and which provides an output voltage of a constant output frequency;

a digital temperature compensation data generating section for storing a collection of temperature compensation data items, sensing an ambient temperature of said crystal unit, producing an analog temperature signal representing a sensed ambient temperature, converting said analog temperature signal into a digital temperature signal, and producing a digital temperature compensation data signal representing one of said data items identified by said digital temperature signal as an address;

a digital-to-analog converting section for converting said digital temperature compensation data signal to an analog compensation data voltage signal; and a voltage-to-capacitance converting section for varying a capacitance in accordance with said analog compensation data voltage signal to hold said output frequency of said crystal oscillating section constant independent of changes in the ambient temperature;

wherein said digital temperature compensation data generating section comprises a temperature compensation data register, and said digital-to-analog converting section comprises an integrator, a sample-hold circuit, an offset data register, and a control section for controlling said temperature compensation data register, said offset data register, said integrator, and said sample-hold circuit; and wherein said crystal oscillator system further comprises an auxiliary frequency controlling means for sending a first external signal to said control section, and a second external signal to said offset data register.

27. A system according to claim 26:

wherein said temperature compensation data generating section further comprises a temperature sensor section for sensing the ambient temperature of said crystal unit and producing said analog temperature signal, and an analog-to-digital converting section for converting said analog temperature signal to said digital temperature signal, and a memory section comprising said temperature Compensation data register and a storage device for storing said collection of temperature compensation data items and for providing a selected data item in accordance with said digital temperature signal, said selected data item being set periodically to said temperature compensation data register;

wherein said auxiliary frequency controlling means comprises a first terminal for receiving said first external signal which is an AFC enable signal, a second terminal for receiving said second external signal and a third terminal for receiving a third external signal, said control section generating an AFC ready signal in response to said AFC enable signal; and wherein said temperature compensation data generating section further comprises a signal sending section for sending an inhibit signal to inhibit a data setting operation of said temperature compensation data register in response to said AFC enable signal; and wherein said system further comprises a frequency regulating section for performing a fine adjustment of the frequency at a standard temperature, said frequency regulating section being connected with said voltage-to-capacitance converting section.

28. A system according to claim 27:

wherein said offset data register is a device for storing a magnitude of an offset quantity, which is increased and decreased in accordance with said second and third external signals supplied from said second and third terminals of said auxiliary frequency controlling mean; and wherein said control section includes a means for producing a condition signal which is in a first signal state while said digital-to-analog converting section is performing a digital-to-analog conversion, and which is in a second signal state when the digital-to-analog conversion is not being performed; for producing said AFC ready signal in response to said AFC enable signal; for comparing a compensation data quantity stored in said temperature compensation data register with an offset data quantity stored in said offset data register; for terminating the digital-to-analog conversion when the compensation data quantity becomes equal to the offset data quantity, said AFC ready signal being produced immediately upon receipt of said AFC enable signal if said condition signal is in said second signal state, said AFC ready signal being produced at the end of the digital-to-analog conversion if the condition signal is in the first signal state, the offset quantity of said offset data register being varied between a positive side greater than zero and a negative side smaller than zero in accordance with said second and third external signals.

29. A system according to claim 28 wherein an LSB sensitivity of said offset data register is set equal to an LSB sensitivity of said compensation data register multiplied by $2^M$ where M is a positive natural number and equal to or greater than one.

30. A system according to claim 28 wherein said control section includes a means for periodically monitoring an interrupt of said AFC enable signal.

31. A system according to claim 28 wherein said integrator comprises a voltage decreasing means for decreasing a voltage, and a voltage increasing means for increasing the voltage, and said voltage decreasing means and said voltage increasing means are controlled by the signals of said auxiliary frequency controlling means through a semiconductor switch.

32. A system according to claim 28:

wherein said integrator comprises first, second and third input terminals and an output terminal, a first operational amplifier having an inverting input terminal, an output terminal and a noninverting input terminal connected with said third input terminal of said integrator, a first semiconductor switch connected between a first branch point and a second branch point, a second semiconductor switch connected between the second branch point and said inverting input terminal of said first operational amplifier, a first capacitor connected between said second branch point and a ground, a second capacitor connected between the output terminal and the inverting terminals of said first operational amplifier, a third semiconductor switch connected in parallel to said second capacitor, a fourth semiconductor switch connected between the output terminal of said first operational amplifier and the output terminal of said integrator, a fifth semiconductor switch connected between said first input terminal of said integrator and said first branch point, and a sixth semiconductor switch connected between said first branch point and said second input terminal of said integrator;

wherein said sample-hold circuit comprises an input terminal connected with said output terminal of said integrator and an output terminal connected to said voltage-to-capacitance converting section; and wherein said first, second, third, fourth, fifth and sixth semiconductor switches are connected with said control section and are controlled by said control section.

33. A system according to claim 28 wherein said auxiliary frequency controlling means further comprises a fourth terminal for outputting said AFC ready signal produced by said control section.

34. A digital temperature compensated crystal oscillator system comprising:

an oscillating section which is connected with a crystal unit and which provides an output voltage of a constant output frequency;

a digital temperature compensation data generating section for sensing an ambient temperature of said crystal unit, and producing a digital compensation data signal in accordance with sensed ambient temperature;

a digital-to-analog converting section for converting said digital compensation data signal to an analog temperature compensation data voltage signal; and a capacitance varying section for varying a capacitance in accordance with said analog temperature compensation data voltage signal to hold said output frequency of said crystal oscillating section constant independent of changes in the ambient temperature;

wherein said temperature compensated crystal oscillator system further comprises an addition section for receiving said analog temperature compensation data voltage signal from said digital-to-analog converting section, and an additional voltage signal, and producing a sum voltage signal by adding said analog temperature compensation data voltage signal and said additional voltage signal, and supplying said sum voltage signal to said capacitance varying section as a control voltage for varying the capacitance.

35. A digital temperature compensated crystal oscillator system according to claim 34 wherein said additional voltage signal represents a frequency deviation of the output frequency of the oscillating section from a predetermined normal frequency.

36. A digital temperature compensated crystal oscillator system according to claim 35 wherein said oscillator system further comprises a comparing means for comparing the output frequency of the oscillating section with a normal frequency and producing said additional voltage signal.

37. A digital temperature compensated crystal oscillator system according to claim 34 wherein said oscillating section, said digital temperature compensation data generating section, said digital-to-analog converting section, said capacitance varying section and said adding section are all integrated in an integrated circuit.

38. A digital temperature compensated crystal oscillator system according to claim 37 wherein said adding section comprises a sensitivity adjusting resistor formed in the integrated circuit.

39. A digital temperature compensated crystal oscillator system according to claim 37 wherein said adding section is connected with a sensitivity adjusting resistor external to the integrated circuit.

40. A digital temperature compensated crystal oscillator system according to claim 35 wherein said adding section comprises an operational amplifier, and an operational resistor through which a DC voltage is applied to a summing point for addition of the analog temperature compensation data voltage signal and the additional voltage signal.

41. A digital temperature compensated crystal oscillator system according to claim 40 wherein said adding section further comprises a switching means for automatically connecting a source of said DC voltage with said summing point through said operational resistor when said additional voltage signal is equal to or higher than a predetermined voltage.

42. A digital temperature compensated crystal oscillator system according to claim 35 wherein said capacitance varying section is connected with said compensation data generating section so that said capacitance varying section receives a selection signal from said data generating section, and said capacitance varying section comprises a capacitance adjusting means for adjusting a capacitance of said capacitance varying section in accordance with said selection signal.

43. A digital temperature compensated crystal oscillator according to claim 42 wherein said capacitance varying section comprises a first capacitor which is connected with said crystal unit and whose capacitance is controlled by said sum voltage signal produced by said adding section, and said capacitance adjusting means comprises a plurality of subsections each of which comprises an adjusting capacitor whose capacitance is controlled by said sum voltage signal, and a switching element for connecting and disconnecting said adjusting capacitor with said crystal unit, said switching element of each subsection is controlled by said selection signal supplied from said compensation data generating section.

44. A digital temperature compensated crystal oscillator system according to claim 43 wherein said compensation data generating section comprises a storage device for storing an on/off control data item for controlling said switch elements of said capacitance varying section, and said oscillator system comprises a regulating means for causing said data generating section to produce said selection signal in accordance with said on/off control signal and to send said selection to said capacitance varying section.

45. A digital temperature compensated crystal oscillator system according to claim 44 wherein said regulating means comprises a comparing means for comparing said additional voltage signal with a predetermined voltage.

* * * * *